United States Patent
Chistyakov et al.

(10) Patent No.: US 9,771,648 B2
(45) Date of Patent: *Sep. 26, 2017

(54) METHOD OF IONIZED PHYSICAL VAPOR DESPOSITION SPUTTER COATING HIGH ASPECT-RATIO STRUCTURES

(75) Inventors: Roman Chistyakov, Andover, MA (US); Bassam Hanna Abraham, Millis, MA (US)

(73) Assignee: ZOND, INC., Mansfield, MA (US)

( * ) Notice: Subject to any disclaimer, the term of this patent is extended or adjusted under 35 U.S.C. 154(b) by 599 days.

This patent is subject to a terminal disclaimer.

(21) Appl. No.: 11/735,452

(22) Filed: Apr. 14, 2007

(65) Prior Publication Data

US 2007/0181417 A1    Aug. 9, 2007

Related U.S. Application Data

(63) Continuation-in-part of application No. 10/710,946, filed on Aug. 13, 2004, now abandoned.
(Continued)

(51) Int. Cl.
    *C23C 14/54*   (2006.01)
    *C23C 14/30*   (2006.01)
    (Continued)

(52) U.S. Cl.
    CPC ........ *C23C 14/354* (2013.01); *C23C 14/3414* (2013.01); *C23C 14/3485* (2013.01);
    (Continued)

(58) Field of Classification Search
    CPC .............. C23C 14/354; C23C 14/3414; C23C 14/3485; C23C 14/352; H01J 37/3408;
    (Continued)

(56) References Cited

U.S. PATENT DOCUMENTS

| | | |
|---|---|---|
| 3,461,054 A | 8/1969 | Vratny |
| 3,514,714 A | 5/1970 | Angelbeck |

(Continued)

FOREIGN PATENT DOCUMENTS

| | | |
|---|---|---|
| DE | 4438463 | 2/1996 |
| DE | 10124749 A1 | 5/2001 |

(Continued)

OTHER PUBLICATIONS

US 5,863,392, 01/1999, Drammond et al. (withdrawn)
(Continued)

*Primary Examiner* — Keith Hendricks
*Assistant Examiner* — Kourtney S Carlson
(74) *Attorney, Agent, or Firm* — Hoffmann & Baron, LLP

(57) ABSTRACT

A sputtering apparatus includes a chamber for containing a feed gas. An anode is positioned inside the chamber. A cathode assembly comprising target material is positioned adjacent to an anode inside the chamber. A magnet is positioned adjacent to cathode assembly. A platen that supports a substrate is positioned adjacent to the cathode assembly. An output of the power supply is electrically connected to the cathode assembly. The power supply generates a plurality of voltage pulse trains comprising at least a first and a second voltage pulse train. The first voltage pulse train generates a first discharge from the feed gas that causes sputtering of a first layer of target material having properties that are determined by at least one of a peak amplitude, a rise time, and a duration of pulses in the first voltage pulse train. The second voltage pulse train generates a second discharge from the feed gas that causes sputtering of a second layer of target material having properties that are determined by at least one of a peak amplitude, a rise time, and a duration of pulses in the second voltage pulse train.

13 Claims, 19 Drawing Sheets

Related U.S. Application Data

(60) Provisional application No. 60/744,905, filed on Apr. 14, 2006.

(51) Int. Cl.
  *C23C 14/35* (2006.01)
  *H01J 37/34* (2006.01)
  *C23C 14/34* (2006.01)

(52) U.S. Cl.
  CPC .......... *C23C 14/352* (2013.01); *H01J 37/347* (2013.01); *H01J 37/3408* (2013.01); *H01J 37/3423* (2013.01); *H01J 37/3444* (2013.01); *H01J 37/3467* (2013.01)

(58) Field of Classification Search
  CPC ............... H01J 37/3423; H01J 37/3444; H01J 37/3467; H01J 37/347
  USPC ............ 204/298.01–298.04, 298.06, 298.08, 204/298.14, 298.16, 192.1, 192.11, 204/192.12; 427/457; 118/732 R
  See application file for complete search history.

(56) References Cited

U.S. PATENT DOCUMENTS

| | | | |
|---|---|---|---|
| 3,666,982 A | 5/1972 | Wiegand, Jr. | |
| 3,761,836 A | 9/1973 | Pinsley et al. | |
| 4,046,659 A | 9/1977 | Cormia | |
| 4,453,069 A | 6/1984 | Inoue | |
| 4,588,490 A | 5/1986 | Cuomo et al. | |
| 4,731,172 A | 3/1988 | Adachi et al. | |
| 4,953,174 A | 8/1990 | Eldridge et al. | |
| 4,965,248 A | 10/1990 | Poppe et al. | |
| 5,015,493 A | 5/1991 | Gruen | |
| 5,045,166 A | 9/1991 | Bobbio | |
| 5,241,152 A | 8/1993 | Anderson et al. | |
| 5,247,531 A | 9/1993 | Muller-Horsche | |
| 5,286,360 A | 2/1994 | Szcyrbowski et al. | |
| 5,292,417 A | 3/1994 | Kugler | |
| 5,303,139 A | 4/1994 | Mark | |
| 5,306,407 A | 4/1994 | Hauzer et al. | |
| 5,310,607 A | 5/1994 | Schulz et al. | |
| 5,330,800 A | 7/1994 | Schumacher et al. | |
| 5,423,970 A | 6/1995 | Kugler | |
| 5,427,669 A | 6/1995 | Drummond | |
| 5,429,070 A | 7/1995 | Campbell et al. | |
| 5,433,258 A | 7/1995 | Barnes et al. | |
| 5,576,939 A | 11/1996 | Drummond | |
| 5,645,698 A | 7/1997 | Okano | |
| 5,651,865 A | 7/1997 | Sellers | |
| 5,693,197 A | 12/1997 | Lal et al. | |
| 5,693,428 A | 12/1997 | Takanori et al. | |
| 5,718,813 A | 2/1998 | Drummond et al. | |
| 5,728,278 A | 3/1998 | Okamura et al. | |
| 5,753,886 A | 5/1998 | Iwamura et al. | |
| 5,777,438 A | 7/1998 | Suzuki | |
| 5,777,863 A | 7/1998 | Kowalevskii et al. | |
| 5,795,452 A | 8/1998 | Kinoshita et al. | |
| 5,810,982 A | 9/1998 | Sellers | |
| 5,846,608 A | 12/1998 | Neumann et al. | |
| 5,846,883 A | 12/1998 | Moslehi | |
| 5,875,207 A | 2/1999 | Osmanow | |
| 5,916,455 A | 6/1999 | Kumagai | |
| 5,917,286 A | 6/1999 | Scholl et al. | |
| 5,932,116 A | 8/1999 | Matsumoto et al. | |
| 5,958,155 A | 9/1999 | Kawamata et al. | |
| 5,968,327 A | 10/1999 | Kobayashi et al. | |
| 5,973,447 A | 10/1999 | Mahoney et al. | |
| 5,976,327 A | 11/1999 | Tanaka | |
| 5,990,668 A | 11/1999 | Coleman | |
| 5,993,613 A | 11/1999 | Manley | |
| 6,001,224 A | 12/1999 | Drummond et al. | |
| 6,007,879 A | 12/1999 | Scholl | |
| 6,019,876 A | 2/2000 | Goedicke et al. | |
| 6,024,844 A | 2/2000 | Drummond et al. | |
| 6,051,114 A | 4/2000 | Yao et al. | |
| 6,063,245 A | 5/2000 | Frach et al. | |
| 6,083,361 A | 7/2000 | Kobayashi et al. | |
| 6,093,293 A | 7/2000 | Haag et al. | |
| 6,110,328 A | 8/2000 | Shimizu et al. | |
| 6,117,279 A | 9/2000 | Smolanoff et al. | |
| 6,139,697 A * | 10/2000 | Chen et al. | 204/192.15 |
| 6,183,614 B1 | 2/2001 | Fu | |
| 6,190,512 B1 | 2/2001 | Lantsman | |
| 6,197,165 B1 | 3/2001 | Drewery et al. | |
| 6,217,717 B1 | 4/2001 | Drummond et al. | |
| 6,241,857 B1 * | 6/2001 | Yamada | 204/192.12 |
| 6,277,249 B1 | 8/2001 | Gopalraja et al. | |
| 6,284,106 B1 | 9/2001 | Haag et al. | |
| 6,290,821 B1 | 9/2001 | McLeod | |
| 6,296,742 B1 * | 10/2001 | Kouznetsov | 204/192.12 |
| 6,296,747 B1 | 10/2001 | Tanaka | |
| 6,306,265 B1 | 10/2001 | Fu et al. | |
| 6,319,355 B1 | 11/2001 | Holland | |
| 6,327,163 B1 | 12/2001 | Rodney | |
| 6,340,416 B1 | 1/2002 | Goedicke et al. | |
| 6,344,419 B1 | 2/2002 | Forster et al. | |
| 6,346,176 B1 | 2/2002 | Hughes | |
| 6,348,238 B1 | 2/2002 | Mizuno et al. | |
| 6,350,353 B2 | 2/2002 | Gopalraja et al. | |
| 6,361,667 B1 * | 3/2002 | Kobayashi et al. | 204/298.11 |
| 6,368,477 B1 | 4/2002 | Scholl | |
| 6,398,929 B1 | 6/2002 | Chiang et al. | |
| 6,413,382 B1 | 7/2002 | Wang et al. | |
| 6,432,260 B1 | 8/2002 | Mahoney et al. | |
| 6,436,248 B1 | 8/2002 | Baur et al. | |
| 6,436,251 B2 | 8/2002 | Gopairaja et al. | |
| 6,440,282 B1 | 8/2002 | Wada et al. | |
| 6,447,655 B2 | 9/2002 | Lantsman | |
| 6,454,920 B1 * | 9/2002 | Haag et al. | 204/298.12 |
| 6,455,326 B1 | 9/2002 | Eastep | |
| 6,488,822 B1 | 12/2002 | Moslehi | |
| 6,497,802 B2 | 12/2002 | Fu | |
| 6,511,584 B1 | 1/2003 | Szczyrbowski et al. | |
| 6,521,099 B1 | 2/2003 | Drummond et al. | |
| 6,554,979 B2 | 4/2003 | Stimson | |
| 6,605,312 B2 | 8/2003 | Winkler et al. | |
| 6,621,674 B1 | 9/2003 | Zahringer et al. | |
| 6,642,146 B1 | 11/2003 | Rozbicki et al. | |
| 6,661,178 B1 | 12/2003 | Bertrand et al. | |
| 6,663,754 B2 | 12/2003 | Gung | |
| 6,673,724 B2 | 1/2004 | Forster et al. | |
| 6,679,981 B1 | 1/2004 | Pan et al. | |
| 6,709,744 B1 | 3/2004 | Marinero et al. | |
| 6,730,196 B2 | 5/2004 | Wang et al. | |
| 6,735,099 B2 | 5/2004 | Mark | |
| 6,740,585 B2 | 5/2004 | Yoon et al. | |
| 6,746,591 B2 | 6/2004 | Zheng et al. | |
| 6,750,156 B2 | 6/2004 | Le et al. | |
| 6,767,627 B2 | 7/2004 | Morikawa et al. | |
| 6,790,323 B2 | 9/2004 | Fu et al. | |
| 6,805,779 B2 | 10/2004 | Chistyakov | |
| 6,806,651 B1 | 10/2004 | Chistyakov | |
| 6,806,652 B1 | 10/2004 | Chistyakov | |
| 6,852,202 B2 | 2/2005 | Miller et al. | |
| 6,853,142 B2 | 2/2005 | Chistyakov | |
| 6,896,773 B2 | 5/2005 | Chistyakov | |
| 6,896,775 B2 | 5/2005 | Chistyakov | |
| 6,899,796 B2 | 5/2005 | Wang et al. | |
| 6,903,511 B2 | 6/2005 | Chistyakov | |
| 6,946,408 B2 | 9/2005 | Le | |
| 7,081,186 B2 | 7/2006 | Ehiasarian et al. | |
| 7,095,179 B2 | 8/2006 | Chistyakov | |
| 7,147,759 B2 | 12/2006 | Chisyakov | |
| 7,208,878 B2 | 4/2007 | Shin et al. | |
| 7,247,221 B2 | 7/2007 | Stowell | |
| 7,345,429 B2 | 3/2008 | Chistyakov | |
| 7,446,479 B2 | 11/2008 | Chistyakov | |
| 7,504,006 B2 | 3/2009 | Gopalraja et al. | |
| 7,547,644 B2 | 6/2009 | Chen et al. | |
| 7,604,716 B2 | 10/2009 | Chistyakov | |
| 7,663,319 B2 | 2/2010 | Chistyakov | |
| 7,686,926 B2 | 3/2010 | Gung et al. | |

(56) References Cited

U.S. PATENT DOCUMENTS

| | | | |
|---|---|---|---|
| 7,750,575 | B2 | 7/2010 | Chistyakov |
| 7,808,184 | B2 | 10/2010 | Chistyakov |
| 7,811,421 | B2 | 10/2010 | Chistyakov |
| 7,898,183 | B2 | 3/2011 | Chistyakov |
| 7,943,017 | B2 | 5/2011 | Ramm et al. |
| 8,125,155 | B2 | 2/2012 | Chistyakov |
| 2001/0047760 | A1 | 12/2001 | Moslehi |
| 2001/0050220 | A1 | 12/2001 | Chiang et al. |
| 2002/0033480 | A1 | 3/2002 | Kawamata et al. |
| 2002/0041028 | A1 | 4/2002 | Choi et al. |
| 2002/0047539 | A1 | 4/2002 | Goedicke et al. |
| 2002/0063053 | A1 | 5/2002 | Winkler et al. |
| 2002/0068464 | A1 | 6/2002 | Forster et al. |
| 2002/0153103 | A1 | 10/2002 | Madocks |
| 2003/0034244 | A1 | 2/2003 | Yasar et al. |
| 2003/0052001 | A1 | 3/2003 | Park et al. |
| 2003/0173207 | A1 | 9/2003 | Zhang et al. |
| 2003/0209422 | A1* | 11/2003 | Wang et al. ............. 204/192.12 |
| 2003/0209423 | A1 | 11/2003 | Christie |
| 2004/0085023 | A1 | 5/2004 | Chistyakov |
| 2004/0094411 | A1* | 5/2004 | Chistyakov ............. 204/298.07 |
| 2004/0112735 | A1 | 6/2004 | Saigal et al. |
| 2004/0134769 | A1 | 7/2004 | Wang et al. |
| 2004/1124077 | | 7/2004 | Christie |
| 2005/0006222 | A1 | 1/2005 | Ding et al. |
| 2005/0034666 | A1 | 2/2005 | Chistyakov |
| 2005/0092596 | A1 | 5/2005 | Kouznetsov |
| 2005/0103620 | A1 | 5/2005 | Chistyakov |
| 2005/0167263 | A1 | 8/2005 | Chistyakov |
| 2005/0178654 | A1 | 8/2005 | Chistyakov |
| 2005/0184669 | A1* | 8/2005 | Chistyakov ............. 315/111.21 |
| 2005/0211543 | A1 | 9/2005 | Chistyakov |
| 2005/0211548 | A1 | 9/2005 | Gung et al. |
| 2005/0233551 | A1 | 10/2005 | Bergstrom |
| 2005/0247554 | A1 | 11/2005 | Saigal et al. |
| 2005/0255691 | A1 | 11/2005 | Ding et al. |
| 2005/0266682 | A1 | 12/2005 | Chen et al. |
| 2006/0014378 | A1 | 1/2006 | Aggarwal et al. |
| 2006/0066248 | A1 | 3/2006 | Chistyakov |
| 2006/0076232 | A1 | 4/2006 | Miller et al. |
| 2006/0105577 | A1 | 5/2006 | Donohoe et al. |
| 2006/0239800 | A1 | 10/2006 | Hamamjy et al. |
| 2006/0263640 | A1 | 11/2006 | Tamagaki |
| 2006/0278518 | A1 | 12/2006 | Kouznetsov |
| 2006/0278521 | A1 | 12/2006 | Stowell |
| 2006/0278524 | A1 | 12/2006 | Stowell |
| 2007/0077682 | A1 | 4/2007 | Cerio, Jr. |
| 2007/0119701 | A1 | 5/2007 | Chistyakov |
| 2008/0023318 | A1 | 1/2008 | Kuroiwa |
| 2008/0099329 | A1 | 5/2008 | Pavloff et al. |
| 2008/0110747 | A1 | 5/2008 | Ding et al. |
| 2008/0142359 | A1 | 6/2008 | Gopalraja et al. |
| 2008/0210545 | A1 | 9/2008 | Kouznetsov |
| 2008/0296736 | A1 | 12/2008 | Fu et al. |
| 2009/0053888 | A1 | 2/2009 | Ding et al. |
| 2009/0057133 | A1 | 3/2009 | Kouznetsov |
| 2009/0233438 | A1 | 9/2009 | Ding et al. |
| 2009/0321249 | A1 | 12/2009 | Chistyakov |
| 2010/0012480 | A1 | 1/2010 | Forster et al. |
| 2010/0104771 | A1 | 4/2010 | Jozef et al. |
| 2010/0252417 | A1 | 10/2010 | Allen et al. |
| 2010/0270144 | A1 | 10/2010 | Chistyakov |
| 2010/0326815 | A1 | 12/2010 | Chistyakov |
| 2011/0133651 | A1 | 6/2011 | Chistyakov |
| 2012/0028461 | A1 | 2/2012 | Ritchie et al. |
| 2012/0149192 | A1 | 6/2012 | Brown et al. |

FOREIGN PATENT DOCUMENTS

| | | | |
|---|---|---|---|
| EP | 0146509 | A2 | 6/1985 |
| EP | 0242028 | A2 | 2/1987 |
| EP | 0480688 | A2 | 4/1992 |
| EP | 0534068 | A2 | 6/1992 |
| EP | 0534068 | A3 | 6/1992 |
| EP | 0596496 | A1 | 5/1994 |
| EP | 0534068 | B1 | 3/1996 |
| EP | 0729173 | | 8/1996 |
| EP | 0731190 | A1 | 9/1996 |
| EP | 0513662 | A1 | 11/1997 |
| EP | 0744473 | B1 | 3/1998 |
| EP | 0831679 | A1 | 3/1998 |
| EP | 0650183 | B1 | 4/1998 |
| EP | 1046726 | A2 | 10/2000 |
| EP | 1046727 | A2 | 10/2000 |
| EP | 1113088 | A1 | 7/2001 |
| EP | 1146139 | A1 | 10/2001 |
| EP | 1293586 | A2 | 3/2003 |
| EP | 01260603 | B1 | 9/2006 |
| EP | 0831679 | B1 | 10/2008 |
| EP | 1046726 | B1 | 7/2009 |
| EP | 0999291 | A1 | 5/2010 |
| JP | 01-042574 | | 2/1989 |
| JP | 2004 010979 | A | 1/2004 |
| JP | 2005-082873 | A | 3/2005 |
| KR | 10-2005-0059782 | A | 6/2005 |
| RU | 2058429 | C1 | 4/1996 |
| SE | WO 02103078 | A1 * | 12/2002 ......... H01J 37/3408 |
| WO | 83/01349 | A1 | 4/1983 |
| WO | 95/28508 | | 10/1995 |
| WO | 98/33201 | | 7/1998 |
| WO | 9840532 | A | 9/1998 |
| WO | 99/07913 | | 2/1999 |
| WO | 99/27151 | | 6/1999 |
| WO | 99/28520 | | 6/1999 |
| WO | 02/103078 | | 12/2002 |
| WO | 02103078 | A | 12/2002 |
| WO | 02103078 | A1 | 12/2002 |
| WO | 2004042774 | A1 | 5/2004 |
| WO | 2006/099754 | | 9/2006 |
| WO | 2007032858 | A | 3/2007 |
| WO | 2008130507 | A2 | 10/2008 |
| WO | 2008130509 | A1 | 10/2008 |

OTHER PUBLICATIONS

Chistyakov, Roman, Plasma Source With Segmented Cathode, U.S. Appl. No. 60/481,671, filed Nov. 19, 2003.

"Notification of Transmittal of the International Search Report and the Written Opinion of the International Searching Authority, or the Declaration" for PCT/US2004/036636, Nov. 21, 2005, 10 pages, The International Searching Authority/EPO, Rijswijk, The Netherlands.

"Notification of Transmittal of the International Search Report and the Written Opinion of the International Searching Authority, or the Declaration" for PCT/US2008/004605, Nov. 20, 2008, 14 pages, The International Searching Authority/EPO, Rijswijk, The Netherlands.

"Office Action" for U.S. Appl. No. 10/065,277, Jan. 15, 2004, 12 pages, The USPTO, US.

"Office Action" for U.S. Appl. No. 10/065,277, Aug. 30, 2004, 14 pages, The USPTO, US.

"Office Action" for U.S. Appl. No. 10/065,277, May 27, 2005, 13 pages, The USPTO, US.

"Office Action" for U.S. Appl. No. 10/065,277, Jan. 11, 2006, 15 pages, The USTPO, US.

"Office Action" for U.S. Appl. No. 10/065,277, Jul. 18, 2006, 6 pages, The USPTO, US.

"Office Action" for U.S. Appl. No. 10/065,629, Oct. 7, 2003, 11 pages, The USPTO, US.

"Office Action" for U.S. Appl. No. 10/065,739, Feb. 18, 2004, 14 pages, The USPTO, US.

"Office Action" for U.S. Appl. No. 10/065,739, May 20, 2004, 14 pages, The USPTO, US.

"Office Action" for U.S. Appl. No. 10/249,202, Feb. 11, 2004, 6 pages, The USPTO, US.

"Office Action" for U.S. Appl. No. 10/249,595, Apr. 22, 2004, 5 pages, The USPTO, US.

"Office Action" for U.S. Appl. No. 10/249,774, Aug. 27, 2004, 6 pages, The USPTO, US.

(56) References Cited

OTHER PUBLICATIONS

"Office Action" for U.S. Appl. No. 10/249,844, Apr. 23, 2004, 5 pages, The USPTO, US.
"Office Action" for U.S. Appl. No. 10/553,893, Mar. 7, 2008, 6 pages, The USPTO, US.
"Office Action" for U.S. Appl. No. 10/708,281, May 18, 2005, 15 pages, The USPTO, US.
"Office Action" for U.S. Appl. No. 10/708,281, Dec. 20, 2005, 14 pages, The USPTO, US.
"Office Action" for U.S. Appl. No. 10/710,946, Nov. 16, 2007, 7 pages, The USPTO, US.
"Office Action" for U.S. Appl. No. 10/710,946, Feb. 21, 2008, 18 pages, The USPTO, US.
"Office Action" for U.S. Appl. No. 10/710,946, Apr. 10, 2009, 18 pages, The USPTO, US.
"Office Action" for U.S. Appl. No. 10/897,257, Mar. 27, 2008, 13 pages, The USPTO, US.
"Office Action" for U.S. Appl. No. 10/897,257, Jan. 14, 2009, 7 pages, The USPTO, US.
"Office Action" for U.S. Appl. No. 10/949,427, Apr. 21, 2006, 6 pages, The USPTO, US.
"Office Action" for U.S. Appl. No. 11/091,814, Jul. 14, 2008, 19 pages, The USPTO, US.
"Office Action" for U.S. Appl. No. 11/130,315, Jul. 3, 2008, 10 pages, The USPTO, US.
"Office Action" for U.S. Appl. No. 11/162,824, Apr. 28, 2008, 8 pages, The USPTO, US.
"Office Action" for U.S. Appl. No. 11/162,824, Jan. 23, 2009, 10 pages, The USPTO, US.
"Office Action" for U.S. Appl. No. 11/162,824, May 18, 2009, 9 pages, The USPTO, US.
"Office Action" for U.S. Appl. No. 11/183,463, Oct. 24, 2008, 7 pages, The USPTO, US.
"Office Action" for U.S. Appl. No. 11/376,036, Jul. 25, 2007, 7 pages, The USPTO, US.
"Office Action" for U.S. Appl. No. 11/608,833, Mar. 11, 2009, 8 pages, The USPTO, US.
"Office Action" for U.S. Appl. No. 12/245,193, Apr. 2, 2009, 4 pages, The USPTO, US.
"Notification Concerning Transmittal of International Preliminary Report on Patentability (Chapter I of The Patent Cooperation Treaty)" for PCT/US2008/004644, Nov. 5, 2009, 10 pgs., The International Bureau of WIPO, Geneva, Switzerland.
"Notification Concerning Transmittal of International Preliminary Report on Patentability (Chapter I of the Patent Coooperation Treaty)" for PCT/US2008/004605, Oct. 29, 2009, 9 pgs., The International Bureau of WIPO, Geneva, Switzerland.
Bugaev, et al., Investigation of a High-Current Pulsed Magnetron Discharge Initiated in the Low-Pressure Diffuse Arc Plasma, XVII International Symposium on Discharges and Electrical Insulation in Vacuum, 1996, pp. 1074-1076, IEEE, Berkeley.
"Office Action" for U.S. Appl. No. 11/608, 833, Jun. 14, 2010, 17 pages, The USPTO, US.
"Office Action" for U.S. Appl. No. 11/608,833, Feb. 11, 2011, 9 pages, The USPTO, US.
"Office Action" for U.S. Appl. No. 11/183,463, Apr. 21, 2010, 10 pages, The USPTO, US.
"Office Action" for U.S. Appl. No. 12/879,036, Sep. 30, 2011, 10 pages, The USPTO, US.
"Office Action" for U.S. Appl. No. 10/710,946, Dec. 23, 2009, 22 pages, The USPTO, US.
"Office Action" for U.S. Appl. No. 12/819,914, Sep. 7, 2011, 10 pages, The USPTO, US.
"Office Action" for U.S. Appl. No. 11/735,452, Sep. 15, 2011, 19 pages, The USPTO, US.
"Office Action" for U.S. Appl. No. 11/735,452, Feb. 16, 2011, 19 pages, The USPTO, US.
"Office Action" for U.S. Appl. No. 11/735,452, Jun. 10, 2010, 18 pages, The USPTO, US.
"Office Action" for U.S. Appl. No. 11/465,574, Dec. 8, 2009, 6 pages, The USPTO, US.
"Office Action" for U.S. Appl. No. 12/870,388, Apr. 19, 2011, 7 pages, The USPTO, US.
"Office Action" for U.S. Appl. No. 11/162,824, May 18, 2011, 10 pages, The USPTO, US.
"Office Action" for U.S. Appl. No. 11/162,824, Aug. 6, 2010, 7 pages, The USPTO, US.
"Office Action" for U.S. Appl. No. 11/162,824, Nov. 23, 2009, 10 pages, The USPTO, US.
"International Search Report and Written Opinion" for PCT/US2011/044781, Feb. 27, 2012, 3 pages, International Searching Authority/KR, Daejeon, Republic of Korea.
"International Search Report and Written Opinion" for PCT/US2011/050507, Apr. 10, 2012, 7 pages, International Searching Authority/KR, Daejeon, Republic of Korea.
"International Search Report and Written Opinion" for PCT/US2010/029815, Oct. 29, 2010, 9 pages, International Searching Authority/KR, Daejeon, Republic of Korea.
US 5,863,392, 06/1999, Drummond, et al. (withdrawn).
IPR2014-00818 Patent Owner Preliminary Response, Jul. 24, 2014, 62 pages.
IPR2014-00819 Patent Owner Preliminary Response, Jul. 24, 2014, 59 pages.
IPR2014-00821 Patent Owner Preliminary Response, Jul. 24, 2014, 64 pages.
IPR2014-00827 Patent Owner Preliminary Response, Jul. 24, 2014, 51 pages.
IPR2014-00828 Patent Owner Preliminary Response, Sep. 4, 2014, 55 pages .
IPR2014-00829 Patent Owner Preliminary Response, Sep. 5, 2014, 61 pages.
European Patent Office, "European Extended Search Report" for European Patent Application No. 12154112.2 dated Jul. 31, 2014, 10 pages.
PR2014-01479 Petition for Inter Partes Review of U.S. Pat. No. 6,896,773; Sep. 11, 2014, 67 pages.
IPR2014-01481 Petition for Inter Partes Review of U.S. Pat. No. 6,896,773; Sep. 11, 2014, 68 pages.
IPR2014-01482 Petition for Inter Partes Review of U.S. Pat. No. 6,896,775; Sep. 11, 2014, 65 pages.
IPR2014-01494 Petition for Inter Partes Review of U.S. Pat. No. 6,896,775; Sep. 11, 2014, 66 pages.
IPR2014-00443 Patent Owner Motion for Counsel to Withdraw, Apr. 16, 2014, 4 pages.
IPR2014-00443 Amended Patent Owner Mandatory Notice Information, Apr. 16, 2014, 6 pages.
IPR2014-00443 Decision, Patent Owner's Motion for Counsel to Withdraw, Apr. 24, 2014, 4 pages.
IPR2014-00443 Patent Owner's Preliminary Response, May 28, 2014, 64 pages.
IPR2014-00444 Patent Owner Motion for Counsel to Withdraw, Apr. 16, 2014, 4 pages.
IPR2014-00444 Amended Patent Owner Mandatory Notice Information, Apr. 16, 2014, 6 pages.
IPR2014-00444 Patent Owner's Preliminary Response, Jun. 3, 2014, 62 pages.
IPR2014-00445 Patent Owner Motion for Counsel to Withdraw, Apr. 16, 2014, 4 pages.
IPR2014-00445 Amended Patent Owner Mandatory Notice Information, Apr. 16, 2014, 6 pages.
IPR2014-00445 Patent Owner's Preliminary Response, Jun. 3, 2014, 64 pages.
IPR2014-00446 Patent Owner Motion for Counsel to Withdraw, Apr. 16, 2014, 4 pages.
IPR2014-00446 Amended Patent Owner Mandatory Notice Information, Apr. 16, 2014, 6 pages.
IPR2014-00446 Patent Owner's Preliminary Response, Jun. 3, 2014, 63 pages.
IPR2014-00447 Patent Owner Motion for Counsel to Withdraw, Apr. 16, 2014, 4 pages.
IPR2014-00447 Amended Patent Owner Mandatory Notice Information, Apr. 16, 2014, 6 pages.

(56) References Cited

OTHER PUBLICATIONS

IPR2014-00447 Patent Owner's Preliminary Response, Jun. 3, 2014, 63 pages.
IPR2014-00455 Patent Owner Motion for Counsel to Withdraw, Apr. 21, 2014, 4 pages.
IPR2014-00455 Amended Patent Owner Mandatory Notice Information, Apr. 21, 2014, 6 pages.
IPR2014-00455 Decision, Patent Owner's Motion for Counsel to Withdraw, Apr. 24, 2014, 4 pages.
IPR2014-00455 Patent Owner's Preliminary Response, Jun. 4, 2014, 57 pages.
United States Patent and Trademark Office, "Information Disclosure Statement" for U.S. Appl. No. 11/465,574, filed Sep. 29, 2006, 9 pages.
Webster'S New World College Dictionary, Dictionary Excerpt, 2008, 4 pages.
IPR2014-00456 Patent Owner Motion for Counsel to Withdraw, Apr. 21, 2014, 4 pages.
IPR2014-00456 Amended Patent Owner Mandatory Notice Information, Apr. 21, 2014, 6 pages.
IPR2014-00456 Patent Owner's Preliminary Response, Jun. 4, 2014, 57 pages.
IPR2014-00468 Patent Owner Motion for Counsel to Withdraw, Apr. 21, 2014, 4 pages.
IPR2014-00468 Amended Patent Owner Mandatory Notice Information, Apr. 21, 2014, 6 pages.
IPR2014-00468 Decision, Patent Owner's Motion for Counsel to Withdraw, Apr. 24, 2014, 4 pages.
IPR2014-00468 Patent Owner's Preliminary Response, Jun. 6, 2014, 38 pages.
IPR2014-00470 Patent Owner Motion for Counsel to Withdraw, Apr. 21, 2014, 4 pages.
IPR2014-00470 Amended Patent Owner Mandatory Notice Information, Apr. 21, 2014, 6 pages.
IPR2014-00470 Patent Owner's Preliminary Response, Jun. 16, 2014, 61 pages.
IPR2014-00473 Patent Owner Motion for Counsel to Withdraw, Apr. 21, 2014, 4 pages.
IPR2014-00473 Amended Patent Owner Mandatory Notice Information, Apr. 21, 2014, 6 pages.
IPR2014-00473 Patent Owner's Preliminary Response, Jun. 16, 2014, 54 pages.
IPR2014-00494 Patent Owner Preliminary Response, Jun. 24, 2014, 63 pages.
IPR2014-00495 Patent Owner Preliminary Response, Jun. 24, 2014, 64 pages.
IPR2014-00496 Patent Owner Preliminary Response, Jun. 24, 2014, 60 pages.
IPR2014-00497 Patent Owner Preliminary Response, Jun. 24, 2014, 51 pages.
IPR2014-00498 Patent Owner Preliminary Response, Jun. 24, 2014, 64 pages.
IPR2014-00520 Patent Owner Preliminary Response, Jul. 9, 2014, 37 pages.
IPR2014-00521 Patent Owner Preliminary Response, Jul. 9, 2014, 45 pages.
IPR2014-00522 Patent Owner Preliminary Response, Jul. 9, 2014, 58 pages.
IPR2014-00523 Patent Owner Preliminary Response, Jul. 9, 2014, 64 pages.
IPR2014-00598 Patent Owner Mandatory Notice Information, Apr. 25, 2014, 6 pages.
IPR2014-00686 Petition (Revised) for Inter Partes Review of U.S. Pat. No. 6,805,779; Apr. 24, 2014, 66 pages.
IPR2014-00686 United States Patent and Trademark Office, "Notice of Filing Date Accorded to Petition and Time for Filing Patent Owner Preliminary Response" Apr. 29, 2014, 4 pages.
IPR2014-00686 Response to Notice of Filing Date Accorded to Petition, Apr. 30, 2014, 3 pages.
IPR2014-00686 Petition (Revised) for Inter Partes Review of U.S. Patent. No. 6,805,779; Apr. 24, 2014, 66 pages.
IPR2014-00686 United States Patent and Trademark Office, "Notice of Accepting Corrected Petition" May 3, 2014, 6 pages.
IPR2014-00445 Kortshagen, Uwe Ph.D., Professional Declaration, Feb. 2, 2014, 74 pages.
United States Patent and Trademark Office, "Final Rejection" for U.S. Appl. No. 10/065,277 (U.S. Pat. No.7147759), dated May 27, 2005, 14 pages.
United States Patent and Trademark Office, "Final Rejection" for U.S. Appl. No. 10/065,277 (U.S. Pat. No.7,147,759), dated Jan. 11, 2006, 16 pages.
Exhibit A.05, Claim Chart based on Mozgrin, Kudryavtsev and Yamaguchi, 6 pages.
Exhibit A.12, Claim Chart based on Wang, Kudryavtsev and Yamaguchi, 6 pages.
IPR2014-00446 Petition for Inter Partes Review of U.S. Pat. No. 7,147,759; Feb. 20, 2014, 68 pages.
IPR2014-00446 United States Patent and Trademark Office, "Notice of Filing Date Accorded to Petition and Time for Filing Patent Owner Preliminary Response" Mar. 3, 2014, 3 pages.
IPR2014-00446 Revised Petition for Inter Partes Review of U.S. Pat. No. 7,147,759; Mar. 3, 2014, 68 pages.
IPR2014-00446 Patent Owner Mandatory Notice Information, Mar. 13, 2014, 5 pages.
IPR2014-00446 Kortshagen, Uwe Ph.D., Professional Declaration, Feb. 20, 2014, 74 pages.
United States Patent and Trademark Office, "Response" for U.S. Appl. No. 10/065,277 (U.S. Pat. No.7,147,759) dated Aug. 28, 2006, 5 pages.
IPR2014-00447 Revised Petition for Inter Partes Review of U.S. Pat. No. 7,147,759; Mar. 6, 2014, 68 pages.
IPR2014-00447 United States Patent and Trademark Office, "Notice of Filing Date Accorded to Petition and Time for Filing Patent Owner Preliminary Response" Mar. 3, 2014, 3 pages.
IPR2014-00447 Patent Owner Mandatory Notice Information, Mar. 13, 2014, 5 pages.
IPR2014-00447 Kortshagen, Uwe Ph.D., Professional Declaration, Feb. 2, 2014, 74 pages.
IPR2014-00580 Petition for Inter Partes Review of U.S. Pat. No. 6,896,773; Apr. 4, 2014, 67 pages.
IPR2014-00580 United States Patent and Trademark Office, "Notice of Filing Date Accorded to Petition and Time for Filing Patent Owner Preliminary Response" Apr. 15, 2014, 3 pages.
Fortov, V.E., "Encyclopedia of Low-Temperature Plasma" Certified Translation, Introductory vol. III, Jan. 31, 2014, 23 pages.
IPR2014-00580 Devito, Richard, Professional Declaration, Apr. 3, 2014, 108 pages.
Kudryavtsev, A.A. et al., "Ionization relaxation in a plasma produced by a pulsed inert-gas discharge" Sov. Phys. Tech. Phys., Jan. 1983, pp. 30-35.
Fortov, V.E., "Encyclopedia of Low-Temperature Plasma" Original Russian Text, 2000, 13 pages.
United States Patent and Trademark Office, "Amendment and Response" for U.S. Appl. No. 10/065,739 (U.S. Pat. No. 6,896,773) dated Oct. 19, 2004, 18 pages.
Thornton, John A. and Hoffman, D.W., "Stress-Related Effects in Thin Films" Thin Solids Films, vol. 171, Issue 1, Apr. 1989, pp. 5-31.
Savvides, N. and Window, B., "Unbalanced magnetron ion-assisted deposition and property modification of thin films" J. Vac. Sci. Technol. A Vo. 4, No. 3, May/Jun. 1986, pp. 504-508.
Grove, Thomas C., "Arcing Problems Encountered During Sputter Deposition of Aluminum" Advanced Energy Industries, Inc., 2000, pp. 1-8.
Sellers, J., "Asymmetric bipolar pulsed DC: the enabling technology for reactive PVD" Surface & Coatings Technology, 1998, pp. 1245-1250.
Rossnagel, S.M. and Hopwood, J., "Magnetron sputter deposition with high levels of metal ionization" Appl. Phys. Lett., vol. 63, No. 24, Dec. 13, 1993, pp. 3285-3287.

(56) References Cited

OTHER PUBLICATIONS

Lide, Dave R. Ph.D., "CRC Handbook of Chemistry and Physics" Dave R. Lide, Ph.D., A Ready-Reference Book of Chemical and Physical Data, 82nd Edition, 2001-2002, 3 pages.
IPR2014-00598 Petition for Inter Partes Review of U.S. Pat. No. 6,805,779; filed Apr. 9, 2014, 67 pages.
IPR2014-00598 United States Patent and Trademark Office, "Notice of Filing Date Accorded to Petition and Time for Filing Patent Owner Preliminary Response" Apr. 15, 2014, 4 pages.
IPR2014-00598 Kortshagen, Uwe Ph.D., Professional Declaration, Apr. 9, 2014, 124 pages.
United States Patent and Trademark Office, "Non Final Office Action" for U.S. Appl. No. 10/249,202 (U.S. Pat. No. 6,805,779) dated Feb. 11, 2004, 07 pages.
United States Patent and Trademark Office, "Amendment and Response" for U.S. Appl. No. 10/249,202 (U.S. Pat. No. 6,805,779) dated May 6, 2004, 16 pages.
European Patent Office, "Response" for European Patent Application 047169283.9, dated Jul. 25, 2007, 21 pages.
Vlcek, J., "A collisional-radiative model applicable to argon discharges over a wide rand of conditions. I: Formulation and basic data" J. Phys. D: Appl. Phys. 22 1989 pp. 623-631.
Vlcek, J., "A collisional-radiative model applicable to argon discharges over a wide rand of conditions. II: Application to low-pressure, hollow-cathode arc and low-pressure glow charges" J. Phys. D: Appl. Phys. 22 1989 pp. 632-643.
IPR2014-00494 Petition for Inter Partes Review of U.S. Pat. No. 6,853,142; filed Mar. 13, 2014, 66 pages.
IPR2014-00494 United States Patent and Trademark Office, "Notice of Filing Date Accorded to Petition and Time for Filing Patent Owner Preliminary Response" Mar. 24, 2014, 3 pages.
IPR2014-00494 Patent Owner Mandatory Notice Information, Apr. 3, 2014, 6 pages.
IPR2014-00494 Kortshagen, Uwe Ph.D., Professional Declaration, Feb. 27, 2014, 125 pages.
United States Patent and Trademark Office, "Non Final Office Action" for U.S. Appl. No. 10/065,629 (U.S. Pat. No.6,853,142) dated Oct. 7, 2003, 11 pages.
United States Patent and Trademark Office, "Amendment and Response" for U.S. Appl. No. 10/065,629 (U.S. Pat. No. 6,853,142) dated Mar. 8, 2004, 14 pages.
United States Patent and Trademark Office, "Notice of Allowability" for U.S. Appl. No. 10/065,629 (U.S. Pat. No. 6,853,142) dated Mar. 29, 2004, 4 pages.
United States Patent and Trademark Office, "Amendment and Response for RCE" for U.S. Appl. No. 10/065,277 (U.S. Pat. No. 7,147,759) May 2, 2006, 17 pages.
Ohring, Milton "The Materials Science of Thin Films" Academic Press, Inc., 1992, 69 pages.
Smith, Donald L. "Thin-Film Deposition Principles & Practice" McGraw-Hill, Inc. 1995, 31 pages.
European Patent Office, "Response" for European Patent Application 1560943, dated Apr. 21, 2008, 4 pages.
Exhibit D.03, Claim Chart Based on Mozgrin and Lantsman, 21 pages.
Exhibit D.07, Claim Chart Based on Wang and Lantsman, 14 pages.
European Patent Office, "Notice of Opposition" to European Patent No. EP1559128 B1 by Trump Heuttinger Sp., dated Jul. 7, 2014, 28 pages.
Kouznetsov et al., "A novel pulsed magnetron sputter technique utilizing very high target densities", Surface and Coatings Technology 122 (1999), pp. 290-293.
Macak et al., "Ionized sputter deposition using an extremely high plasma density pulsed magnetron discharge", J. Vac. Sci. Technol. A 18(4) Jul./Aug. 2000, pp. 1533-1537.
European Patent Office, "Notice of Opposition" to European Patent No. EP1559128 B1 by CemeCon AG, dated Jul. 7, 2014, 42 pages.
IPR2014-00995 Decision, Institution of Inter Partes Review, Nov. 7, 2014, 08 pages.
IPR2014-00996 Decision, Institution of Inter Partes Review, Nov. 7, 2014, 08 pages.
IPR2014-01016 Decision, Institution of Inter Partes Review, Nov. 10, 2014, 08 pages.
IPR2014-01482 Decision, Institution of Inter Partes Review, Nov. 7, 2014, 09 pages.
IPR2014-01494 Decision, Institution of Inter Partes Review, Nov. 7, 2014, 09 pages.
IPR2014-01017 Decision, Institution of Inter Partes Review, Nov. 18, 2014, 08 pages.
IPR2014-01019 Decision, Institution of Inter Partes Review, Nov. 18, 2014, 08 pages.
IPR2014-00828 Decision, Institution of Inter Partes Review, Nov. 17, 2014, 28 pages.
IPR2014-00829 Decision, Institution of Inter Partes Review, Nov. 17, 2014, 32 pages.
IPR2014-00917 Decision, Institution of Inter Partes Review, Nov. 22, 2014, 30 pages.
IPR2014-01479 Decision, Institution of Inter Partes Review, Nov. 12, 2014, 9 pages.
IPR2014-01481 Decision, Institution of Inter Partes Review, Nov. 12, 2014, 8 pages.
Fridman et al., "Non-thermal atmospheric pressure discharges" Institute of Physics Publishing, Journal of Physics D: Applied Physics, Jan. 6, 2005, pp. R1-R24.
Chistyakov, "High Deposition Rate Sputtering" United States Patent and Trademark Office, U.S. Appl. No. (U.S. Pat. No. 7,811,421) as filed Jul. 18, 2005, 56 pages.
Exhibit C.03, Claim Chart Based on Mozgrin and Kudryavtsev, 7 pages.
Exhibit C.04, Claim Chart Based on Mozgrin and Mozgrin Thesis, 4 pages.
Exhibit C.07, Claim Chart Based on Mozgrin, Lantsman and Kudryavtsev, 9 pages.
Exhibit C.06, Claim Chart Based on Mozgrin, Lantsman and Kawamata, 12 pages.
IPR2014-00473 Petition for Inter Partes Review of U.S. Pat. No. 7,811,421; Mar. 7, 2014, 67 pages.
IPR2014-00473 United States Patent and Trademark Office, "Notice of Filing Date Accorded to Petition and Time for Filing Patent Owner Preliminary Response" Mar. 14, 2014, 3 pages.
IPR2014-00473 Patent Owner Mandatory Notice Information, Mar. 28, 2014, 6 pages.
IPR2014-00473 Kortshagen, Uwe, Ph.D., Professional Declaration, Mar. 3, 2014, 126 pages.
Exhibit C.02, Claim Chart Based on Mozgrin and Kawamata, 7 pages.
IPR2014-00522 Kortshagen, Uwe Ph.D., Professional Declaration, Mar. 26, 2014, 122 pages.
Exhibit B.02, Claim Chart Based on Mozgrin and Kudryavtsev, 25 pages.
Exhibit B.08, Claim Chart Based on Wang and Kudryavtsev, 15 pages.
IPR2014-00523 Petition for Inter Partes Review of U.S. Pat. No. 7,604,716; filed Mar. 27, 2014, 64 pages.
IPR2014-00523 Patent Owner Mandatory Notice Information, Apr. 3, 2014, 6 pages.
IPR2014-00523 United States Patent and Trademark Office, "Notice of Filing Date Accorded to Petition and Time for Filing Patent Owner Preliminary Response" Apr. 9, 2014, 3 pages.
IPR2014-00523 Kortshagen, Uwe Ph.D., Professional Declaration, Mar. 26, 2014, 118 pages.
Exhibit B.03, Claim Chart Based on Mozgrin, Kudryavtsev and Lantsman, 10 pages.
Exhibit B.04, Claim Chart Based on Mozgrin, Kudryavtsev and Mozgrin Thesis, 9 pages.
Exhibit B.09, Claim Chart Based on Wang, Kudryavtsev and Lantsman, 7 pages.
Exhibit B.10, Claim Chart Based on Wang, Kudryavtsev and Mozgrin, 7 pages.
IPR2014-00455 Petition for Inter Partes Review of U.S. Pat. No. 7,808,184; Feb. 27, 2014, 67 pages.

(56) References Cited

OTHER PUBLICATIONS

IPR2014-00455 United States Patent and Trademark Office, "Notice of Filing Date Accorded to Petition and Time for Filing Patent Owner Preliminary Response" Mar. 3, 2014, 3 pages.
IPR2014-00455 Revised Petition for Inter Partes Review of U.S. Pat. No. 7,808,184; Mar. 2014, 67 pages.
IPR2014-00455 Patent Owner Mandatory Notice Information, Mar. 20, 2014, 6 pages.
IPR2014-00455 DeVito, Richard, Professional Declaration, Feb. 26, 2014, 65 pages.
United States Patent and Trademark Office, "Non Final Office Action" for U.S. Appl. No. 11/465,574 (U.S. Pat. No. 7,808,184), dated Dec. 8, 2009, 06 pages.
United States Patent and Trademark Office, "Amendment and Response" for U.S. Appl. No. 11/465,574 (U.S. Pat. No. 7,808,184) dated Jun. 3, 2010, 8 pages.
United States Patent and Trademark Office, "Notice of Allowance and Fee(s) Due" for U.S. Appl. No. 11/465,574 (U.S. Pat. No. 7,808,184), dated Jun. 28, 2010, 5 pages.
United States Patent and Trademark Office, "Amendment and Response for RCE" for U.S. Appl. No. 10/065,277 (U.S. Pat. No. 7,147,759) dated May 2, 2006, 17 pages.
Gudmundsson et al., "Evolution of the electron energy distribution and plasma parameters in a pulsed magnetron discharge" Applied Physics Letters, vol. 78, No. 22, May 28, 2001, 4 pages.
Thornton, John A., "Magnetron sputtering: basic physics and application to cylindrical magnetrons" J. Vac. Sci. Technol. A Vo. 15, No. 2, Mar./Apr. 1978, pp. 171-177.
Leipold et al., "High Electron Density, Atmospheric Pressure Air Glow Discharges" Power Modulator Symposium, 2002 and 2002 High-Voltage Workshop, 25th International Conference, IEEE Jun. 30-Jul. 3, 2002, pp. 130-133.
Exhibit G.01, Claim Chart Based on Mozgrin and Kudryavtsev, 15 pages.
Exhibit G.03, Claim Chart based on Mozgrin, and Mozgrin Thesis, 15 pages.
Exhibit G.02, Claim Chart based on Mozgrin, Kudryavtsev and Wang, 9 pages.
Exhibit G.04, Claim Chart based on Mozgrin, Mozgrin Thesis and Wang, 11 pages.
Exhibit G.05, Claim Chart based on Wang and Kudryavtsev, 14 pages.
IPR2014-00456 Petition for Inter Partes Review of U.S. Pat. No. 7,808,184; Feb. 27, 2014, 65 pages.
IPR2014-00456 United States Patent and Trademark Office, "Notice of Filing Date Accorded to Petition and Time for Filing Patent Owner Preliminary Response" Mar. 6, 2014, 3 pages.
IPR2014-00456 Revised Petition for Inter Partes Review of U.S. Pat. No. 7,808,184; Mar. 7, 2014, 65 pages.
IPR2014-00456 Patent Owner Mandatory Notice Information, Mar. 20, 2014, 6 pages.
IPR2014-00456 DeVito, Richard, Professional Declaration, Feb. 26, 2014, 63 pages.
Exhibit G.06, Claim Chart Based on Kudryavtsev and Mozgrin, 9 pages.
IPR2014-00468 Petition for Inter Partes Review of U.S. Pat. No. 7,811,421; Feb. 28, 2014, 65 pages.
IPR2014-00468 United States Patent and Trademark Office, "Notice of Filing Date Accorded to Petition and Time for Filing Patent Owner Preliminary Response" Mar. 6, 2014, 3 pages.
IPR2014-00468 Revised Petition for Inter Partes Review of U.S. Pat. No. 7,811,421; Mar. 7, 2014, 65 pages.
IPR2014-00468 Patent Owner Mandatory Notice Information, Mar. 21, 2014, 6 pages.
IPR2014-00468 Kortshagen, Uwe, Ph.D., Professional Declaration, Feb. 27, 2014, 123 pages.
United States Patent and Trademark Office, "Non Final Office Action" for U.S. Appl. No. 11/183,463 (U.S. Pat. No. 7,811,421), dated Apr. 21, 2010, 10 pages.
United States Patent and Trademark Office, "Amendment and Response" for U.S. Appl. No. 11/183,463 (U.S. Pat. No. 7,811,421) dated Jun. 23, 2010, 12 pages.
United States Patent and Trademark Office, "Notice of Allowance and Fee(s) Due" for U.S. Appl. No. 11/183,463 (U.S. Pat. No. 7,811,421), dated Aug. 19, 2010, 8 pages.
Exhibit C.01, Claim Chart Based on Mozgrin, 8 pages.
Exhibit C.09, Claim Chart Based on Wang, 11 pages.
Exhibit C.05, Claim Chart Based on Mozgrin and Lantsman, 12 pages.
Exhibit C.10 Claim Chart Based on Wang and Mozgrin, 6 pages.
IPR2014-00470 Petition for Inter Partes Review of U.S. Pat. No. 7,811,421; Mar. 7, 2014, 65 pages.
IPR2014-00470 United States Patent and Trademark Office, "Notice of Filing Date Accorded to Petition and Time for Filing Patent Owner Preliminary Response" Mar. 14, 2014, 3 pages.
IPR2014-00470 Patent Owner Mandatory Notice Information, Mar. 28, 2014, 6 pages.
IPR2014-00470 Kortshagen, Uwe, Ph.D., Professional Declaration, Mar. 2014, 118 pages.
Exhibit D.08, Claim Chart Based on Wang, Lantsman and Mozgrin, 7 pages.
IPR2014-00495 Petition for Inter Partes Review of U.S. Pat. No. 6,853,142; filed Mar. 13, 2014, 67 pages.
IPR2014-00495 United States Patent and Trademark Office, "Notice of Filing Date Accorded to Petition and Time for Filing Patent Owner Preliminary Response" Mar. 24, 2014, 3 pages.
IPR2014-00495 Patent Owner Mandatory Notice Information, Apr. 3, 2014, 6 pages.
IPR2014-00495 Kortshagen, Uwe Ph.D., Professional Declaration, Mar. 12, 2014, 130 pages.
Exhibit D.04, Claim Chart Based on Mozgrin, Lantsman and Kudryavtsev, 12 pages.
Exhibit D.11, Claim Chart Based on Wang, Lantsman and Kudryavtsev, 7 pages.
Exhibit D.05, Claim Chart Based on Mozgrin, Lantsman and Mozgrin Thesis, 9 pages.
Exhibit D.12, Claim Chart Based on Wang, Lantsman and Mozgrin Thesis, 6 pages.
IPR2014-00496 Petition for Inter Partes Review of U.S. Pat. No. 6,853,142; filed Mar. 13, 2014, 63 pages.
IPR2014-00496 United States Patent and Trademark Office, "Notice of Filing Date Accorded to Petition and Time for Filing Patent Owner Preliminary Response" Mar. 24, 2014, 3 pages.
IPR2014-00496 Patent Owner Mandatory Notice Information, Apr. 3, 2014, 6 pages.
IPR2014-00496 Kortshagen, Uwe Ph.D., Professional Declaration, Mar. 12, 2014, 118 pages.
Exhibit D.01, Claim Chart Based on Mozgrin and Kudryavtsev, 19 pages.
Exhibit D.02, Claim Chart Based on Mozgrin, Kudryavtsev and Mozgrin Thesis, 8 pages.
Exhibit D.06, Claim Chart Based on Wang and Kudryavtsev, 17 pages.
IPR2014-00497 Petition for Inter Partes Review of U.S. Pat. No. 6,853,142; filed Mar. 13, 2014, 62 pages.
IPR2014-00497 United State Patent and Trademark Office, "Notice of Filing Date Accorded to Petition and Time for Filing Patent Owner Preliminary Response" Mar. 24, 2014, 3 pages.
IPR2014-00497 Patent Owner Mandatory Notice Information, Apr. 3, 2014, 6 pages.
IPR2014-00497 Kortshagen, Uwe Ph.D., Professional Declaration, Mar. 12, 2014, 117 pages.
IPR2014-00498 Petition for Inter Partes Review of U.S. Pat. No. 6,853,142; filed Mar. 13, 2014, 67 pages.
IPR2014-00498 United States Patent and Trademark Office, "Notice of Filing Date Accorded to Petition and Time for Filing Patent Owner Preliminary Response" Mar. 24, 2014, 3 pages.
IPR2014-00498 Patent Owner Mandatory Notice Information, Apr. 3, 2014, 6 pages.
IPR2014-00498 Kortshagen, Uwe Ph.D., Professional Declaration, Mar. 12, 2014, 130 pages.

(56) References Cited

OTHER PUBLICATIONS

IPR2014-00578 Petition for Inter Partes Review of U.S. Pat. No. 6,896,775; Apr. 4, 2014, 63 pages.
IPR2014-00578 Corrected Petition for Inter Partes Review of U.S. Pat. No. 6,896,775; Apr. 10, 2014, 63 pages.
IPR2014-00578 DeVito, Richard; Professional Declaration, Apr. 3, 2014, 103 pages.
IPR2014-00604 Petition for Inter Partes Review of U.S. Pat. No. 6,896,775; Apr. 4, 2014, 65 pages.
IPR2014-00604 United States Patent and Trademark Office, "Notice of Filing Date Accorded to Petition and Time for Filing Patent Owner Preliminary Response" Apr. 15, 2014, 3 pages.
IPR2014-00604 DeVito, Richard; Professional Declaration, Apr. 3, 2014, 91 pages.
Li et al., "Enhancement of aluminum oxide physical vapor deposition with a secondary plasma" Surface and Coatings Technology 149 (2002), pp. 161-170.
IPR2014-00520 Petition for Inter Partes Review of U.S. Pat. No. 7,604,716; filed Mar. 27, 2014, 67 pages.
IPR2014-00520 Patent Owner Mandatory Notice Information, Apr. 3, 2014, 6 pages.
IPR2014-00520 United States Patent and Trademark Office, "Notice of Filing Date Accorded to Petition and Time for Filing Patent Owner Preliminary Response" Apr. 9, 2014, 3 pages.
IPR2014-00520 Kortshagen, Uwe Ph.D., Professional Declaration, Mar. 26, 2014, 125 pages.
United States Patent and Trademark Office, "Non Final Office Action" for U.S. Appl. No. 10/897,257 (U.S. Pat. No. 7,604,716) dated Mar. 27, 2008, 13 pages.
United States Patent and Trademark Office, "Amendment and Response" for U.S. Appl. No. 10/897,257 (U.S. Pat. No. 7,604,716) dated Sep. 24, 2008, 16 pages.
United States Patent and Trademark Office, "Notice of Allowance and Fee(s) Due" for U.S. Appl. No. 10/897,257 (U.S. Pat. No. 7,604,716) dated Jun. 11, 2009, 7 pages.
Exhibit B.01, Claim Chart Based on Mozgrin, 16 pages.
Exhibit B.06, Claim Chart Based on Mozgrin and Mozgrin Thesis, 8 pages.
Exhibit B.07, Claim Chart Based on Wang, 10 pages.
IPR2014-00521 Petition for Inter Partes Review of U.S. Pat. No. 7,604,716; filed Mar. 27, 2014, 51 pages.
IPR2014-00521 Patent Owner Mandatory Notice Information, Apr. 3, 2014, 6 pages.
IPR2014-00521 United States Patent and Trademark Office, "Notice of Filing Date Accorded to Petition and Time for Filing Patent Owner Preliminary Response" Apr. 9, 2014, 3 pages.
IPR2014-00521 Kortshagen, Uwe Ph.D., Professional Declaration, Mar. 26, 2014, 107 pages.
Exhibit B.05, Claim Chart Based on Mozgrin and Lantsman, 10 pages.
Exhibit B.11, Claim Chart Based on Wang and Lantsman, 5 pages.
IPR2014-00522 Petition for Inter Partes Review of U.S. Pat. No. 7,604,716; filed Mar. 27, 2014, 66 pages.
IPR2014-00522 Patent Owner Mandatory Notice Information, Apr. 3, 2014, 6 pages.
IPR2014-00522 United States Patent and Trademark Office, "Notice of Filing Date Accorded to Petition and TIme for Filing Patent Owner Preliminary Response" Apr. 9, 2014, 3 pages.
IPR2014-00781 Petition for Inter Partes Review of U.S. Pat. No. 7,147,759; May 19, 2014, 68 pages.
IPR2014-00781 Updated Mandatory Notice by Petitioner; May 23, 2014, 5 pages.
IPR2014-00781 United States Patent and Trademark Office, "Notice of Filing Date Accorded to Petition and Time for Filing Patent Owner Preliminary Response" May 28, 2014, 3 pages.
IPR2014-00781 Order Conduct of the Proceedings, May 29, 2014, 5 pages.
IPR2014-00781 Amended Patent Owner Mandatory Notice; Jun. 9, 2014, 7 pages.
IPR2014-00781 Petitioner's Motion for Joinder, Jun. 30, 2014, 13 pages.
IPR2014-00781 Patent Owner Preliminary Response, Jul. 3, 2014, 64 pages.
IPR2014-00782 Petition for Inter Partes Review of U.S. Pat. No. 7,147,759; May 19, 2014, 68 pages.
IPR2014-00782 Updated Mandatory Notice by Petitioner; May 23, 2014, 5 pages.
IPR2014-00782 United States Patent and Trademark Office, "Notice of Filing Date Accorded to Petition and Time for Filing Patent Owner Preliminary Response" May 28, 2014, 3 pages.
IPR2014-00782 Order Conduct of the Proceedings, May 29, 2014, 5 pages.
IPR2014-00782 Amended Patent Owner Mandatory Notice; Jun. 9. 2014, 7 pages.
IPR2014-00782 Petitioner's Motion for Joinder, Jun. 30, 2014, 13 pages.
IPR2014-00782 Patent Owner Preliminary Response, Jul. 3, 2014, 64 pages.
IPR2014-00799 Petition for Inter Partes Review of U.S. Pat. No. 7,808,184; May 22, 2014, 65 pages.
IPR2014-00799 United States Patent and Trademark Office, "Notice of Filing Date Accorded to Petition and Time for Filing Patent Owner Preliminary Response" Jun. 2, 2014, 3 pages.
IPR2014-00799 Patent Owner Mandatory Notice Information, Jun. 12, 2014, 7 pages.
IPR2014-00799 Petitioner's Motion for Joinder, Jun. 30, 2014, 13 pages.
IPR2014-00799 Patent Owner Preliminary Response, Jul. 7, 2014, 57 pages.
IPR2014-00800 Petition for Inter Partes Review of U.S. Pat. No. 7,811,421; May 22, 2014, 66 pages.
IPR2014-00800 United States Patent and Trademark Office, "Notice of Filing Date Accorded to Petition and Time for Filing Patent Owner Preliminary Response" Jun. 2, 2014, 3 pages.
IPR2014-00800 Patent Owner Mandatory Notice Information, Jun. 12, 2014, 7 pages.
IPR2014-00800 Petitioner's Motion for Joinder, Jun. 30, 2014, 13 pages.
IPR2014-00800 Patent Owner Preliminary Response, Jul. 7, 2014, 39 pages.
IPR2014-00802 Petition for Inter Partes Review of U.S. Pat. No. 7,811,421; May 22, 2014, 65 pages.
IPR2014-00802 United States Patent and Trademark Office, "Notice of Filing Date Accorded to Petition and Time for Filing Patent Owner Preliminary Response" Jun. 2, 2014, 3 pages.
IPR2014-00802 Patent Owner Mandatory Notice Information, Jun. 12, 2014, 7 pages.
IPR2014-00803 Petition for Inter Partes Review of U.S. Pat. No. 7,808,184; May 22, 2014, 66 pages.
IPR2014-00803 United States Patent and Trademark Office, "Notice of Filing Date Accorded to Petition and Time for Filing Patent Owner Preliminary Response" Jun. 2, 2014, 3 pages.
IPR2014-00803 Patent Owner Mandatory Notice Information, Jun. 12, 2014, 6 pages.
IPR2014-00803 Petitioner's Motion for Joinder, Jun. 30, 2014, 13 pages.
IPR2014-00803 Patent Owner Preliminary Response, Jul. 7, 2014, 57 pages.
IPR2014-00805 Petition for Inter Partes Review of U.S. Pat. No. 7,811,421; May 23, 2014, 67 pages.
IPR2014-00805 United States Patent and Trademark Office, "Notice of Filing Date Accorded to Petition and Time for Filing Patent Owner Preliminary Response" Jun. 2, 2014, 3 pages.
IPR2014-00805 Amended Patent Owner Mandatory Notice Information, Jun. 13, 2014, 7 pages.
IPR2014-00805 Petitioner's Motion for Joinder, Jun. 30, 2014, 13 pages.
IPR2014-00807 Petition for Inter Partes Review of U.S. Pat. No. 7,604,716; filed May 23, 2014, 65 pages.
IPR2014-00807 United States Patent and Trademark Office, "Notice of Filing Date Accorded to Petition and Time for Filing Patent Owner Preliminary Response" Jun. 2, 2014, 3 pages.

(56) References Cited

OTHER PUBLICATIONS

IPR2014-00807 Amended Patent Owner Mandatory Notice Information, Jun. 13, 2014, 7 pages.
IPR2014-00807 Petitioner's Motion for Joinder, Jun. 30, 2014, 13 pages.
IPR2014-00808 Petition for Inter Partes Review of U.S. Pat. No. 7,604,716; May 23, 2014, 66 pages.
IPR2014-00808 United States Patent and Trademark Office, "Notice of Filing Date Accorded to Petition and Time for Filing Patent Owner Preliminary Response" Jun. 2, 2014, 3 pages.
IPR2014-00808 Patent Owner Mandatory Notice Information, Jun. 13, 2014, 7 pages.
IPR2014-00808 Petitioner's Motion for Joinder, Jun. 30, 2014, 13 pages.
IPR2014-00818 Petition for Inter Partes Review of U.S. Pat. No. 6,853,142; May 27, 2014, 65 pages.
IPR2014-00818 United State Patent and Trademark Office, "Notice of Filing Date Accorded to Petition and Time for Filing Patent Owner Preliminary Response" Jun. 5, 2014, 3 pages.
IPR2014-00818 Patent Owner Mandatory Notice Information, Jun. 17, 2014, 7 pages.
IPR2014-00818 Petitioner's Motion for Joinder, Jun. 27, 2014, 13 pages.
Gousset et al., "Electron and heavy-particle kinetics in the low pressure oxygen positive column" Journal of Physics D: Applied Physics, vol. 24, No. 3 (1991) pp. 290-300.
IPR2014-00818 Petition for Inter Partes Review of U.S. Pat. No. 6,853,142; May 27, 2014, 63 pages.
IPR2014-00818 United States Patent and Trademark Office, "Notice of Filing Date Accorded to Petition and Time for Filing Patent Owner Preliminary Response" Jun. 5, 2014, 3 pages.
IPR2014-00821 Petition for Inter Partes Review of U.S. Pat. No. 6,853,142; May 27, 2014, 67 pages.
IPR2014-00821 United States Patent and Trademark Office, "Notice of Filing Date Accorded to Petition and Time for Filing Patent Owner Preliminary Response" Jun. 5, 2014, 3 pages.
IPR2014-00821 Patent Owner Mandatory Notice Information, Jun. 17, 2014, 7 pages.
IPR2014-00821 Petitioner's Motion for Joinder, Jun. 27, 2014, 13 pages.
IPR2014-00827 Petition for Inter Partes Review of U.S. Pat. No. 6,853,142; May 27, 2014, 64 pages.
IPR2014-00827 United States Patent and Trademark Office, "Notice of Filing Date Accorded to Petition and Time for Filing Patent Owner Preliminary Response" Jun. 5, 2014, 3 pages.
IPR2014-00827 Patent Owner Mandatory Notice Information, Jun. 17, 2014, 7 pages.
IPR2014-00827 Petitioner's Motion for Joinder, Jun. 27, 2014, 13 pages.
IPR2014-00828 Petition for Intern Partes Review of U.S. Pat. No. 6,853,142; May 28, 2014, 66 pages.
IPR2014-00828 United States Patent and Trademark Office, "Notice of Filing Date Accorded to Petition and Time for Filing Patent Owner Preliminary Response" Jun. 5, 2014, 3 pages.
IPR2014-00828 Patent Owner Mandatory Notice Information, Jun. 18, 2014, 7 pages.
IPR2014-00828 Petitioner's Motion for Joinder, Jun. 27, 2014, 13 pages.
IPR2014-00829 Petition for Inter Partes Review of U.S. Pat. No. 6,805,779; May 28, 2014, 66 pages.
IPR2014-00829 United States Patent and Trademark Office, "Notice of Filing Date Accorded to Petition and Time for Filing Patent Owner Preliminary Response" Jun. 5, 2014, 3 pages.
IPR2014-00829 Patent Owner Mandatory Notice Information, Jun. 18, 2014, 7 pages.
IPR2014-00829 Petitioner's Motion for Joinder, Jun. 27, 2014, 13 pages.
IPR2014-00861 Petition for Inter Partes Review of U.S. Pat. No. 6,806,652; May 30, 2014, 66 pages.
IPR2014-00861 United States Patent and Trademark Office, "Notice of Filing Date Accorded to Petition and Time for Filing Patent Owner Preliminary Response" Jun. 12, 2014, 3 pages.
IPR2014-00861 Patent Owner Mandatory Notice Information, Jun. 19, 2014, 7 pages.
IPR2014-00861 Petitioner's Motion for Joinder, Jun. 30, 2014, 13 pages.
IPR2014-00917 Petiton for Inter Partes Review of U.S. Pat. No. 6,805,779; Jun. 9, 2014, 67 pages.
IPR2014-00917 United States Patent and Trademark Office, "Notice of Filing Date Accorded to Petition and Time for Filing Patent Owner Preliminary Response" Jun. 19, 2014, 3 pages.
IPR2014-00917 Petitioner's Motion for Joinder, Jun. 27, 2014, 13 pages.
IPR2014-00917 Patent Owner Mandatory Notice Information, Jul. 1, 2014, 7 pages.
IPR2014-00843 Petition for Inter Partes Review of U.S. Pat. No. 6,806,652; May 29, 2014, 66 pages.
IPR2014-00843 United States Patent and Trademark Office, "Notice of Filing Date Accorded to Petition and Time for Filing Patent Owner Preliminary Response" Jun. 11, 2014, 3 pages.
IPR2014-00843 Patent Owner Mandatory Notice Information, Jun. 19, 2014, 7 pages.
IPR2014-00686 Kortshagen, Uwe Ph.D., Professional Declaration, May 29, 2014, 107 pages.
Fahey, D.W. et al., "High flux beam source of thermal rare-gas metastable atoms" Journal of Physics E: Science Instruments, vol. 13, (1980) 4 pages.
Ropcke, J. et al., "Comparison of Optical Emission Spectrometric Measurements of the Concentration and Energy of Species in Low-pressure Microwave and Radiofrequency Plasma Sources" Journal of Analytical Atomic Spectrometry, vol. 9, Sep. 1993, pp. 803-808.
Hopwood, J. and Asmussen, J., "Neutral gas temperatures in a multipolar electron cyclotron resonance plasma" American Institute of Physics, Journal of Applied Physics Letters, vol. 58, Issue 22, Jun. 3, 1991, 4 pages.
Hebner, G.A., "Spatially resolved, excited state densities and neutral and ion temperatures in inductively coupled argon plasmas" American Institute of Physics, Journal of Applied Physics Letters, vol. 80, Issue 5m Sep. 1, 1996, 14 pages.
Clarenbach, B. et al., "Time-dependent gas density and temperature measurements inpulsed helicon discharges in argon" Plasma Sources Science and Technology, vol. 12, No. 3 (2003), 14 pages.
IPR2014-00913 Petition for Inter Partes Review of U.S. Pat. No. 6,805,779; Jun. 6, 2014, 67 pages.
IPR2014-00913 United States Patent and Trademark Office, "Notice of Filing Date Accorded to Petition and Time for Filing Patent Owner Preliminary Response" Jun. 19, 2014, 4 pages.
IPR2014-00913 Patent Owner Mandatory Notice Information, Jul. 1, 2014, 7 pages.
IPR2014-00913 Kortshagen, Uwe Ph.D., Professional Declaration, Jun. 6, 2014, 116 pages.
United States District Court, District of Massachusetts, "Plaintiff Zond LLC's Preliminary Proposed Claim Constructions" Civil Action No. 13-cv-11634-WGY, May 28, 2014, 4 pages.
IPR2014-00923 Petition for Inter Partes Review of U.S. Pat. No. 6,806,652; Jun. 10, 2014, 59 pages.
IPR2014-00923 United States Patent and Trademark Office, "Notice of Filing Date Accorded to Petition and Time for Filing Patent Owner Preliminary Response" Jun. 19, 2014, 3 pages.
IPR2014-00923 Patent Owner Mandatory Notice Information, Jul. 9, 2014, 7 pages.
IPR2014-00923 Kortshagen, Uwe Ph.D., Professional Declaration, Jun. 10, 2014, 96 pages.
IPR2014-00945 Petition for Inter Partes Review of U.S. Pat. No. 6,806,652; Jun. 12, 2014, 68 pages.
IPR2014-00945 United State Patent and Trademark Office, "Notice of Filing Date Accorded to Petition and Time for Filing Patent Owner Preliminary Response" Jun. 19, 2014, 3 pages.
IPR2014-00945 Patent Owner Mandatory Notice Information, Jul. 10, 2014, 7 pages.

(56) References Cited

OTHER PUBLICATIONS

Kortshagen, Uwe Ph.D., Professional Declaration, Jun. 12, 2014, 103 pages.
IPR2014-00981 Petition for Inter Partes Review of U.S. Pat. No. 7,147,759; Jun. 19, 2014, 68 pages.
IPR2014-00981 United State Patent and Trademark Office, "Notice of Filing Date Accorded to Petition and Time for Filing Patent Owner Preliminary Response" Jun. 24, 2014, 3 pages.
IPR2014-00984 Petition for Inter Partes Review of U.S. Pat. No. 7,147,759; Jun. 19, 2014, 67 pages.
IPR2014-00984 United States Patent and Trademark Office, "Notice of Filing Dae Accorded to Petition and Time for Filing Patent Owner Preliminary Response" Jun. 24, 2014, 3 pages.
IPR2014-00985 Petition for Inter Partes Review of U.S. Pat. No. 7,147,759; Jun. 19, 2014, 68 pages.
IPR2014-00985 United States Patent and Trademark Office, "Notice of Filing Date Accorded to Petition and Time for Filing Patent Owner Preliminary Response" Jun. 24, 2014, 3 pages.
IPR2014-00986 Petition for Inter Partes Review of U.S. Pat. No. 7,147,759; Jun. 19, 2014, 68 pages.
IPR2014-00986 United States Patent and Trademark Office, "Notice of Filing Date Accorded to Petition and Time for Filing Patent Owner Preliminary Response" Jun. 24, 2014, 3 pages.
IPR2014-00988 Petition for Inter Partes Review of U.S. Pat. No. 7,147,759; Jun. 19, 2014, 62 pages.
IPR2014-00988 United States Patent and Trademark Office, "Notice of Filing Date Accorded to Petition and Time for Filing Patent Owner Preliminary Response" Jun. 25, 2014, 3 pages.
IPR2014-00990 Petition for Inter Partes Review of U.S. Pat. No. 7,811,421; Jun. 19, 2014, 68 pages.
IPR2014-00990 United States Patent and Trademark Office, "Notice of Filing Date Accorded to Petition and Time for Filing Patent Owner Preliminary Response" Jun. 25, 2014, 3 pages.
IPR2014-00991 Petition for Inter Partes Review of U.S. Pat. No. 7,811,421; Jun. 19, 2014, 66 pages.
IPR2014-00991 United States Patent and Trademark Office, "Notice of Filing Date Accorded to Petition and Time for Filing Patent Owner Preliminary Response" Jun. 25, 2014, 3 pages.
IPR2014-00992 Petition for Inter Partes Review of U.S. Pat. No. 7,811,421; Jun. 19, 2014, 65 pages.
IPR2014-00992 United States Patent and Trademark Office, "Notice of Filing Date Accorded to Petition and Time for Filing Patent Owner Preliminary Response" Jun. 25, 2014, 3 pages.
IPR2014-00995 Petition for Inter Partes Review of U.S. Pat. No. 7,808,184; Jun. 20, 2014, 67 pages.
IPR2014-00995 United States Patent and Trademark Office, "Notice of Filing Date Accorded to Petition and Time for Filing Patent Owner Preliminary Response" Jun. 25, 2014, 3 pages.
IPR2014-00996 Petition for Inter Partes Review of U.S. Pat. No. 7,808,184; Jun. 20, 2014, 63 pages.
IPR2014-00996 United States Patent and Trademark Office, "Notice of Filing Date Accorded to Petition and Time for Filing Patent Owner Preliminary Response" Jun. 25, 2014, 3 pages.
IPR2014-01000 Petition for Inter Partes Review of U.S. Pat. No. 6,806,652; Jun. 20, 2014, 68 pages.
IPR2014-01000 United States Patent and Trademark Office, "Notice of Filing Date Accorded to Petition and Time for Filing Patent Owner Preliminary Response" Jul. 7, 2014, 3 pages.
IPR2014-01003 Petition for Inter Partes Review of U.S. Pat. No. 6,806,652; Jun. 20, 2014, 66 pages.
IPR2014-01003 United States Patent and Trademark Office, "Notice of Filing Date Accorded to Petition and Time for Filing Patent Owner Preliminary Response" Jul. 7, 2014, 3 pages.
IPR2014-01004 Petition for Inter Partes Review of U.S. Pat. No. 6,806,652; Jun. 20, 2014, 60 pages.
IPR2014-01004 United States Patent and Trademark Office, "Notice of Filing Date Accorded to Petition and Time for Filing Patent Owner Preliminary Response" Jul. 7, 2014, 3 pages.
IPR2014-01012 Petition for Inter Partes Review of U.S. Pat. No. 6,853,142; filed Jun. 23, 2014, 66 pages.
IPR2014-01012 United States Patent and Trademark Office, "Notice of Filing Date Accorded to Petition and Time for Filing Patent Owner Preliminary Response" Jul. 7, 2014, 3 pages.
IPR2014-01013 Petition for Inter Partes Review of U.S. Pat. No. 6,853,142; filed Jun. 23, 2014, 67 pages.
IPR2014-01013 United States Patent and Trademark Office, "Notice of Filing Date Accorded to Petition and Time for Filing Patent Owner Preliminary Response" Jul. 7, 2014, 3 pages.
IPR2014-01014 Petition for Inter Partes Review of U.S. Pat. No. 6,853,142; filed Jun. 23, 2014, 63 pages.
IPR2014-01014 United States Patent and Trademark Office, "Notice of Filing Date Accorded to Petition and Time for Filing Patent Owner Preliminary Response" Jul. 7, 2014, 3 pages.
IPR2014-01015 Petition for Inter Partes Review of U.S. Pat. No. 6,853,142; filed Jun. 23, 2014, 63 pages.
IPR2014-01015 United States Patent and Trademark Office, "Notice of Filing Date Accorded to Petition and Time for Filing Patent Owner Preliminary Response" Jul. 7, 2014, 3 pages.
IPR2014-01016 Petition for Inter Partes Review of U.S. Pat. No. 6,853,142; filed Jun. 23, 2014, 68 pages.
IPR2014-01016 United States Patent and Trademark Office, "Notice of Filing Date Accorded to Petition and Time for Filing Patent Owner Preliminary Response" Jul. 7, 2014, 3 pages.
IPR2014-01017 Petition for Inter Partes Review of U.S. Pat. No. 6,853,142; filed Jun. 23, 2014, 66 pages.
IPR2014-01017 United States Patent and Trademark Office, "Notice of Filing Date Accorded to Petition and Time for Filing Patent Owner Preliminary Response" Jul. 7, 2014, 3 pages.
IPR2014-01019 Petition for Inter Partes Review of U.S. Pat. No. 6,853,142; filed Jun. 23, 2014, 66 pages.
IPR2014-01019 United States Patent and Trademark Office, "Notice of Filing Date Accorded to Petition and Time for Filing Patent Owner Preliminary Response" Jul. 7, 2014, 3 pages.
IPR2014-01020 Petition for Inter Partes Review of U.S. Pat. No. 6,853,142; filed Jun. 23, 2014, 66 pages.
IPR2014-01020 United States Patent and Trademark Office, "Notice of Filing Date Accorded to Petition and Time for Filing Patent Owner Preliminary Response" Jul. 8, 2014, 3 pages.
IPR2014-01022 Petition for Inter Partes Review of U.S. Pat. No. 6,853,142; filed Jun. 23, 2014, 68 pages.
IPR2014-01022 United States Patent and Trademark Office, "Notice of Filing Date Accorded to Petition and Time for Filing Patent Owner Preliminary Response" Jul. 8, 2014, 3 pages.
IPR2014-01025 Petition for Inter Partes Review of U.S. Pat. No. 6,853,142; filed Jun. 23, 2014, 68 pages.
IPR2014-01025 United States Patent and Trademark Office, "Notice of Filing Date Accorded to Petition and Time for Filing Patent Owner Preliminary Response" Jul. 8, 2014, 3 pages.
IPR2014-00991 Patent Owner Mandatory Notice Information, Jul. 16, 2014, 7 pages.
IPR2014-00991 Patent Owner's Preliminary Response, Aug. 19, 2014, 39 pages.
IPR2014-00991 Petitioner's Motion for Joinder, Aug. 18, 2014, 13 pages.
IPR2014-00992 Patent Owner Mandatory Notice Information, Jul. 16, 2014, 7 pages.
IPR2014-00992 Patent Owner's Preliminary Response, Aug. 19, 2014, 62 pages.
IPR2014-00992 Petitioner's Motion for Joinder, Aug. 18, 2014, 13 pages.
IPR2014-00995 Patent Owner Mandatory Notice Information, Jul. 16, 2014, 7 pages.
IPR2014-00995 Patent Owner's Preliminary Response, Aug. 19, 2014, 57 pages.
IPR2014-00995 Petitioner's Motion for Joinder, Aug. 18, 2014, 13 pages.
IPR2014-00996 Patent Owner Mandatory Notice Information, Jul. 17, 2014, 7 pages.
IPR2014-00996 Patent Owner's Preliminary Response, Aug. 19, 2014, 57 pages.
IPR2014-00996 Petitioner's Motion for Joinder, Aug. 18, 2014, 13 pages.

(56) References Cited

OTHER PUBLICATIONS

IPR2014-01000 Patent Owner Mandatory Notice Information, Jul. 24, 2014, 7 pages.
IPR2014-01000 Petitioner's Motion for Joinder, Aug. 18, 2014, 13 pages.
IPR2014-01003 Patent Owner Mandatory Notice Information, Jul. 24, 2014, 7 pages.
IPR2014-01003 Petitioner's Motion for Joinder, Aug. 18, 2014, 13 pages.
IPR2014-01004 Patent Owner Mandatory Notice Information, Jul. 24, 2014, 7 pages.
IPR2014-01004 Petitioner's Motion for Joinder, Aug. 18, 2014, 13 pages.
IPR2014-01012 Patent Owner Mandatory Notice Information, Jul. 24, 2014, 7 pages.
IPR2014-01012 Petitioner's Motion for Joinder, Aug. 18, 2014, 13 pages.
IPR2014-01012 Preliminary Response, Aug. 20, 2014, 62 pages.
IPR2014-01013 Patent Owner Mandatory Notice Information, Jul. 24, 2014, 7 pages.
IPR2014-01013 Petitioner's Motion for Joinder, Aug. 18, 2014, 13 pages.
IPR2014-01013 Preliminary Response, Aug. 20, 2014, 64 pages.
IPR2014-01014 Patent Owner Mandatory Notice Information, Jul. 24, 2014, 7 pages.
IPR2014-01014 Petitioner's Motion for Joinder, Aug. 18, 2014, 13 pages.
IPR2014-01014 Preliminary Response, Aug. 20, 2014, 59 pages.
IPR2014-01015 Patent Owner Mandatory Notice Information, Jul. 24, 2014, 7 pages.
IPR2014-01015 Petitioner's Motion for Joinder, Aug. 18, 2014, 13 pages.
IPR2014-01015 Preliminary Response, Aug. 20, 2014, 51 pages.
IPR2014-01016 Patent Owner Mandatory Notice Information, Jul. 24, 2014, 7 pages.
IPR2014-01016 Petitioner's Motion for Joinder, Aug. 18, 2014, 13 pages.
IPR2014-01016 Preliminary Response, Aug. 20, 2014, 64 pages.
IPR2014-01017 Patent Owner Mandatory Notice Information, Jul. 24, 2014, 7 pages.
IPR2014-01017 Petitioner's Motion for Joinder, Aug. 18, 2014, 13 pages.
IPR2014-01017 Preliminary Response, Aug. 20, 2014, 57 pages.
IPR2014-01019 Patent Owner Mandatory Notice Information, Jul. 24, 2014, 7 pages.
IPR2014-01019 Petitioner's Motion for Joinder, Aug. 18, 2014, 13 pages.
IPR2014-01019 Preliminary Response, Aug. 20, 2014, 66 pages.
IPR2014-01020 Patent Owner Mandatory Notice Information, Jul. 24, 2014, 7 pages.
IPR2014-01020 Petitioner's Motion for Joinder, Aug. 18, 2014, 13 pages.
IPR2014-01022 Patent Owner Mandatory Notice Information, Jul. 24, 2014, 7 pages.
IPR2014-01022 Petitioner's Motion for Joinder, Aug. 18, 2014, 13 pages.
IPR2014-01025 Patent Owner Mandatory Notice Information, Jul. 24, 2014, 7 pages.
IPR2014-01025 Petitioner's Motion for Joinder, Aug. 18, 2014, 13 pages.
IPR2014-00802 Patent Owner Preliminary Response, Jul. 16, 2014, 62 pages.
IPR2014-00805 Patent Owner Preliminary Response, Jul. 16, 2014, 55 pages.
IPR2014-00807 Patent Owner Preliminary Response, Aug. 5, 2014, 59 pages.
IPR2014-00808 Patent Owner Preliminary Response, Aug. 5, 2014, 64 pages.
IPR2014-00443 Decision, Institution of Inter Partes Review, Aug. 27, 2014, 29 pages.
IPR2014-00444 Decision, Institution of Inter Partes Review, Aug. 27, 2014, 29 pages.
IPR2014-00445 Decision, Institution of Inter Partes Review, Aug. 27, 2014, 31 pages.
IPR2014-00446 Decision, Institution of Inter Partes Review, Aug. 27, 2014, 28 pages.
IPR2014-00447 Decision, Institution of Inter Partes Review, Aug. 27, 2014, 31 pages.
IPR2014-00455 Decision, Institution of Inter Partes Review, Sep. 3, 2014, 29 pages.
IPR2014-00456 Decision, Institution of Inter Partes Review, Sep. 3, 2014, 32 pages.
IPR2014-00468 Decision, Institution of Inter Partes Review, Sep. 2, 2014, 22 pages.
IPR2014-00470 Decision, Institution of Inter Partes Review, Sep. 2, 2014, 26 pages.
IPR2014-00473 Decision, Institution of Inter Partes Review, Sep. 2, 2014, 26 pages.
IPR2014-00598 Patent Owner's Preliminary Response, Jul. 14, 2014, 58 pages.
IPR2014-00686 Patent Owner's Preliminary Response, Jul. 29, 2014, 65 pages.
IPR2014-00765 Patent Owner's Preliminary Response, Aug. 28, 2014, 56 pages.
IPR2014-00477 Decision, Institution of Inter Partes Review, Sep. 8, 2014, 27 pages.
IPR2014-00479 Decision, Institution of Inter Partes Review, Sep. 8, 2014, 35 pages.
IPR2014-00578 Patent Owner's Preliminary Response, Jul. 15, 2014, 63 pages.
IPR2014-00580 Patent Owner's Preliminary Response, Jul. 15, 2014, 64 pages.
IPR2014-00604 Patent Owner's Preliminary Response, Aug. 6, 2014, 64 pages.
IPR2014-00726 Patent Owner's Preliminary Response, Aug. 6, 2014, 64 pages.
IPR2014-00972 Patent Owner Mandatory Notice Information, Jul. 16, 2014, 7 pages.
IPR2014-00972 Patent Owner's Preliminary Response, Aug. 5, 2014, 37 pages.
IPR2014-00972 Petitioner's Motion for Joinder, Aug. 18, 2014, 13 pages.
IPR2014-00973 Patent Owner Mandatory Notice Information, Jul. 16, 2014, 7 pages.
IPR2014-00973 Patent Owner's Preliminary Response, Aug. 5, 2014, 46 pages.
IPR2014-00973 Petitioner's Motion for Joinder, Aug. 18, 2014, 13 pages.
IPR2014-00974 Patent Owner Mandatory Notice Information, Jul. 16, 2014, 7 pages.
IPR2014-00974 Patent Owner's Preliminary Response, Aug. 5, 2014, 59 pages.
IPR2014-00974 Petitioner's Motion for Joinder, Aug. 18, 2014, 13 pages.
IPR2014-00975 Patent Owner Mandatory Notice Information, Jul. 16, 2014, 7 pages.
IPR2014-00975 Patent Owner's Preliminary Response, Aug. 5, 2014, 64 pages.
IPR2014-00975 Petitioner's Motion for Joinder, Aug. 18, 2014, 13 pages.
IPR2014-00981 Patent Owner Mandatory Notice Information, Jul. 16, 2014, 7 pages.
IPR2014-00981 Patent Owner's Preliminary Response, Aug. 13, 2014, 64 pages.
IPR2014-00981 Petitioner's Motion for Joinder, Aug. 18, 2014, 13 pages.
IPR2014-00984 Patent Owner Mandatory Notice Information, Jul. 16, 2014, 7 pages.
IPR2014-00984 Patent Owner's Preliminary Response, Aug. 13, 2014, 63 pages.
IPR2014-00984 Petitioner's Motion for Joinder, Aug. 18, 2014, 13 pages.

(56) References Cited

OTHER PUBLICATIONS

IPR2014-00985 Patent Owner Mandatory Notice Information, Jul. 16, 2014, 7 pages.
IPR2014-00985 Patent Owner's Preliminary Response, Aug. 13, 2014, 65 pages.
IPR2014-00985 Petitioner's Motion for Joinder, Aug. 18, 2014, 13 pages.
IPR2014-00986 Patent Owner Mandatory Notice Information, Jul. 16, 2014, 7 pages.
IPR2014-00986 Patent Owner's Preliminary Response, Aug. 13, 2014, 64 pages.
IPR2014-00986 Petitioner's Motion for Joinder, Aug. 18, 2014, 13 pages.
IPR2014-00988 Patent Owner Mandatory Notice Information, Jul. 16, 2014, 7 pages.
IPR2014-00988 Patent Owner's Preliminary Response, Aug. 13, 2014, 64 pages.
IPR2014-00988 Petitioner's Motion for Joinder, Aug. 18, 2014, 13 pages.
IPR2014-00990 Patent Owner Mandatory Notice Information, Jul. 16, 2014, 7 pages.
IPR2014-00990 Patent Owner's Preliminary Response, Aug. 19, 2014, 55 pages.
IPR2014-00990 Petitioner's Motion for Joinder, Aug. 18, 2014, 13 pages.
IPR2014-00445 Petition for Inter Partes Review of U.S. Pat. No. 7,147,759; Feb. 20, 2014, 68 pages.
IPR2014-00443 Petition for Inter Partes Review of U.S. Pat. No. 7,147,759; Feb. 20, 2014, 68 pages.
IPR2014-00443 United States Patent and Trademark Office, "Notice of Filing Date Accorded to Petition and Time for Filing Patent Owner Preliminary Response" Feb. 28, 2014, 3 pages.
IPR2014-00443 United States Patent and Trademark Office, "Order—Error in Petition" Mar. 3, 2014, 2 pages.
IPR2014-00443 Revised Petition for Inter Partes Review of U.S. Pat. No. 7,147,759; Mar. 3, 2014, 68 pages.
IPR2014-00445 United States Patent and Trademark Office, "Notice of Filing Date Accorded to Petition and Time for Filing Patent Owner Preliminary Response" Mar. 3, 2014, 3 pages.
IPR2014-00443 Patent Owner Mandatory Notice Information, Mar. 13, 2014, 5 pages.
IPR2014-00443 Kortshagen, Uwe Ph.D., Professional Declaration, Feb. 2, 2014, 74 pages.
Mozgrin et al., "High-Current Low-Pressure Quasi-Stationary Discharge in a Magnetic Field: Experimental Research" Plasma Physics Reports, vol. 21, No. 5, 1995, pp. 400-409.
Kudryavtsev, A.A. et al., "Ionization relaxation in a plasma produced by a pulsed inert-gas discharge" Sov. Phys. Tech. Phys., Jan. 1983, 6 pages.
Manos et al., Plasma Etching, Academic Press 1989, pp. 185-258.
United States Patent and Trademark Office, "Amendment and Response" for U.S. Appl. No. 10/065,277 (U.S. Pat. No. 7,147,759), dated of Jun. 14, 2004, 22 pages.
United States Patent and Trademark Office, "Non-Final Rejection" for U.S. Appl. No. 10/065,277 (U.S. Pat. No. 7,147,759) dated Aug. 30, 2004, 14 pages.
United States Patent and Trademark Office, "Response" for U.S. Appl. No. 10/065,277 (U.S. Pat. No. 7,147,759), dated Feb. 24, 2005, 14 pages.
United States Patent and Trademark Office, "Final Rejection" for U.S. Appl. No. 10/065,277 (U.S. Pat. No. 7,147,759), dated May 27, 2005, 14 pages.
United States Patent and Trademark Office, "Response for RCE" for U.S. Appl. No. 10/065,277 (U.S. Pat. No. 7,147,759) dated Oct. 27, 2005, 18 pages.
United States Patent and Trademark Office, "Final Rejection" for U.S. Appl. No. 10/065,277 (U.S. Pat. No. 7,147,759) dated Jan. 11, 2006, 16 pages.
United States Patent and Trademark Office, "Amendment and Response for RCE" for U.S. Appl. No. 10/065,277 (U.S. Pat. No. 7,147,759) dated May 2, 2006, 18 pages.
United States Patent and Trademark Office, "Response" for U.S. Appl. No. 10/065,277 (U.S. Pat. No. 7,147,759) dated Aug. 28, 2006, 6 pages.
United States Patent and Trademark Office, "Notice of Allowability" for U.S. Appl. No. 10/065,277 (U.S. Pat. No. 7,147,759), dated Oct. 11, 2006, 6 pages.
Raizer, Yuri P., "Gas Discharge Physics" Springer, 1st Edition1991, Corrected 2nd Printing 1997, 26 pages.
Mozgrin et al., "High-Current Low-Pressure Quasi-Stationary Discharge in a Magnetic Field: Experimental Research"Moscow Engineering Physics Institute (Technical University), Ph.D. Thesis in Physics and Mathematics,1994, 124 pages. Certified Translation.
Mozgrin et al., "High-Current Low-Pressure Quasi-Stationary Discharge in a Magnetic Field: Experimental Research"Moscow Engineering Physics Institute (Technical University), Ph.D. Thesis in Physics and Mathematics,1994, 124 pages. Original Russian Text.
Russian State Library, Catalogue entry for Mozgrin et al., "High-Current Low-Pressure Quasi-Stationary Discharge in a Magnetic Field: Experimental Research"Moscow Engineering Physics Institute (Technical University), Ph.D. Thesis in Physics and Mathematics, 2 pages.
Li et al., "Low-temperature magnetron sputter-deposition, hardness, and electrical resistivity of amorphous and crystalline alumina thin films" J. Vac. Sci. Technol. A 18(5), Sep./Oct. 2000, pp. 2333-2338.
European Patent Office File History, "Response" for European Patent Application 1560943, dated Apr. 21, 2008, 4 pages.
Exhibit A.01, Claim Chart Based on Mozgrin and Kudryavtsev, 40 pages.
Exhibit A.03, Claim Chart based on Mozgrin, Kudryavtsev and Mozgrin Thesis, 20 pages.
Exhibit A.02, Claim Chart based on Mozgrin, Kudryavtsev and Li, 18 pages.
Exhibit A.04, Claim Chart based on Mozgrin, Kudryavtsev and Muller-Horsche, 16 pages.
Exhibit A.06, Claim Chart based on Wang and Kudryavtsev, 30 pages.
Exhibit A.08, Claim Chart based on Wang, Kudryavtsev and Li, 14 pages.
Exhibit A.11, Claim Chart based on Wang, Kudryavtsev and Muller-Horsche, 12 pages.
Exhibit A.07, Claim Chart based on Wang, Kudryavtsev and Kobayashi, 7 pages.
Exhibit A.10, Claim Chart based on Wang, Kudryavtsev and Mozgrin Thesis, 14 pages.
Statement of Related Litigation, 1 page.
IPR2014-00444 Petition for Inter Partes Review of U.S. Pat. No. 7,147,759; Feb. 20, 2014, 67 pages.
IPR2014-00444 United States Patent and Trademark Office, "Notice of Filing Date Accorded to Petition and Time for Filing Patent Owner Preliminary Response" Mar. 3, 2014, 3 pages.
IPR2014-00444 Revised Petition for Inter Partes Review of U.S. Pat. No. 7,147,759; Mar. 6, 2014, 67 pages.
IPR2014-00444 Patent Owner Mandatory Notice Information, Mar. 13, 2014, 5 pages.
IPR2014-00444 Kortshagen, Uwe Ph.D., Professional Declaration, Feb. 2, 2014, 66 pages.
Exhibit A.09, Claim Chart based on Wang, Kudryavtsev and Mozgrin, 15 pages.
IPR2014-00445 Revised Petition for Inter Partes Review of U.S. Pat. No. 7,147,759; Mar. 6, 2014, 68 pages.
IPR2014-00445 Patent Owner Mandatory Notice Information, Mar. 13, 2014, 4 pages.
Exhibit C.08, Claim Chart Based on Mozgrin, Lantsman and Mozgrin Thesis, 6 pages.
Exhibit C.11, Claim Chart Based on Wang and Mozgrin Thesis, 6 pages.
Exhibit C.12, Claim Chart Based on Wang and Kawamata, 7 pages.
Exhibit C.13, Claim Chart Based on Wang and Lantsman, 7 pages.
Exhibit C.14, Claim Chart Based on Wang, Lantsman and Kawamata, 8 pages.

(56) References Cited

OTHER PUBLICATIONS

Exhibit C.15, Claim Chart Based on Wang and Kudryavtsev, 8 pages.
IPR2014-00686 Patent Owner Mandatory Notice Information, May 14, 2014, 6 pages.
IPR2014-00686 Kortshagen, Uwe Ph.D., Professional Declaration, Apr. 23, 2014, 126 pages.
IPR2014-00765 Revised Petition for Inter Partes Review of U.S. Pat. No. 6,805,779; Jun. 6, 2014, 67 pages.
IPR2014-00765 United States Patent and Trademark Office, "Notice of Filing Date Accorded to Petition and Time for Filing Patent Owner Preliminary Response" May 28, 2014, 4 pages.
IPR2014-00765 Patent Owner Mandatory Notice Information, Jun. 10, 2014, 7 pages.
IPR2014-00765 Kortshagen, Uwe Ph.D., Professional Declaration, May 15, 2014, 111 pages.
IPR2014-00820 Petition for Inter Partes Review of U.S. Pat. No. 6,805,779; May 27, 2014, 66 pages.
IPR2014-00820 United States Patent and Trademark Office, "Notice of Filing Date Accorded to Petition and Time for Filing Patent Owner Preliminary Response" Jun. 11, 2014, 3 pages.
IPR2014-00820 Patent Owner Mandatory Notice Information, Jun. 17, 2014, 7 pages.
Kortshagen, Uwe Ph.D., Professional Declaration, May 26, 2014, 112 pages.
IPR2014-00477 Petition for Inter Partes Review of U.S. Pat. No. 8,125,155, Mar. 4, 2014, 67 pages.
IPR2014-00477 United States Patent and Trademark Office, "Notice of Filing Date Accorded to Petition and Time for Filing Patent Owner Preliminary Response" Mar. 7, 2014, 3 pages.
IPR2014-00477 Patent Owner Mandatory Notice Information, Mar. 25, 2014, 6 pages.
IPR2014-00477 Patent Owner's Motion for Counsel to Withdraw, Mar. 24, 2014, 4 pages.
IPR2014-00477 Amended Patent Owner Mandatory Notice Information, Apr. 24, 2014, 6 pages.
IPR2014-00477 Decision, Patent Owner's Motion for Counsel to Withdraw, Apr. 28, 2014, 4 pages.
IPR2014-00477 Patent Owner's Preliminary Response, Jun. 9, 2014, 48 pages.
IPR2014-00477 DeVITO, Richard, Professional Declaration, Mar. 4, 2014, 106 pages.
European Patent Office, "Response" for European Patent Application 03776584.9, dated Jul. 23, 2009, 21 pages.
Schneider, Jochen M., et al., "Recent Developments in plasma assisted physical vapour deposition" Journal of Physics D: Applied Physics, vol. 33, No. 18, Apr. 26, 2000, pp. R173-R186.
IPR2014-00479 Petition for Inter Partes Review of U.S. Pat. No. 8,125,155; Mar. 4, 2014, 61 pages.
IPR2014-00479 United States Patent and Trademark Office, "Notice of Filing Date Accorded to Petition and Time for Filing Patent Owner Preliminary Response" Mar. 7, 2014, 3 pages.
IPR2014-00479 Patent Owner Mandatory Notice Information, Mar. 25, 2014, 6 pages.
IPR2014-00479 Patent Owner's Motion for Counsel to Withdraw, Mar. 24, 2014, 4 pages.
IPR2014-00479 Amended Patent Owner Mandatory Notice Information, Apr. 24, 2014, 6 pages.
IPR2014-00479 Decision, Patent Owner's Motion for Counsel to Withdraw, Apr. 28, 2014, 4 pages.
IPR2014-00479 Patent Owner's Preliminary Response, Jun. 9, 2014, 54 pages.
IPR2014-00479 DeVito, Richard, Professional Declaration, Mar. 4, 2014, 97 pages.
IPR2014-00578 Patent Owner Mandatory Notice Information, Apr. 25, 2014, 5 pages.
IPR2014-00578 Transmittal Letter, Apr. 30, 2014, 3 pages.
IPR2014-00578 Revised Petition for Inter Partes Review of U.S. Pat. No. 6,896,775; Apr. 30, 2014, 66 pages.
IPR2014-00578 Notice of Accepting Corrected Petition, May 3, 2014, 2 pages.
IPR2014-00580 Patent Owner Mandatory Notice Information, Apr. 25, 2014, 5 pages.
IPR2014-00580 Transmittal Letter, Apr. 30, 2014, 3 pages.
IPR2014-00580 Revised Petition for Inter Partes Review of U.S. Pat. No. 6,896,775; Apr. 30, 2014, 67 pages.
IPR2014-00580 Notice of Accepting Corrected Petition, May 3, 2014, 2 pages.
IPR2014-00604 Patent Owner Mandatory Notice Information, Apr. 25, 2014, 5 pages.
IPR2014-00726 Petition for Inter Partes Review of U.S. Pat. No. 6,896,773; May 2, 2014, 68 pages.
IPR2014-00726 United States Patent and Trademark Office, "Notice of Filing Date Accorded to Petition and Time for Filing Patent Owner Preliminary Response" May 6, 2014, 3 pages.
IPR2014-00726 Patent Owner Mandatory Notice Information, May 14, 2014, 6 pages.
IPR2014-00726 DeVito, Richard, Professional Declaration, May 1, 2014, 94 pages.
IPR2014-00972 Petition for Inter Partes Review of U.S. Pat. No. 7,604,716; filed Jun. 18, 2014, 67 pages.
IPR2014-00972 United States Patent and Trademark Office, "Notice of Filing Date Accorded to Petition and Time for Filing Patent Owner Preliminary Response" Jun. 30, 2014, 3 pages.
IPR2014-00973 Petition for Inter Partes Review of U.S. Pat. No. 7,604,716; filed Jun. 18, 2014, 52 pages.
IPR2014-00973 United States Patent and Trademark Office, "Notice of Filing Date Accorded to Petition and Time for Filing Patent Owner Preliminary Response" Jun. 30, 2014, 3 pages.
IPR2014-00974 Petition for Inter Partes Review of U.S. Pat. No. 7,604,716; filed Jun. 18, 2014, 67 pages.
IPR2014-00974 United States Patent and Trademark Office, "Notice of Filing Date Accorded to Petition and Time for Filing Patent Owner Preliminary Response" Jun. 30, 2014, 3 pages.
IPR2014-00975 Petition for Inter Partes Review of U.S. Pat. No. 7,604,716; filed Jun. 18, 2014, 64 pages.
IPR2014-00975 United States Patent and Trademark Office, "Notice of Filing Date Accorded to Petition and Time for Filing Patent Owner Preliminary Response" Jun. 30, 2014, 3 pages.
Roman Chistyakov, "Methods and Apparatus for Generating Strongly-Ionized Plasmas With Ionizational Instabilities", United States Patent and Trademark Office U.S. Appl. No. 14/270,440, filed May 6, 2014, 72 pages.
IPR2014-01020 Preliminary Response, Oct. 1, 2014, 61 pages.
IPR2014-01022 Preliminary Response, Oct. 2, 2014, 55 pages.
IPR2014-01025 Preliminary Response, Sep. 22, 2014, 65 pages.
IPR2014-00781 Decision, Institution of Inter Partes Review, Oct. 1, 2014, 30 pages.
IPR2014-00782 Decision, Institution of Inter Partes Review, Oct. 1, 2014, 28 pages.
IPR2014-00799 Decision, Institution of Inter Partes Review, Oct. 1, 2014, 30 pages.
IPR2014-00803 Decision, Institution of Inter Partes Review, Oct. 1, 2014, 30 pages.
IPR2014-00861 Patent Owner Preliminary Response, Sep. 12, 2014, 52 pages.
IPR2014-00917 Patent Owner Preliminary Response, Sep. 19, 2014, 61 pages.
IPR2014-00578 Decision, Institution of Inter Partes Review, Oct. 15, 2014, 27 pages.
IPR2014-00604 Decision, Institution of Inter Partes Review, Oct. 15, 2014, 29 pages.
IPR2014-00972 Decision, Institution of Inter Partes Review, Oct. 17, 2014, 7 pages.
IPR2014-00973 Decision, Institution of Inter Partes Review, Oct. 17, 2014, 7 pages.
IPR2014-00974 Decision, Institution of Inter Partes Review, Oct. 17, 2014, 7 pages.
IPR2014-00975 Decision, Institution of Inter Partes Review, Oct. 17, 2014, 8 pages.
IPR2014-00990 Decision, Institution of Inter Partes Review, Oct. 24, 2014, 9 pages.

(56) References Cited

OTHER PUBLICATIONS

IPR2014-00991 Decision, Institution of Inter Partes Review, Oct. 24, 2014, 9 pages.
IPR2014-00992 Decision, Institution of Inter Partes Review, Oct. 24, 2014, 10 pages.
IPR2014-01012 Decision, Institution of Inter Partes Review, Oct. 23, 2014, 8 pages.
IPR2014-01013 Decision, Institution of Inter Partes Review, Oct. 23, 2014, 10 pages.
IPR2014-01014 Decision, Institution of Inter Partes Review, Oct. 23, 2014, 7 pages.
IPR2014-01015 Decision, Institution of Inter Partes Review, Oct. 23, 2014, 7 pages.
IPR2014-00818 Decision, Institution of Inter Partes Review, Oct. 20, 2014, 24 pages.
IPR2014-00819 Decision, Institution of Inter Partes Review, Oct. 20, 2014, 23 pages.
IPR2014-00821 Decision, Institution of Inter Partes Review, Oct. 20, 2014, 33 pages.
IPR2014-00827 Decision, Institution of Inter Partes Review, Oct. 20, 2014, 20 pages.
IPR2014-00580 Decision, Institution of Inter Partes Review, Oct. 10, 2014, 47 pages.
IPR2014-00726 Decision, Institution of Inter Partes Review, Oct. 10, 2014, 40 pages.
IPR2014-00981 Decision, Institution of Inter Partes Review, Oct. 10, 2014, 10 pages.
IPR2014-00984 Decision, Institution of Inter Partes Review, Oct. 10, 2014, 08 pages.
IPR2014-00985 Decision, Institution of Inter Partes Review, Oct. 10, 2014, 10 pages.
IPR2014-00986 Decision, Institution of Inter Partes Review, Oct. 10, 2014, 08 pages.
IPR2014-00988 Decision, Institution of Inter Partes Review, Oct. 10, 2014, 07 pages.
IPR2014-01000 Patent Owner's Preliminary Response, Oct. 7, 2014, 59 pages.
IPR2014-01003 Patent Owner's Preliminary Response, Oct. 7, 2014, 54 pages.
IPR2014-01004 Patent Owner's Preliminary Response, Oct. 7, 2014, 58 pages.
IPR2014-00800 Decision, Institution of Inter Partes Review, Oct. 6, 2014, 24 pages.
IPR2014-00802 Decision, Institution of Inter Partes Review, Oct. 6, 2014, 27 pages.
IPR2014-00805 Decision, Institution of Inter Partes Review, Oct. 6, 2014, 27 pages.
IPR2014-00807 Decision, Institution of Inter Partes Review, Oct. 14, 2014, 25 pages.
IPR2014-00808 Decision, Institution of Inter Partes Review, Oct. 14, 2014, 32 pages.
IPR2014-01479 Patent Owner Preliminary Response, Oct. 8, 2014, 63 pages.
IPR2014-01481 Patent Owner Preliminary Response, Oct. 8, 2014, 63 pages.
IPR2014-01482 Patent Owner Preliminary Response, Oct. 10, 2014, 62 pages.
IPR2014-01494 Patent Owner Preliminary Response, Oct. 10, 2014, 62 pages.

* cited by examiner

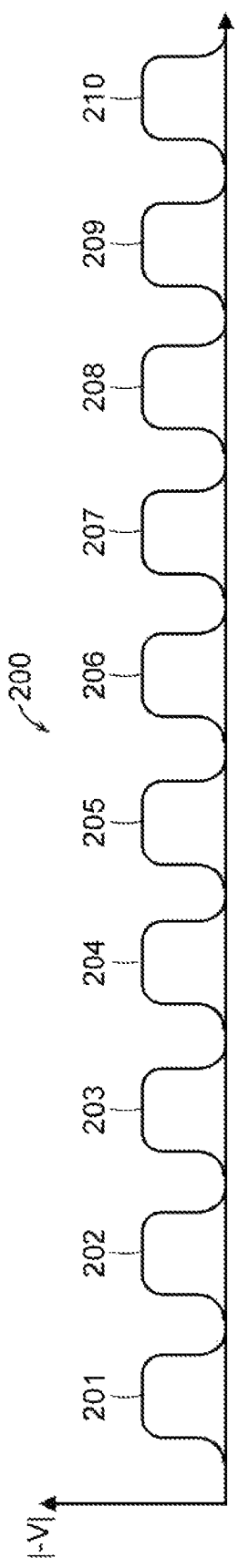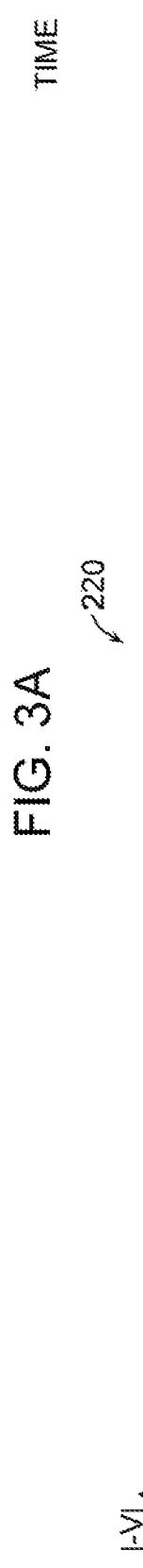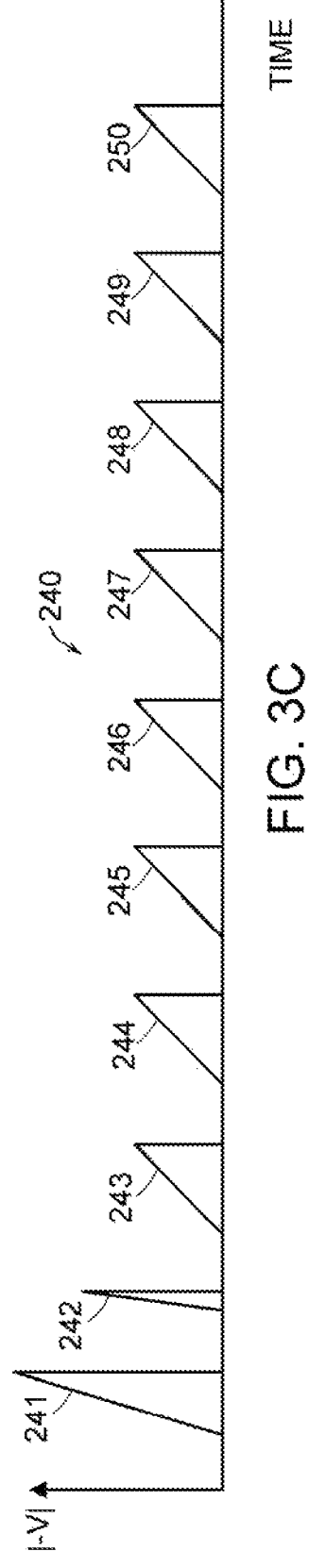

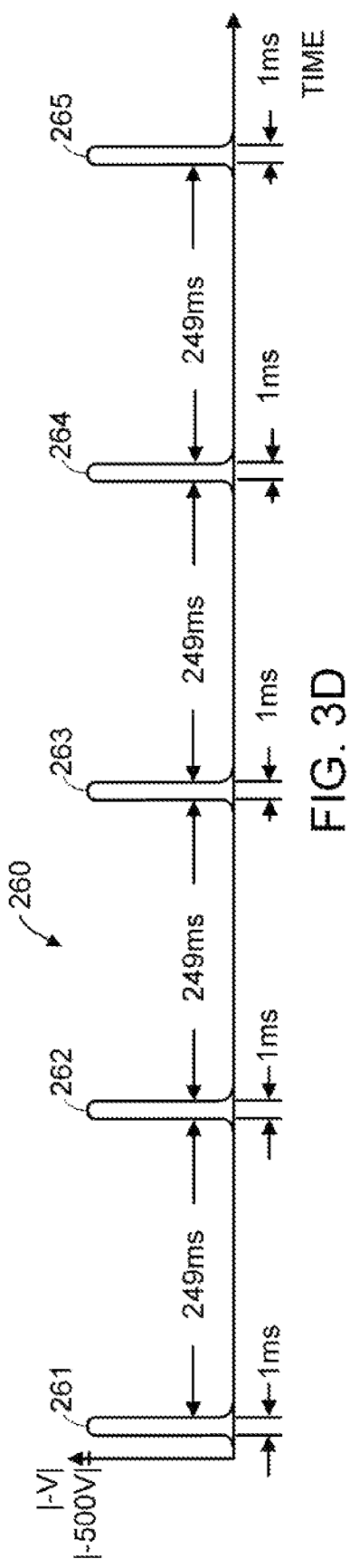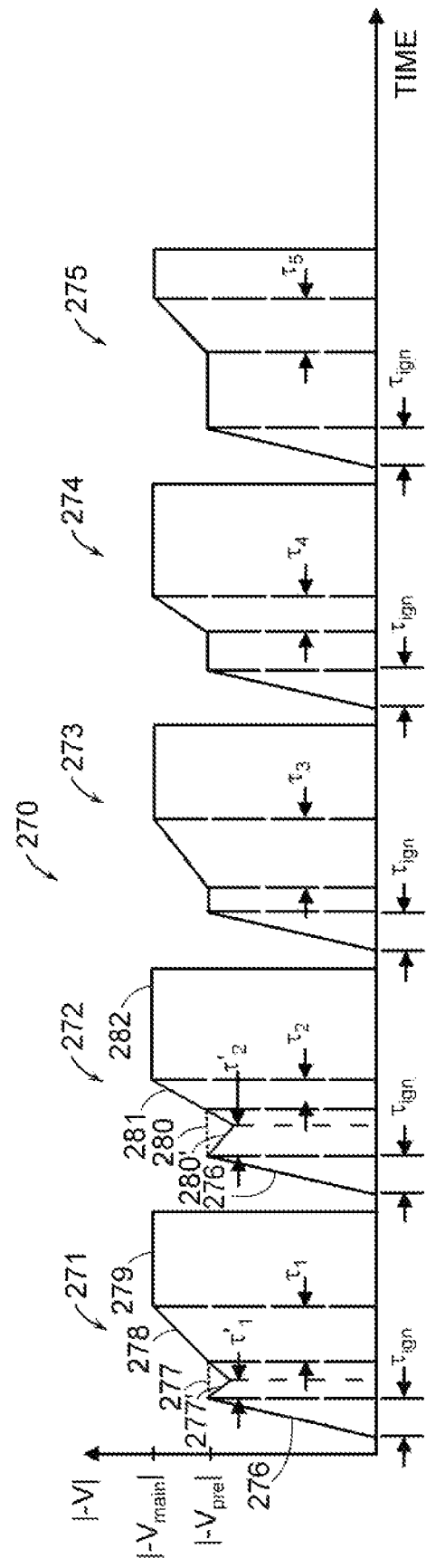

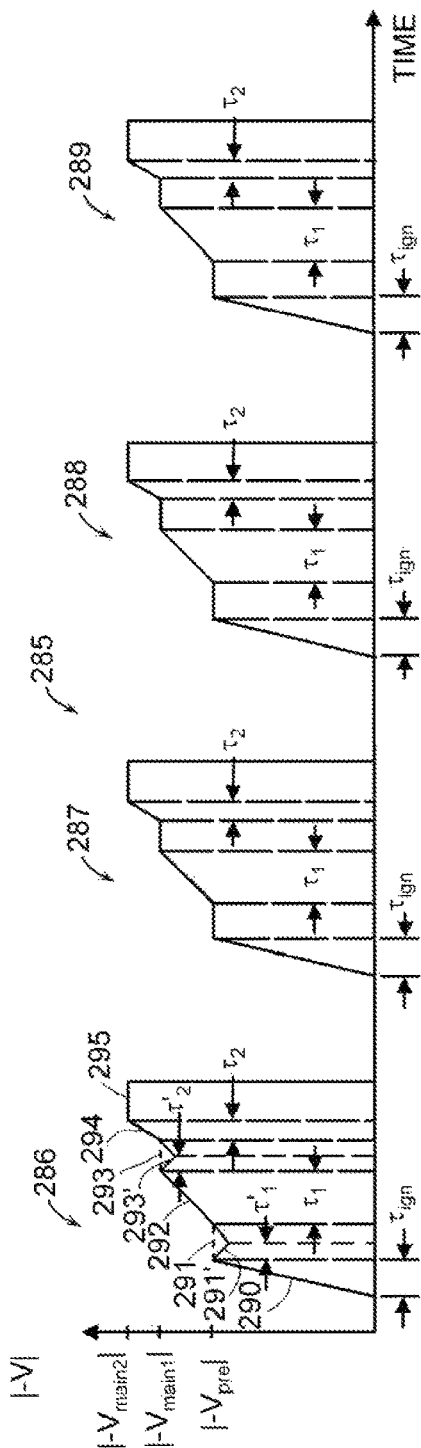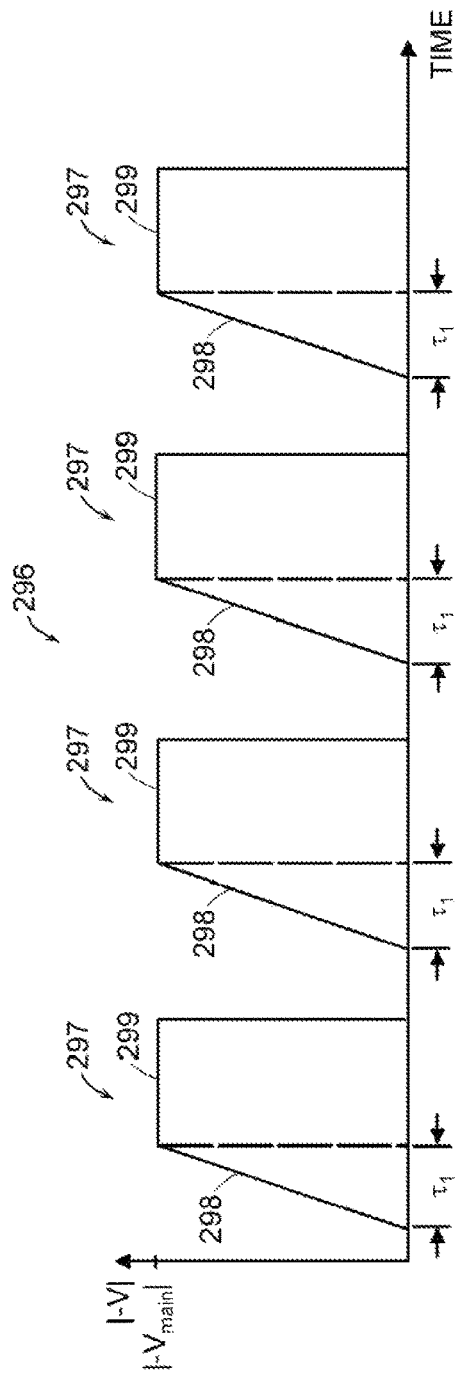

| CATHODE SEGMENT | PULSE SEQUENCE | PULSE WIDTH (µsec) | RISE TIME | APPLIED POWER (kW) |
|---|---|---|---|---|
| 102a | 4, 7 | 1000 | 1V / µsec | 80 |
| 102b | 3, 6 | 1200 | 0.5V / µsec | 60 |
| 102c | 2, 9, 10 | 2000 | 2.0V / µsec | 120 |
| 102d | 1, 5, 8, | 2000 | 2.0V / µsec | 120 |
| • | • | • | • | • |
| • | • | • | • | • |
| • | • | • | • | • |
| 102n | • | • | • | • |

380
382  384  388  390  392

METHOD OF IONIZED PHYSICAL VAPOR DESPOSITION SPUTTER COATING HIGH ASPECT-RATIO STRUCTURES

CROSS REFERENCE TO RELATED APPLICATIONS

This patent application claims priority to U.S. Provisional Patent Application Ser. No. 60/481,671, filed on Nov. 19, 2003, U.S. patent application Ser. No. 10/710,946, filed Aug. 13, 2004, and U.S. Provisional Patent Application Ser. No. 60/744,905, filed Apr. 14, 2006, the entire disclosure of these patent applications are incorporated herein by reference.

BACKGROUND OF INVENTION

Physical Vapor Deposition (PVD) is a plasma process that is commonly used in the manufacturing of many products, such as semiconductors, flat panel displays, and optical devices. Physical vapor deposition causes ions in a plasma to dislodge or sputter material from a target. The dislodged or sputtered target material is then deposited on a surface of a workpiece to form a thin film.

Independently controlling the uniformity of the sputtered film and the density of the plasma generated during PVD becomes more difficult as the size of the workpiece increases. In magnetron sputtering, large targets are typically required to sputter coat large workpieces. However, processing large workpieces can result in problems, such as poor target utilization, target cooling problems, and non-uniform coating of the workpieces.

Complex rotating magnet configurations have been used to improve plasma uniformity and to prevent non-uniform erosion of the target. In some systems, workpieces are moved relative to the plasma in order to increase the uniformity of the sputtered film. However, moving the magnets and/or the workpieces can result in a lower deposition rate. In other systems, the power applied to the target is increased to increase the deposition rate. However, increasing the power applied to the target can result in undesirable target heating. Compensating for temperature increases associated with increasing the power applied to the target by cooling the target in the deposition system increases the cost and complexity of the deposition system.

BRIEF DESCRIPTION OF DRAWINGS

The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

FIG. 3A through FIG. 3I are graphical representations of voltage pulse trains that can be used to energize the plasma source of FIG. 1.

DETAILED DESCRIPTION

The present invention relates to plasma systems having multiple or segmented magnetron cathodes instead of one single magnetron cathode. A plasma generated by a plasma system having a segmented magnetron cathode design according to the present invention creates a more uniform coating on a substrate at given level of plasma density than a plasma that is generated by a known plasma system having a single magnetron cathode geometry. The uniformity of a thin film generated with a plasma system having multiple magnetron cathode segments is relatively high because each of the multiple magnetron cathode segments can independently control a film thickness in a small localized area of the workpiece in order to generate a more uniform coating on the entire workpiece. Increasing the number of magnetron cathode segments increases the control over the coating thickness. The sputtered material generated by the segmented magnetron cathode can also be directed to different locations in the chamber depending on the geometry of the segmented magnetron cathode.

Figure 1:
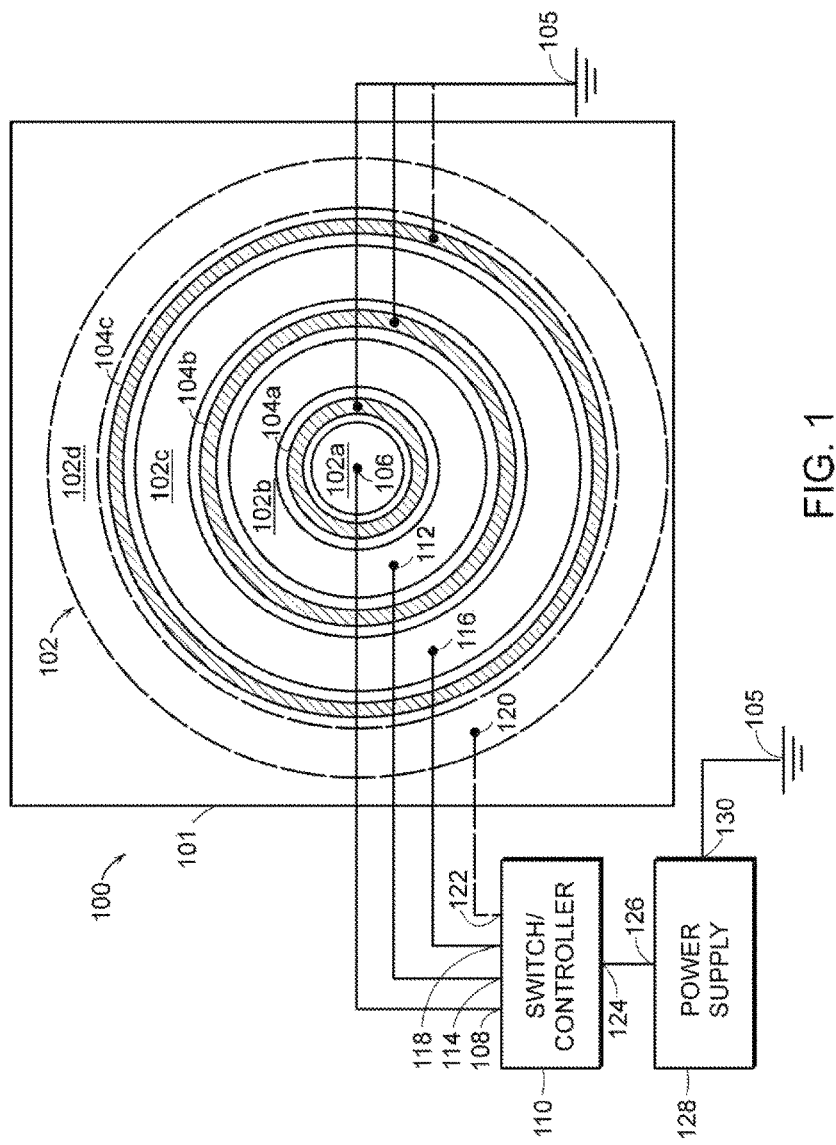
FIG. 1 illustrates a diagram of a plasma source including a segmented magnetron cathode according to one embodiment of the invention.

FIG. 1 illustrates a diagram of a plasma source 100 including a segmented magnetron cathode 102 according to one embodiment of the invention. The segmented magnetron cathode 102 is located within a chamber 101 that confines a feed gas. The segmented magnetron cathode 102 includes a plurality of magnetron cathode segments. In some embodiments, the magnetron cathode segments are separate magnetrons. The segmented magnetron cathode 102 according to the present invention can be embodied as many different geometries. For example, the segmented magnetron cathode 102 of the present invention can include magnetron cathode segments that all have equal surface area. Alternatively, the segmented magnetron cathode of the present invention can include magnetron cathode segments that have different surface areas. The magnetic field associated with the segmented magnetron cathode can have any geometry and any strength depending upon the particular application. In addition, the segmented magnetron cathode can include a water cooling system (not shown) to control the temperature of the sputtering target.

The segmented magnetron cathode 102 includes a first 102a, a second 102b, and a third 102c magnetron cathode segment. The segmented magnetron cathode 102 can also include a fourth magnetron cathode segment 102d. Additional magnetron cathode segments can be added as necessary depending on the specific plasma process, the size of the workpiece to be processed, and/or the desired uniformity of the coating. The magnetron cathode segments 102a-d are typically electrically isolated from each other. In one embodiment, the segmented magnetron cathode 102 includes target material for sputtering. The target material can be integrated into or fixed onto each magnetron cathode segment 102a-d.

The plasma source 100 also includes at least one anode that is positioned proximate to the plurality of magnetron cathode segments 102a, 102b, and 102c in the chamber 101. In one embodiment, the plasma source 100 includes a plurality of anode sections 104a, 104b. The plurality of anode sections 104a, 104b are positioned adjacent to the magnetron cathode segments 102a, 102b, and 102c. An additional anode section 104c is positioned adjacent to the optional fourth magnetron cathode segment 102d. In one embodiment, the anode sections 104a, 104b, and 104c are coupled to ground 105. In other embodiments, the anode sections 104a, 104b, 104c are coupled to a positive terminal of a power supply. Additional anodes and magnetron cathode segments can be added to form a larger plasma source for processing large workpieces, such as 300 mm wafers, architectural workpieces, and flat panel displays.

An input 106 of the first magnetron cathode segment 102a is coupled to a first output 108 of a switch 110. An input 112 of the second magnetron cathode segment 102b is coupled to a second output 114 of the switch 110. An input 116 of the third magnetron cathode segment 102c is coupled to a third output 118 of the switch 110. An input 120 of the optional fourth magnetron cathode segment 102d is coupled to a fourth output 122 of the switch 110. The switch 110 can be any type of electrical or mechanical switch that has the required response time, voltage capacity, and current capacity. In one embodiment, the switch 110 is programmable via a computer or processor. The switch 110 can include one or more insulated gate bipolar transistors (IGBTs). In some embodiments (not shown), at least one output 108, 114, 118, 122 of the switch 110 can be coupled to more than one magnetron cathode segment 102a-d in the segmented magnetron cathode 102. The switch 110 can be configured to apply one or more voltage pulses to each of the magnetron cathode segments 102a-d in a predetermined sequence. This allows a single pulsed DC power supply to apply independent voltage pulses to each magnetron cathode segment 102a-d.

An input 124 of the switch 110 is coupled to a first output 126 of a power supply 128. A second output 130 of the power supply 128 is coupled to ground 105. The power supply 128 can be a pulsed power supply, a switched DC power supply, an alternating current (AC) power supply, or a radio-frequency (RF) power supply. In one embodiment, the power supply 128 generates a train of voltage pulses that are routed by the switch 110 to the magnetron cathode segments 102a-d. The switch 110 can include a controller that controls the sequence of the individual voltage pulses in the train of voltage pulses that are routed to the magnetron cathode segments 102a-d. Alternatively, an external controller (not shown) can be coupled between the power supply 128 and the switch 110 to control the sequence of the voltage pulses in the train of voltage pulses that are routed to the magnetron cathode segments 102a-d. In some embodiments, the controller is a processor or a computer.

In one embodiment, the plasma source 100 is scalable to process large workpieces. In this embodiment, the power supply 128 is a single high-power pulsed direct current (DC) power supply. The single high-power pulsed DC power supply generates a high-density plasma with a power level between about 5 kW and 1,000 kW during each pulse. In one embodiment, the single pulsed DC power supply generates a high-density plasma with a power level that is between about 50 kW and 1,000 kW during each pulse depending on the surface area of each magnetron cathode segment 102a-d of the segmented magnetron cathode 102. The power level is chosen based on the surface area of the particular magnetron cathode segment 102a-d to achieve a specific result. Thus, a power supply that generates a moderate amount of power during the pulse can be used in a plasma source 100 according to the present invention to generate the high-density plasma.

A power supply that generates a moderate amount of power during the pulse can be used in the plasma source 100 to generate a high-density plasma. A pulsed power supply having an extremely high-power output would be required in some systems in order to generate a comparable power density on a single magnetron cathode. However, the duty cycle of the pulsed power supply used in the plasma source 100 is typically higher than the duty cycle for a power supply used for a single magnetron cathode in order to maintain the same average power.

The magnetron size of the segmented magnetron of the present invention can be scaled up while maintaining the same power density as a small magnetron. This is achieved by segmenting the magnetron into a plurality of magnetron segments. The duty cycle of the pulsed power supply is increased in order to apply the same average power. This approach allows the segmented magnetron cathode 102 to operate with a moderate power level and a moderate current level. The segmented magnetron cathode 102 can use the same pulsed power supply 128 for a small or a large area magnetron in order to generate the same plasma density during the pulse, although the duty cycle is changed in order to maintain the same average power.

For example, if the magnetron has an area S1, and the power applied during the pulse is P1, then the power density can be expressed as P1/S. Assuming that the power supply has duty cycle of about ten percent, then the average power that is applied to the magnetron is about 0.1P1. If another magnetron has an area 4S1, then in order to keep the same power density and average power, the power supply applies a power of 4P1 during the pulse at the same duty cycle. In the case of a segmented magnetron cathode that consists of four magnetron cathode segments each with area S1, the same power P1 can be applied to each of the four magnetron segments. In order to apply the same average power to the segmented magnetron, the duty cycle of the power supply is increased from ten percent to forty percent. In this case, the switch can route pulses to the different magnetron segments to provide the same power density and average power. The size of the magnetron can be increased until the duty cycle of the power supply reaches almost one hundred percent. At that point, the power level during the pulse is increased and a compromise is made between modifying the pulse power level and the duty cycle.

The number of magnetron cathode segments 102a-d, the duty cycle, and the maximum power of the pulsed power supply 128 can be chosen for a particular application. For example, a smaller number of magnetron cathode segments 102a-d in the segmented magnetron cathode 102 can require a high-power pulsed power supply having a low duty cycle while a larger number of magnetron cathode segments 102a-d can require a lower-power pulsed power supply having a higher duty cycle in order to generate a similar power density and average power.

In one embodiment, the pulse width of the voltage pulses generated by the power supply 128 is between about 50 microseconds and 10 seconds. The duty cycle of the voltage pulses generated by the power supply 128 can be anywhere between a few percent and ninety-nine percent. In one embodiment, the duty cycle is about twenty percent. The duty cycle of the power supply 128 depends on the number of magnetron cathode segments 102a-d in the segmented magnetron cathode 102 and the time required for the switch 110 to operate. The repetition rate of the voltage pulses generated by the power supply 128 can be between about 4 Hz and 1000 Hz. In one embodiment, the repetition rate of the voltage pulses is at about 200 Hz. Thus, for a pulse width of 1,000 μsec, the time period between pulses for a repetition rate of 200 Hz is approximately 4,020 μsec. The switch 110 redirects the voltage pulses to the various magnetron cathode segments 102a-d during the time period between pulses.

The average power generated by the power supply 128 is between about 5 kW and 100 kW. However, the peak power generated by the power supply can be much greater. For example, the peak power is about 330 kW for a plasma having a discharge current of 600 A that is generated with voltage pulses having a magnitude of 550V. The power supply 128 generates an average power of about 20 kW for voltage pulses having a pulse width of 1,000 μsec and a repetition rate of 200 Hz.

The power supply 128 can vary the rise time of the voltage pulse, the magnitude, the pulse duration, the fall time, the frequency, and the pulse shape of the voltage pulses depending on the desired parameters of the plasma. The term "pulse shape" is defined herein to mean the actual shape of the pulse, which can be a complex shape that includes multiple rise times, fall times, and peaks. A pulse train generated by the power supply 128 can include voltage pulses with different voltage levels and/or different pulse widths. The switch 110 can route one or more of the voltage pulses to each of the magnetron cathode segments 102a-d in a predetermined sequence depending on several factors, such as the size of the segmented magnetron cathode 102, the number of magnetron cathode segments 102a-d, and the desired uniformity of the coating and density of the plasma. Each individual voltage pulse in the train of voltage pulses can have a different shape including different pulse widths, number of rise times and/or different amplitudes. The particular rise times and/or amplitudes of the voltage pulses can be selected to achieve a desired result, such as a desired sputtered metal ion density and/or a desired uniformity of a coating.

The segmented magnetron cathode 102 reduces cathode heating because voltage pulses are independently applied to each of the magnetron cathode segments 102a-d. Thus, when a voltage pulse is applied to one of the magnetron cathode segments 102a-d, the heat previously generated on the other magnetron cathode segments 102a-d dissipates. Therefore, the segmented magnetron cathode 102 can operate with relatively high peak plasma densities by permitting higher voltage pulses to be applied to each of the magnetron cathode segments 102a-d. Thus, the segmented magnetron cathode 102 can operate with relatively high overall power applied to the plasma without overheating the individual magnetron cathode segments 102a-d. In some embodiments, the uniformity of the thin film deposited by the segmented magnetron cathode can be optimized by adjusting the shape, frequency, duration, and sequence of the voltage pulses for the various magnetron cathode segments.

Figure 2A:
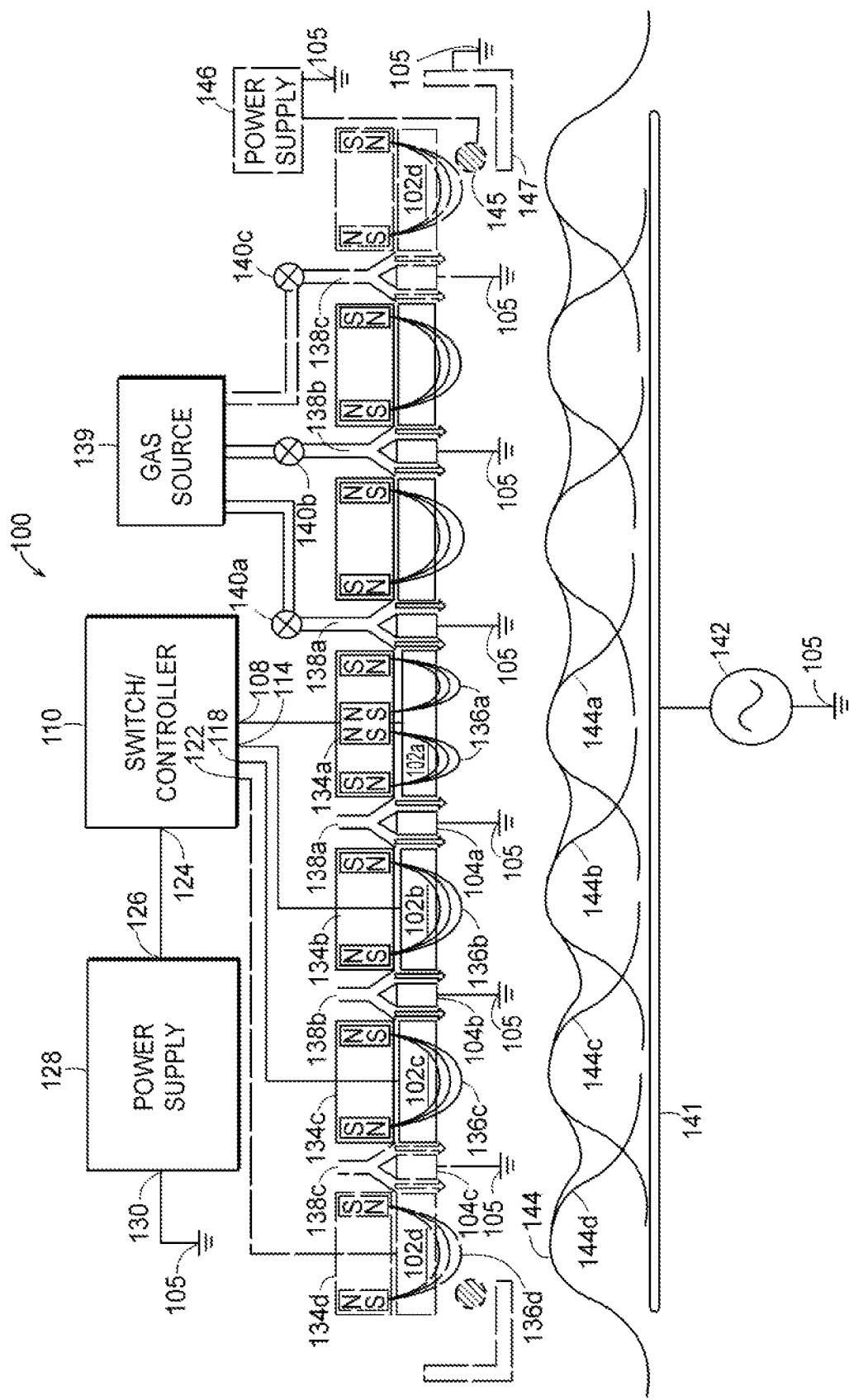
FIG. 2A illustrates a cross-sectional view of the plasma source including the segmented magnetron cathode of FIG. 1.

FIG. 2A illustrates a cross-sectional view of the plasma source 100 including the segmented magnetron cathode 102 of FIG. 1. The plasma source 100 includes at least one magnet assembly 134a positioned adjacent to the first magnetron cathode segment 102a. Additional magnet assemblies 134b, 134c, 134d are positioned adjacent to the other respective magnetron cathode segments 102b, 102c, 102d. The magnet assembly 134a creates a magnetic field 136a proximate to the first magnetron cathode segment 102a. The magnetic field 136a traps electrons in the plasma proximate to the first magnetron cathode segment 102a. Additional magnetic fields 136b, 136c, and 136d trap electrons in the plasma proximate to the their respective magnetron cathode segments 102b-d. The strength of each magnetic field 136a-d generated by each magnet assembly 134a-d can vary depending on the desired properties of the coating, such as the desired coating uniformity.

One or more of the magnetic assemblies 134a-d can generate unbalanced magnetic fields. The term "unbalanced magnetic field" is defined herein as a magnetic field that includes non-terminating magnetic field lines. For example, unbalanced magnetic fields can be generated by magnets having different pole strengths. Unbalanced magnetic fields can increase the ionization rate of atoms sputtered from the segmented magnetron cathode 102 in an ionized physical vapor deposition (I-PVD) process. The unbalanced magnetic field can also increase the ion density of the ionized sputtered atoms. In one embodiment, the sputtered atoms are metal atoms and the unbalanced magnetic field increases the ionization rate of the sputtered metal atoms to create a high density of metal ions.

A first 138a, a second 138b, and a third plurality of feed gas injectors 138c can be positioned to inject feed gas between the corresponding cathode segments 102a-d and anode sections 104a-c. Each of the plurality of feed gas injectors 138a-c can be positioned to inject feed gas so that a desired uniformly is achieved around the circumference of each respective magnetron cathode segment 102a-d.

The pluralities of feed gas injectors 138a-c are coupled to one or more gas sources 139 through gas valves 140a-c. The gas source 139 can include non-reactive gases, reactive gases, or a mixture of non-reactive and reactive gases. The gas valves 140a-c can precisely meter feed gas to each of the pluralities of feed gas injectors 138a-c in a controlled sequence. In one embodiment, the gas valves 140a-c can pulse feed gas to the each of the pluralities of feed gas injectors 138a-c. In one embodiment, an excited atom source (not shown) supplies excited atoms through the feed gas injectors 138a-c.

A substrate 141 or workpiece is positioned adjacent to the segmented magnetron cathode 102. The potential of the substrate 141 can be at a floating potential, can be biased to a predetermined DC or RF potential, or can be coupled to ground. In one embodiment, the substrate 141 is coupled to a DC or a radio-frequency (RF) power supply 142. In one embodiment, the substrate 141 is positioned on a platen or holder (also shown as 141) that provides a linear movement relative to the magnetron. A linear motion in the range of 0.1 cm/sec and 100 cm/sec can be used to improve uniformity. Also, in one embodiment, the substrate 141 is positioned on a platen or holder that is rotated around an axis near the center of the magnetron. Rotating the substrate 141 can also improve the film uniformity. In one embodiment, the platen or substrate 141 is rotated with speed that is in the range of 0.001 revolution per second to 100 revolutions per second. In one embodiment, the substrate 141 is positioned on a platen or holder that provides both rotation and a linear motion.

The plasma source 100 can be used to sputter deposit a coating on the substrate 141. In this embodiment, each of the magnetron cathode segments 102a-d includes target material. The power supply 128 generates the train of voltage pulses and the switch 110 routes the individual voltage pulses in the train of voltage pulses to the various magnetron cathode segments 102a-d in a predetermined sequence. The target material from each of the magnetron cathode segments 102a-d sputter coats the substrate 141 to generate coatings that are represented by thickness profiles 144a-d that correspond to the thickness of the coating material that is deposited by each of the cathode segments 102a-d.

In some embodiments, a plurality of plasma sources is used that include at least two magnetrons. The at least two magnetrons can include cathodes with different target materials. For example, one magnetron can include Ti target material and the other magnetron can include W target material. Each plasma source can include a separate power supply 128 that generates a unique voltage pulse train. The duration of each voltage pulse train and particular voltage pulse shape in the trains can be optimized in order to sputter combinations of different films, such as combinations of TiN and WN.

In one embodiment, an optional ring-shaped pre-ionizing electrode 145 is positioned proximate to the segmented magnetron cathode 102. The pre-ionizing electrode 145 is coupled to an output of a power supply 146. Another output of the power supply 146 is coupled to ground 105. For example, the power supply 146 can be a RF power supply, a DC power supply, a pulsed power supply, or an AC power supply. A grounded electrode 147 is positioned proximate to the pre-ionizing electrode 145 so that the power supply 146 can generate a plasma discharge between the grounded electrode 147 and the pre-ionizing electrode 145.

The discharge can ignite a feed gas to create a weakly-ionized plasma proximate to the segmented magnetron cathode 102. The discharge can also create an additional amount of electrons inside the chamber without igniting the discharge such as by emitting electrons under high temperature due to electrical current flowing through pre-ionizing electrode. The additional electrons can reduce the ignition voltage from the pulsed power supply that is required to create a weakly-ionized plasma. The properties of the discharge depend on the design of the magnetic field and the position of the pre-ionizing electrode. Generating a weakly-ionized plasma using a pre-ionizing electrode is described in co-pending U.S. patent application Ser. No. 10/065,629, entitled Methods and Apparatus for Generating High-Density Plasma, which is assigned to the present assignee. The entire disclosure of U.S. patent application Ser. No. 10/065,629 is incorporated herein by reference.

The rise time, the amplitude, the pulse duration, the fall time, and the pulse shape of each voltage pulse in the train of voltage pulses generated by the power supply 128 as well as the sequence with which the voltage pulses are routed by the switch 110 can be adjusted to improve the homogeneity of the thickness profiles 144a-d, thereby improving the coating uniformity 144 across the substrate 141. Also, selecting the parameters of the voltage pulses can increase the amount of sputtered material arriving on the substrate in the form of ions. The amount of sputtered material arriving on the substrate can be adjusted independently from an adjustment of the coating uniformity. In one embodiment, modifying the rise time of the voltage pulse can be used to adjust the amount of sputtered metal ions and modifying the pulse duration can be used to control the film uniformity. A highly uniform coating generated by ions of sputtered material can substantially fill high-aspect ratio contacts, trenches, and vias, for example. Therefore, the plasma source 100 can be used for ionized physical vapor deposition (I-PVD). Also, since the deposition rate and the plasma density from each magnetron cathode segment 102a-d can be adjusted independently, a coating can be uniformly deposited across the entire surface of the substrate 141. In one embodiment, the segmented magnetron cathode 102 including the target material is about the same size as the substrate 141. Reducing the size of the magnetron cathode reduces the overall size of the plasma source 100 and the overall cost of the system.

The switch 110 can also route the voltage pulses to the various magnetron cathode segments 102a-d to create particular thickness profiles across the surface of the substrate 141. For example, a particular thickness profile can include a film that is thinner in the center of the substrate 141 than on the outer edge of the substrate 141.

The plasma source 100 can also be used to uniformly etch the substrate 141. The plasma generated by the segmented magnetron cathode 102 can be highly uniform across the surface of the substrate 141. The plasma source 100 can also be used for ionized physical vapor deposition (I-PVD), reactive sputtering, compound sputtering, reactive ion etch (RIE), ion beam processing, or any other plasma process.

The plasma source 100 can be used to generate a high-density plasma for I-PVD processing. For example, the plasma source 100 can be used to generate a high-density plasma for I-PVD of copper ions in order to efficiently sputter coat high-aspect ratio structures on the substrate 141 with or without using a RF bias on the substrate 141. The high-density plasma generated by the segmented magnetron cathode 102 sputters copper atoms from a copper target. The copper atoms collide with electrons in the high-density plasma creating a multitude of copper ions.

The plasma generates a so-called "dark space" between the edge of the plasma and the surface of an electrically floating substrate 141. The high-density plasma generated by the segmented magnetron cathode 102 has a high electron temperature which creates a negative bias on the substrate 104. The negative bias attracts the copper ions and accelerates the copper ions through the dark space towards the substrate 141. An electric field develops between the positively charged plasma and the negatively charged substrate 141. The copper ions are accelerated along electric field lines and uniformly sputter coat the high-aspect-ratio structures on the substrate 141. A RF bias can be applied to the substrate 141 to further improve the uniformity of the coating process or to sputter coat high-aspect-ratio features.

Figure 2B:
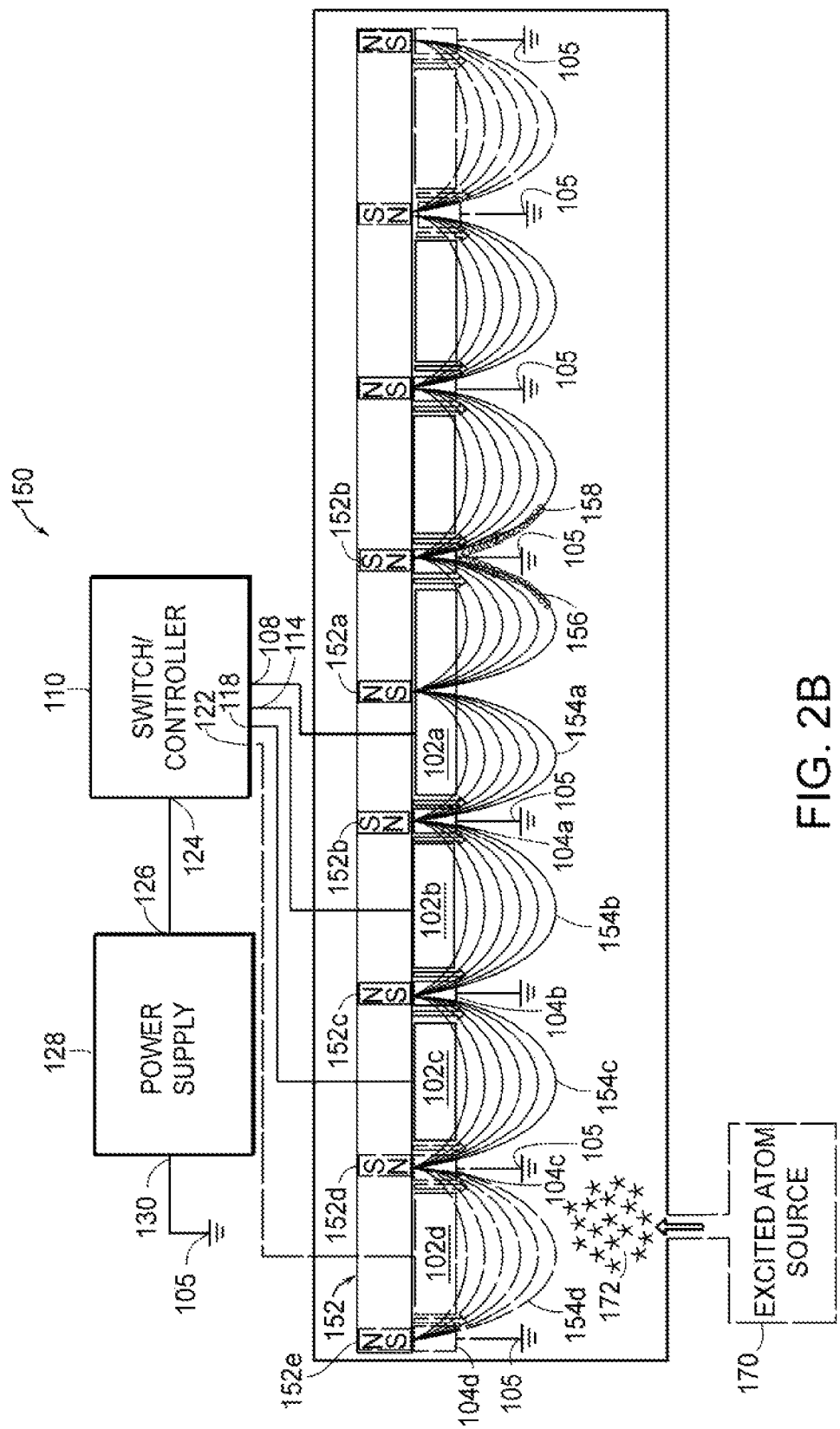
FIG. 2B illustrates a cross-sectional view of a plasma source including the segmented magnetron cathode of FIG. 1 having an alternative magnet assembly.

FIG. 2B illustrates a cross-sectional view of a plasma source 150 including the segmented magnetron cathode 102 of FIG. 1 having an alternative magnet assembly 152. The magnet assembly 152 includes at least one magnet 152a that is positioned adjacent to the first magnetron cathode segment 102a. Additional magnets 152b-e are positioned adjacent to each respective anode section 104a-d. In one embodiment, the magnets 152a-e have magnetic field strengths that result in an unbalanced magnetic field. Generating an unbalanced magnetic field can increase the density of the plasma proximate to a substrate (not shown in FIG. 2B) and thus increase the rate of ionization of metal atoms and the density of metal ions in an I-PVD process.

The magnet 152a creates a magnetic field 154a proximate to the first magnetron cathode segment 102a. The magnetic field 154a traps electrons in the plasma proximate to the first magnetron cathode segment 102a. Additional magnetic fields 154b-d trap electrons in the plasma proximate to the other respective magnetron cathode segments 102b-d. The strength of each magnetic field 154a-d generated by each magnet 152a-d can vary depending on the desired properties of the coating, such as the desired coating uniformity at the desired plasma density level.

The first output 126 of the power supply 128 is coupled to the input 124 of the switch 110. The first output 108 of the switch 110 is coupled to the first magnetron cathode segment 102a. The second output 114 of the switch 110 is coupled to the second magnetron cathode segment 102b. The third output 118 of the switch 110 is coupled to the third magnetron cathode segment 102c. The fourth output 122 of the switch 110 is coupled to the fourth magnetron cathode segment 102d.

The second output 130 of the power supply 128 and the anode sections 104a-d are coupled to ground 105. In other embodiments, the second output 130 of the power supply 128 is coupled to the anodes 104a-d and the anodes 104a-d are biased at a positive voltage.

Magnetic coupling of the magnetron cathode segments 102a-d is achieved by positioning the magnets 152a-e between the magnetron cathode segments 102a-d. The magnetic coupling can expand the plasma across the surface of the segmented magnetron cathode 102 as described below. The power supply 128 generates a train of voltage pulses at the first output 126. The switch 110 directs the individual voltage pulses to the various magnetron cathode segments 102a-d in a predetermined sequence. One of the voltage pulses is applied to the first magnetron cathode segment 102a in order to ignite a plasma proximate to the first magnetron cathode segment 102a. In other embodiments, the voltage pulse can be applied to one of the other magnetron cathode segments 102b-d in order to ignite the plasma proximate to that magnetron cathode segment 102b-d.

Electrons 156 in the plasma are trapped by the magnetic field 154a. The trapped electrons 156 migrate toward the poles of the magnets 152a and 152b along magnetic field lines. Some of the electrons 156 that migrate towards the magnet 152b are reflected into the magnetic field 154b proximate to the second magnetron cathode segment 102b. The migrating reflected electrons 158 expand the plasma proximate to the second magnetron cathode segment 102b. As the plasma develops proximate to the other magnetron cathode segments 102b-d, the electrons in the plasma migrate along magnetic field lines of the various magnetic fields 154b-d. The electron migration that is caused by the magnetic coupling assists in creating additional plasma coupling across the surface of the segmented magnetron cathode 102. This can reduce the voltage level required to ignite a weakly-ionized plasma for a particular magnetron cathode segment 102a-d.

In one embodiment, an excited atom source 170, such as a metastable atom source is positioned to supply excited atoms 172 including metastable atoms proximate to the segmented magnetron cathode 102. The excited atoms 172 generated by the excited atom source 170 can increase the number of sputtered metal ions as well as the number of non-metal ions in the plasma and improve the uniformity of a coating generated by the plasma. For example, the energy of a metastable Argon atom (Ar*) is about 11 eV and the ionization energy for a copper atom (Cu) is about 7.7 eV. In a reaction described by Ar*+Cu=Ar+Cu++e, Cu ions are created that can increase the density and improve the uniformity of the Cu ions that are distributed near the substrate. The excited atoms 172 can also improve the process of igniting the plasma and can increase the density of the plasma. Generating a plasma using excited atoms, such as metastable atoms, is described in co-pending U.S. patent application Ser. No. 10/249,844, entitled High-Density Plasma Source Using Excited Atoms, which is assigned to the present assignee. The entire disclosure of U.S. patent application Ser. No. 10/249,844 is incorporated herein by reference.

Figure 2C:
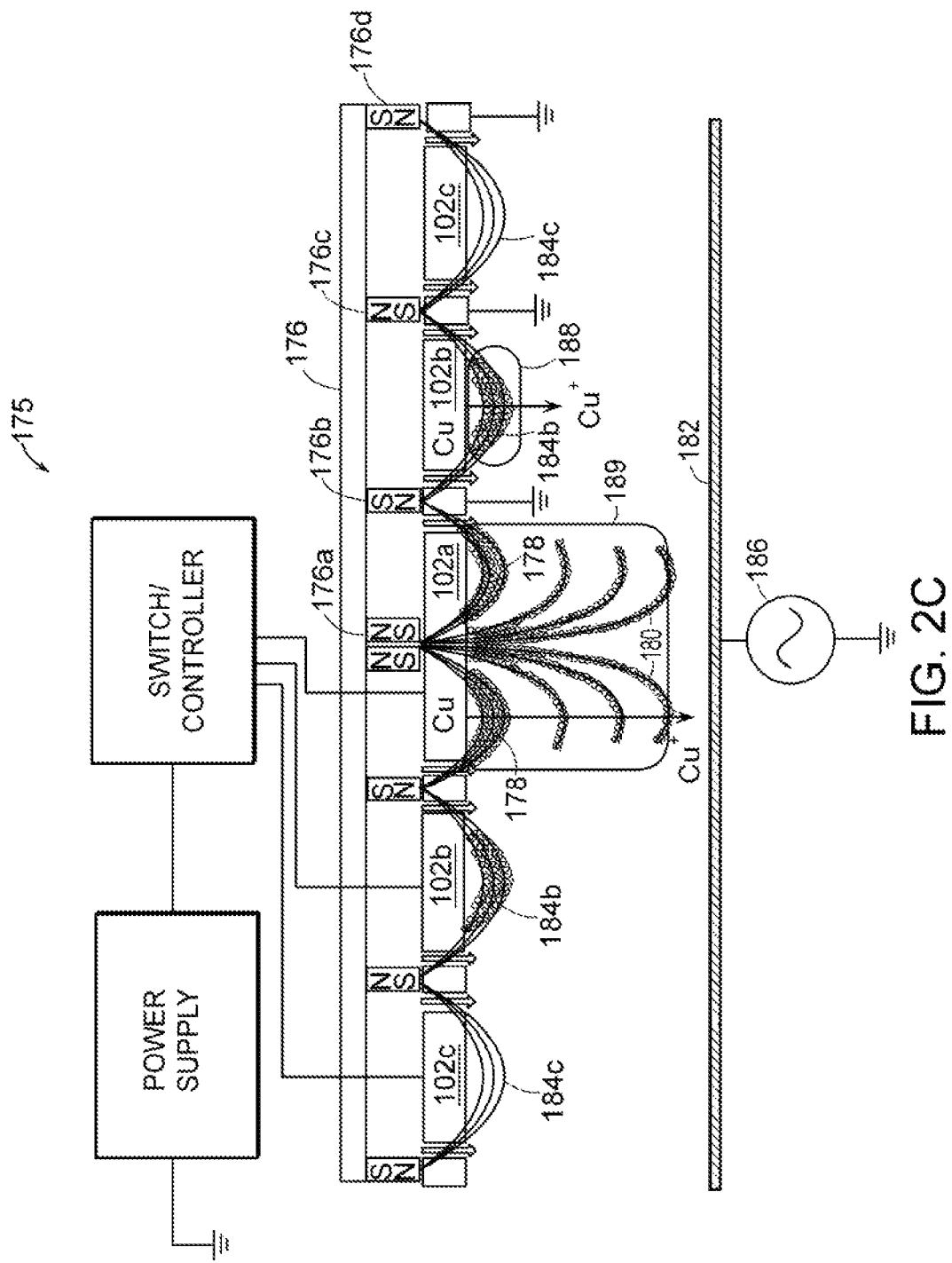
FIG. 2C illustrates a cross-sectional view of a plasma source including the segmented magnetron cathode of FIG. 1 with a magnet assembly having an unbalanced magnet configuration.

FIG. 2C illustrates a cross-sectional view of a plasma source 175 that includes the segmented magnetron cathode 102 of FIG. 1 with a magnet assembly 176 having an unbalanced magnet configuration that generates an unbalanced magnetic field. In this embodiment, the magnet 176a has a pole strength that is different than another cooperating magnet 176b. In this example, the pole strength of the magnet 176a is greater than the pole strength of the magnet 176b. In an unbalanced magnetron, the magnets 176a, 176b of the magnet assembly 176 create some closed magnetic field lines 178 that form an electron trap that confines the plasma proximate to the surface of the magnetron cathode section 102a. In addition, the magnets 176a, 176b of the magnet assembly 176 also create magnetic field lines 180 that project away from the magnetron cathode section 102a. The magnetic field lines 180 are referred to as open field lines and can extend away from the magnetron cathode section 102a and proximate to the substrate 182 to be coated. Other magnets 176b-d can generate balanced magnetic fields 184b-c or unbalanced magnetic fields (not shown) proximate to the other magnetron cathode segments 102b-c.

An unbalanced segmented magnetron according to the invention can increase the density of the plasma proximate to the substrate 182 to be coated. The increase in the density of the plasma is caused by electrons that are accelerated along the open magnetic field lines 180 towards the substrate 182. The electrons ionize atoms in the vicinity of the substrate 182. Additionally, some electrons that are accelerated along the open magnetic field lines 180 can charge the substrate 182 and create a bias on the substrate 182. In one embodiment, a power supply 186 negatively biases the substrate 182 which accelerates ions in the plasma towards the substrate 182.

The unbalanced segmented magnetron 175 can increase the ionization rate and the density of metal ions in an ionized physical vapor deposition (I-PVD) process. In one embodiment, the segmented magnetron cathode 102 includes copper target material. The copper target material is sputtered by ions in the plasma that bombard the segmented magnetron cathode 102. Copper atoms moving towards the substrate 182 can interact with the plasma that is located near the surface of the segmented magnetron cathode 102. Some of the copper atoms are ionized by electrons in the plasma. Maximizing the number of copper ions moving towards the substrate 182 is desirable in a I-PVD process. Other copper atoms that are not ionized pass through the plasma and are deposited on the substrate 182 and on the walls of the chamber (not shown).

An unbalanced magnetic field having open magnetic field lines 180 can increase the rate of ionization of metal ions and can increase the density of metal ions compared with a balanced magnetic field 184b having closed magnetic field lines. Referring to FIG. 2C, copper atoms sputtered from the magnetron cathode segment 102b pass through a volume 188 of plasma that is trapped by the balanced magnetic field 184b. Electrons in the plasma ionize some of the copper atoms passing through the plasma.

A volume 189 of plasma generated proximate to the first segmented magnetron cathode 102a is significantly larger than the volume 188 of plasma generated proximate to the second segmented magnetron cathode 102b. The open magnetic field lines 180 in the unbalanced magnetic field allow the plasma to expand towards the substrate 182. Copper atoms sputtered from the first magnetron cathode segment 102a pass through the volume 189 of plasma and are more likely to collide with an electron in the plasma and become ionized than copper atoms passing through the smaller volume 188 of plasma. Thus, the density of copper ions as well as the rate of ionization of copper atoms increases in an unbalanced magnetron compared to a balanced magnetron. An increased density of metal ions can improve an I-PVD process as previously discussed. An aluminum target can be used in the I-PVD process instead of a copper target. Also, many other metals, compounds, or alloys can be used in an I-PVD process according to the invention.

Figure 2D:
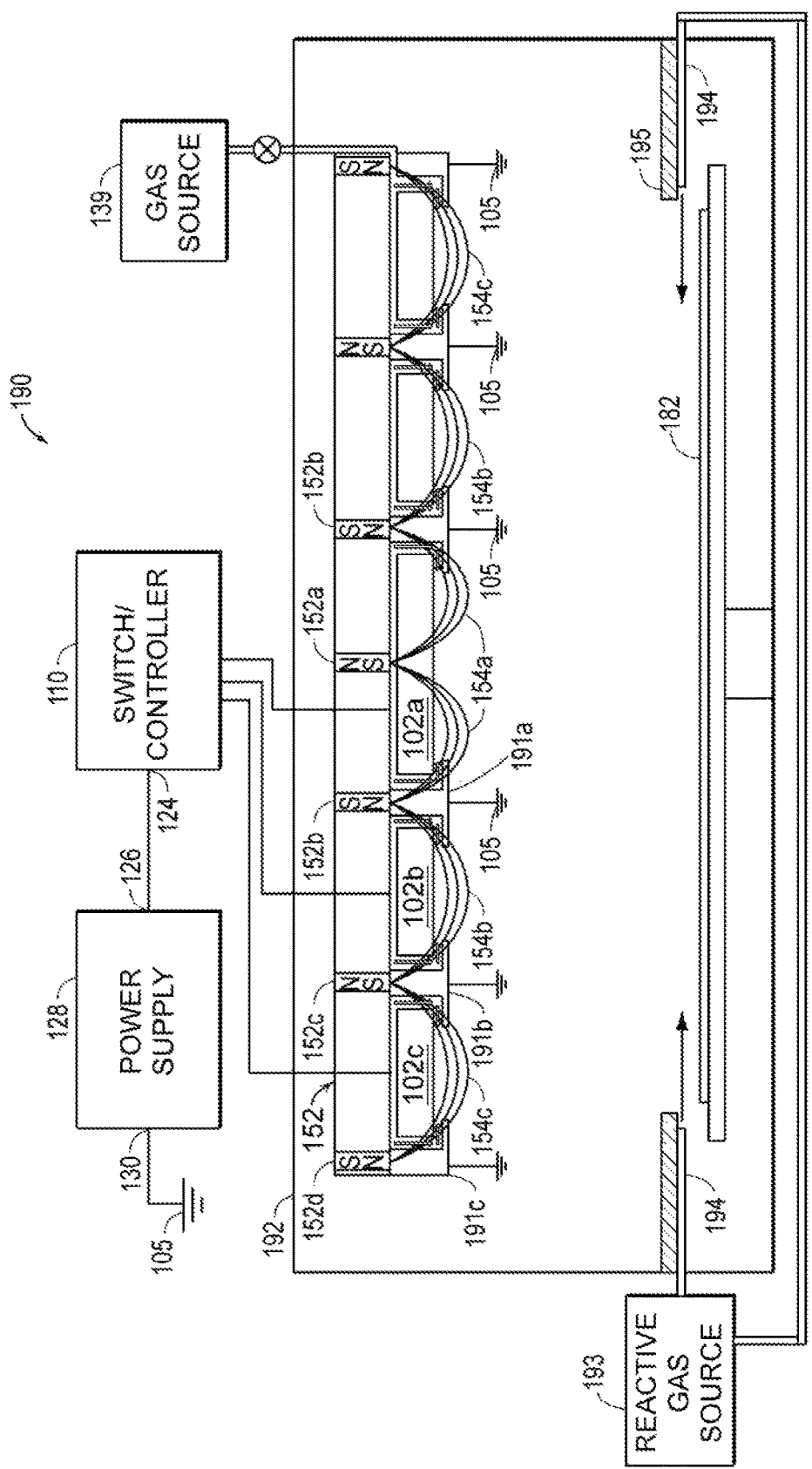
FIG. 2D illustrates a cross-sectional view of a plasma source including a segmented magnetron cathode that can be used for reactive sputtering.

FIG. 2D illustrates a cross-sectional view of a plasma source 190 that includes a segmented magnetron cathode 102 that can be used for reactive sputtering. The segmented magnetron cathode 102 includes three magnetron cathode segments 102a-c. The magnetron cathode segments 102a-c can each include target material. The target material can be the same on each of the magnetron cathode segments 102a-c. In a compound sputtering process, there can be different target material included on each of the magnetron cathode segments 102a-c. The switch 110 includes a plurality of outputs that are coupled to the magnetron cathode segments 102a-c. An output 126 of the power supply 128 is coupled to an input 124 of the switch 110. The segmented magnetron cathode 102 also includes a magnet assembly 152. The magnet assembly 152 includes a plurality of magnets 152a-d that generate magnetic fields 154a-c proximate to the magnetron cathode segments 102a-c. The magnetic fields 154a-c can be balanced or unbalanced.

The plasma source 190 also includes a plurality of anode sections 191a-c. The anode sections 191a-c are shaped to deliver feed gas from the gas source 139 across the surface of each magnetron cathode segment 102a-c. The gas source 139 can include ground state gas atoms, excited gas atoms, or a combination of ground state atoms and excited atoms. In one embodiment, an excited atom source (not shown) is positioned between the gas source 139 and the chamber 192. The gas source 139 delivers ground state gas atoms to the excited atom source. The excited atom source raises the energy of the ground state atoms to create excited atoms and then the excited atoms are delivered to the chamber 192.

The shape of each of the anode sections 191a-c can be chosen to increase a rate of ionization of the feed gas by modifying the pressure of the feed gas entering the chamber 192. In some embodiments (not shown), the anode sections 191a-c include internal gas injectors that supply the feed gas directly into the gap between each specific anode section 191a-c and the corresponding magnetron cathode segment 102a-c. The gas injectors can each supply different gases and/or excited atoms depending on the specific plasma process.

A reactive gas source 193 supplies reactive gas through a plurality of gas injectors 194. The reactive gas can include oxygen, nitrogen, nitrous oxide, carbon dioxide, chlorine, fluorine, or any other reactive gas or combination of gases. The reactive gas source 193 can supply any combination of ground state and/or excited gas atoms. Gas valves (not shown) or other gas controllers (not shown) can precisely meter the reactive gas into the chamber 192. In one embodiment, an excited atom source (not shown) is positioned between the reactive gas source 193 and the gas injectors 194. The reactive gas source 193 delivers ground state reactive gas atoms to the excited atom source. The excited atom source raises the energy of the ground state atoms to create excited atoms and then the excited atoms are supplied to the chamber 192 through the gas injectors 194.

The reactive gas is supplied near the substrate 182. A shield 195 can be used to reduce the quantity of reactive gas that can directly travel towards the segmented magnetron cathode 102. The shield does not, however, completely prevent the reactive gas from diffusing towards the segmented magnetron cathode 102 and eventually interacting with the segmented magnetron cathode 102. A segmented magnetron cathode 102 including target material can be damaged during the interaction with a reactive gas.

The operation of the plasma source 190 is similar to the operation of the plasma source 100 of FIG. 1. The gas source 139 provides feed gas between the anode sections 191a-c and the magnetron cathode segments 102a-c including the target material. The gas pressure can be adjusted to optimize the ionization process by modifying the flow rate of the gas and modifying the shape and position of the anode sections 191a-c relative to the corresponding magnetron cathode segments 102a-c. The power supply 128 provides voltage pulses to the switch 110. The switch 110 routes the voltage pulses to the various magnetron cathode segments 102a-c to ignite and maintain a high density plasma. The reactive gas source 193 supplies reactive gas in the vicinity of the substrate 182. Some of the reactive gas diffuses towards the segmented magnetron cathode 102. The reactive gas can interact with the target material and eventually damage the target material. The pressure of the gas flowing across the surface of the magnetron cathode segments 102a-c can be adjusted to reduce the amount of reactive gas that might interact with and eventually poison the target material.

Positively-charged ions in the high-density plasma are accelerated towards the negatively-charged segmented magnetron cathode 102. The highly accelerated ions sputter target material from the segmented magnetron cathode 102. The bombardment of the segmented magnetron cathode 102 with highly accelerated ions and the resulting intensive sputtering of the target material can also prevent the reactive gas from damaging the target material. During the sputtering process, a large fraction of the sputtered material is directed towards the substrate 182 and passes through the reactive gas. The reactive gas interacts with the sputtered material and changes the properties of the sputtered material, thereby creating a new material that sputter coats the substrate 182. In one embodiment, a reactive sputtering process and an I-PVD process can be performed together in a combined process. For example, in order to sputter TaN or TiN or other compounds to fill high-aspect-ratio structures on the substrate 182, a reactive sputtering process and an I-PVD process can be used.

FIG. 3A is a graphical representation of an exemplary voltage pulse train 200 for energizing the plasma source 100 of FIG. 1. The power supply 128 generates the individual square voltage pulses 201, 202, 203, 204, 205, 206, 207, 208, 209, 210 at the first output 126. The switch 110 receives the individual voltage pulses 201, 202, 203, 204, 205, 206, 207, 208, 209, 210 at the input 124 and routes the voltage pulses 201, 202, 203, 204, 205, 206, 207, 208, 209, 210 in a predetermined sequence to various outputs 108, 114, 118, 122 of the switch 110 which are coupled to the various respective magnetron cathode segments 102a-d. The sequence can be altered during the process to achieve certain process parameters, such as improved uniformity of the sputtered coating.

In one embodiment, the switch 110 routes each of the voltage pulses 201, 202, 203, 204, 205, 206, 207, 208, 209, 210 from the first output 126 of power supply 128 to each of the magnetron cathode segments 102a-d in the following manner. The first voltage pulse 201 is applied to the first magnetron cathode segment 102a, which ignites and sustains a plasma proximate to the first magnetron cathode segment 102a. The second voltage pulse 202 is applied to the second magnetron cathode segment 102b, which ignites and sustains a plasma proximate to the second magnetron cathode segment 102b. During these pulses, magnetron cathode segments deposit coatings on the substrate. The third voltage pulse 203 is applied to the third magnetron cathode segment 102c, which ignites a plasma proximate to the third magnetron cathode segment 102c.

The fourth voltage pulse 204 is applied to the fourth magnetron cathode segment 102d to ignite and sustain a plasma proximate to the fourth magnetron cathode segment 102d. The fifth voltage pulse 205 is applied to the fourth magnetron cathode segment 102d to increase coating thickness sputtered on the substrate proximate to the magnetron cathode segment 102d.

The sixth voltage pulse 206 is applied to the first magnetron cathode segment 102a to increase coating thickness sputtered on the substrate proximate to the magnetron cathode segment 102d. The seventh voltage pulse 207 is applied to the second magnetron cathode segment 102b to increase coating thickness sputtered on the substrate proximate to the magnetron cathode segment 102b.

The eighth voltage pulse 208 is applied to the third magnetron cathode segment 102c. The ninth 209 and the tenth voltage pulses 210 are applied to the fourth magnetron cathode segment 102d. The switch 110 controls the routing of the individual voltage pulses 201, 202, 203, 204, 205, 206, 207, 208, 209, and 210 in order to control the uniformity of the coating on the substrate 141 and the density of the plasma across the segmented magnetron cathode 102.

The preceding example illustrates the flexibility that can be achieved with the plasma source 100 including the segmented magnetron cathode 102 of FIG. 1. The switch 110 can be a programmable switch that routes one or more voltage pulses to the various magnetron cathode segments 102a-d in a predetermined manner in order to determine the precise distribution of the plasma across the magnetron cathode segments 102a-d, which controls the uniformity of the coating on the substrate 141. The switch 110 can also include a controller that modifies the sequence of the individual voltage pulses to the various magnetron cathode segments 102a-d in response to feedback from measurements taken during a plasma process.

FIG. 3B is a graphical representation of another exemplary voltage pulse train 220 for energizing the plasma source 100 of FIG. 1 that is chosen to generate a plasma having particular properties. The power supply 128 generates the individual voltage pulses 221, 222, 223, 224, 225, 226, 227, 228, 229, 230 at the first output 126. The switch 110 receives the individual voltage pulses 221, 222, 223, 224, 225, 226, 227, 228, 229, 230 at the input 124 and routes the individual voltage pulses 221, 222, 223, 224, 225, 226, 227, 228, 229, 230 to various outputs 108, 114, 118, 122 of the switch 110 which are coupled to the various magnetron cathode segments 102a-d.

In one embodiment, the switch 110 routes each of the individual voltage pulses 221, 222, 223, 224, 225, 226, 227, 228, 229, 230 from the first output 126 of the power supply 128 to each of the magnetron cathode segments 102a-d in the following manner. The first voltage pulse 221 is applied to the fourth magnetron cathode segment 102d. The first voltage pulse 221 ignites and sustains a plasma proximate to the fourth magnetron cathode segment 102a. The second voltage pulse 222 is applied to the third magnetron cathode segment 102c to ignite and sustain a plasma proximate to the third magnetron cathode segment 102c. The third voltage pulse 223 is applied to the first magnetron cathode segment 102a to ignite and sustain a plasma proximate to the first magnetron cathode segment 102a. The plasma proximate to the first 102a and the third magnetron cathode segments 102c will tend to migrate towards the second magnetron cathode segment 102b because of the magnetic coupling described herein.

The fourth voltage pulse 224 is applied to the second magnetron cathode segment 102b to ignite and sustain a plasma proximate to the second magnetron cathode segment 102b. During this pulse, the second magnetron cathode segment 102 deposit coatings on the substrate. The fifth voltage pulse 225 is applied to the first magnetron cathode segment 102a to increase coating thickness on the substrate proximate to the magnetron cathode segment 102a. The sixth voltage pulse 226 is applied to the fourth magnetron cathode segment 102d to increase coating thickness on the substrate proximate to the magnetron cathode segment 102d. The seventh voltage pulse 227 is applied to the third magnetron cathode segment 102c to increase coating thickness on the substrate proximate to the magnetron cathode segment 102c. The eighth voltage pulse 228 is applied to the second magnetron cathode segment 102b to increase coating thickness on the substrate proximate to the magnetron cathode segment 102b. The ninth voltage pulse 229 is applied to the first magnetron cathode segment 102a. The tenth voltage pulse 230 is applied to the fourth magnetron cathode segment 102d.

The preceding example illustrates the flexibility of the plasma source 100 having the segmented magnetron cathode 102. Each of the individual voltage pulses 221, 222, 223, 224, 225, 226, 227, 228, 229, 230 generated by the power supply 128 can have a different shape, different pulse width, and a different repetition rate. The power supply 128 is programmable and can generate voltage pulses that each have different pulse parameters. Additionally, the switch 110 can route one or more of the voltage pulses 221, 222, 223, 224, 225, 226, 227, 228, 229, 230 to one or more of the magnetron cathode segments 102a-d to control the density of the plasma and the uniformity of the sputtered coating.

FIG. 3C is a graphical representation of another exemplary voltage pulse train 240 for energizing the plasma source 100 of FIG. 1 that is chosen to generate a plasma having particular properties. The power supply 128 generates the individual voltage pulses 241, 242, 243, 244, 245, 246, 247, 248, 249, 250 at the first output 126. The voltage pulses 241, 242, 243, 244, 245, 246, 247, 248, 249, 250 in this example are substantially saw tooth in shape. The first 241 and the second 242 voltage pulses have magnitudes and rise times that are different than the other voltage pulses in the voltage pulse train 240. These first two voltage pulses 241, 242 generate a plasma having the desired plasma density. The switch 110 receives the individual voltage pulses 241, 242, 243, 244, 245, 246, 247, 248, 249, 250 at the input 124 and routes the voltage pulses 241, 242, 243, 244, 245, 246, 247, 248, 249, 250 to particular outputs 108, 114, 118, 122 of the switch 110 that are coupled to particular magnetron cathode segments 102a-d.

In one embodiment, the switch 110 routes each of the voltage pulses 241, 242, 243, 244, 245, 246, 247, 248, 249, 250 from the first output 126 power supply 128 to each of the magnetron cathode segments 102a-d in the following manner. The first voltage pulse 241 is applied to the first magnetron cathode segment 102a. The first voltage pulse 241 has a sufficient magnitude and rise time to ignite a weakly-ionized plasma and to increase the density of the weakly-ionized plasma to create a strongly-ionized plasma proximate to the first magnetron cathode segment 102a. The second voltage pulse 242 is also applied to the first magnetron cathode segment 102a. In one embodiment, the rise time of the voltage pulses 241, 242, 243, 244, 245, 246, 247, 248, 249, 250 is less than about 400V per 1 μsec. Controlling the rise time of the voltage pulses 241, 242, 243, 244, 245, 246, 247, 248, 249, 250 can control the density of the plasma though various ionization processes as follows.

The second voltage pulse 242 has a magnitude and a rise time that is sufficient to ignite a weakly-ionized plasma and to drive the weakly-ionized plasma to a strongly-ionized state. The rise time of the second voltage pulse 242 is chosen to be sharp enough to ignite the weakly-ionized plasma and to shift the electron energy distribution of the weakly-ionized plasma to higher energy levels to generate ionizational instabilities that create many excited and ionized atoms.

The magnitude of the second voltage pulse 242 is chosen to generate a strong enough electric field between the first magnetron cathode segment 102a and the anode section 104a to shift the electron energy distribution to higher energies. The higher electron energies create excitation, ionization, and recombination processes that transition the state of the weakly-ionized plasma to the strongly-ionized state.

The strong electric field generated by the second voltage pulse 242 between the first magnetron cathode segment 102a and the anode section 104a causes several different ionization processes. The strong electric field causes some direct ionization of ground state atoms in the weakly-ionized plasma. There are many ground state atoms in the weakly-ionized plasma because of its relatively low-level of ionization. In addition, the strong electric field heats electrons initiating several other different types of ionization processes, such as electron impact, Penning ionization, and associative ionization. Plasma radiation can also assist in the formation and maintenance of the high current discharge. The direct and other ionization processes of the ground state atoms in the weakly-ionized plasma significantly increase the rate at which a strongly-ionized plasma is formed. Some of these ionization processes are further described in co-pending U.S. patent application Ser. No. 10/708,281, entitled Methods and Apparatus for Generating Strongly-Ionized Plasmas with Ionizational Instabilities which is assigned to the present assignee. The entire disclosure of U.S. patent application Ser. No. 10/708,281 is incorporated herein by reference.

The third voltage pulse 243 is applied to the second magnetron cathode segment 102b and ignites a plasma proximate to the second magnetron cathode segment 102b. The fourth voltage pulse 244 is applied to the third magnetron cathode segment 102c and ignites a plasma proximate to the third magnetron cathode segment 102c. The fifth voltage pulse 245 is applied to the fourth magnetron cathode segment 102b and ignites a plasma proximate to the fourth magnetron cathode segment 102d. The sixth voltage pulse 246 is applied to the first magnetron cathode segment 102a and maintains the plasma proximate to the first magnetron cathode segment 102a at the desired plasma density and the desired plasma uniformity in order to obtain the desired coating uniformity on the substrate.

The seventh voltage pulse 247 is applied to the second magnetron cathode segment 102b. The eighth voltage pulse 248 is applied to the third magnetron cathode segment 102c. The ninth voltage pulse 249 is applied to the fourth magnetron cathode segment 102d. The tenth voltage pulse 250 is applied to the first magnetron cathode segment 102a. The third 243 through the tenth voltage pulse 250 maintain the plasma at the desired plasma density and the desired plasma uniformity. The magnitude, rise time, fall time, shape, and duration of the first 241 and the second voltage pulses 242 are chosen to generate a plasma having the desired density and uniformity to create a uniform coating on the substrate 141.

The saw-tooth shape of the voltage pulse train 240 does not sustain the strongly-ionized plasma because each of the voltage pulses 241, 242, 243, 244, 245, 246, 247, 248, 249, 250 is abruptly terminated. Each of the voltage pulses 241, 242, 243, 244, 245, 246, 247, 248, 249, 250 can have different rise times and/or different voltage levels. The preceding example illustrates the flexibility of the plasma source 100 having the power supply 128 and the switch 110. One or more of the voltage pulses 241, 242, 243, 244, 245, 246, 247, 248, 249, 250 generated by the power supply 128 can have a different magnitude and/or rise time. Additionally, the switch 110 can route one or more of the individual voltage pulses 241, 242, 243, 244, 245, 246, 247, 248, 249, 250 to one or more of the magnetron cathode segments 102a-d in a predetermined sequence.

FIG. 3D is a graphical representation of another exemplary voltage pulse train 260 for energizing the plasma source 100 of FIG. 1 that is chosen to generate a plasma having particular properties. The power supply 128 generates the voltage pulses 261, 262, 263, 264, 265 in the voltage pulse train 260 at the first output 126. The voltage pulses 261, 262, 263, 264, 265 in this example have a magnitude of about 500V, a pulse width of about 1 ms, and a repetition rate of about 5 Hz. The switch 110 receives the voltage pulses 261, 262, 263, 264, 265 at the input 124 and routes the individual voltage pulses 261, 262, 263, 264, 265 to specific outputs 108, 114, 118, 122 of the switch 110 which are coupled to specific magnetron cathode segments 102a-d.

In one embodiment, the switch 110 routes each of the voltage pulses 261, 262, 263, 264, 265 from the power supply 128 to each of the magnetron cathode segments 102a-d in the following manner. The first voltage pulse 261 is applied to the first magnetron cathode segment 102a. The first voltage pulse 261 has a magnitude of 500V and a pulse width of 1 ms which is sufficient to ignite a plasma proximate to the first magnetron cathode segment 102a. The second voltage pulse 262 is applied to the second magnetron cathode segment 102a. The second voltage pulse 262 has a magnitude of 500V and a pulse width of 1 ms that is sufficient to ignite a plasma proximate to the second magnetron cathode segment 102b.

The third voltage pulse 263 is applied to the third magnetron cathode segment 102c and ignites a plasma proximate to the third magnetron cathode segment 102c. The fourth voltage pulse 264 is applied to the fourth magnetron cathode segment 102d and ignites a plasma proximate to the fourth magnetron cathode segment 102d. The fifth voltage pulse 265 is applied to the first magnetron cathode segment 102a and maintains the plasma proximate to the first magnetron cathode segment 102a at the desired plasma density and uniformity. In this example, the voltage pulses 261, 262, 263, 264, 265 are identical.

The preceding example illustrates the flexibility of the plasma source 100 including the switch 110. The switching speed of the switch 110 in this example should be less than 249 ms in order to route each of the voltage pulses 261, 262, 263, 264, 265 to the various magnetron cathode segments 102a-d during the desired time period. This switching speed can be achieved using various mechanical or electronic switching technology.

FIG. 3E is a graphical representation of another exemplary voltage pulse train 270 for energizing the plasma source 100 of FIG. 1 that is chosen to generate a plasma having particular properties. The power supply 128 generates the voltage pulses 271, 272, 273, 274, 275 at the first output 126. Each individual voltage pulse 271, 272, 273, 274, 275 in this example has two voltage levels. In other embodiments, at least two of the individual voltage pulses 271, 272, 273, 274, 275 have different voltage levels.

The first voltage level $V_{pre}$ is a pre-ionization voltage level that is used to generate a pre-ionization plasma. The pre-ionization plasma is a weakly-ionized plasma. The weakly-ionized plasma has a plasma density that is less than about $10^{12}$ cm$^{-3}$. In one embodiment, the pre-ionization voltage level has a magnitude that is between about 300V and 2000V. The second voltage level $V_{main}$, is the main voltage level that generates a plasma having the desired plasma density. In one embodiment, two voltage levels are used to generate a plasma having a relatively high plasma density. The plasma having the relatively high plasma density is referred to as a high-density plasma or a strongly-ionized plasma. Typically, high-density plasmas will generate films at a high deposition rate compared with weakly-ionized plasmas. The density of the strongly-ionized plasma is greater than about $10^{12}$ cm$^{-3}$.

The difference in magnitude between the second voltage level $V_{main}$ and the first voltage level $V_{pre}$ is between about 1V and 500V in some embodiments. The switch 110 receives the individual voltage pulses 271, 272, 273, 274, 275 at the input 124 and routes the voltage pulses 271, 272, 273, 274, 275 to particular outputs 108, 114, 118, 122 of the switch 110 which are coupled to particular magnetron cathode segments 102a-d.

In one embodiment, the switch 110 routes each of the voltage pulses 271, 272, 273, 274, 275 from the output 126 of the power supply 128 to each of the magnetron cathode segments 102a-d in the following manner. The first voltage pulse 271 is applied to the first magnetron cathode segment 102a. A first time period 276 corresponding to an ignition phase of the pre-ionization plasma has a rise time $\tau_{ign}$ and a magnitude $V_{pre}$ that are sufficient to ignite a weakly-ionized plasma proximate to the first magnetron cathode segment 102a.

A second time period 277 having a value of between about 1 microsecond and 10 seconds is sufficient to maintain the weakly-ionized plasma. The voltage level during the second time period 277 can be constant or can decrease for a time period 277' according to a fall time $\tau 1'$. The value of the fall time $\tau 1'$ is in the range of between about 1 microsecond and 10 seconds. A third time period 278 of the first voltage pulse 271 has a rise time $\tau 1$ that is less than about 400V/usec and a magnitude $V_{main}$ that is sufficient to increase the density of the plasma proximate to the first magnetron cathode segment 102a. The rise time $\tau 1$ of the third time period 278 of the first voltage pulse 271 can be varied to control the density of the plasma including the amount the sputtered metal ions. A fourth time period 279 of the first voltage pulse 271 corresponds to the main phase of the first voltage pulse 271. The fourth time period 279 maintains the plasma at the desired plasma density. The magnitude of the voltage $V_{main}$ during the fourth time period 279 is in the range of between about 350V and 2500 V depending upon the particular application.

The second voltage pulse 272 is applied to the second magnetron cathode segment 102b. The first time period 276 of the second voltage pulse 272 corresponds to the ignition phase of the second voltage pulse 272 and has a rise time $\tau_{ign}$ and a magnitude $V_{pre}$ that is sufficient to ignite a plasma proximate to the second magnetron cathode segment 102b. A second time period 280 of the second voltage pulse 272 is sufficient to maintain a weakly-ionized plasma proximate to the second magnetron cathode segment 102b. The voltage level during the second time period 280 can be constant or can decrease for a time period 280' according to a fall time $\tau 2'$. A third time period 281 of the second voltage pulse 272 has a rise time $\tau 2$ and a magnitude $V_{main}$ that is sufficient to increase the density of the plasma proximate to the second magnetron cathode segment 102b.

The rise time $\tau 2$ of the third time period 281 of the second voltage pulse 272 is sharper than the rise time $\tau 1$ of the third time period 278 of the first voltage pulse 271. This sharper rise time $\tau 2$ generates a higher-density plasma proximate to the second magnetron cathode segment 102b than the plasma generated proximate to the first magnetron cathode segment 102a. The fourth time period 282 of the second voltage pulse 272 corresponds to the main phase of the second voltage pulse 272.

The rise times $\tau 1$-$\tau 5$ of the voltage pulses 271-275 can be chosen so that the voltage pulses 217-275 provide sufficient energy to the electrons in the weakly-ionized plasma to excite atoms in the plasma, ionize ground state or excited atoms, and/or increase the electron density in order to generate a strongly-ionized plasma. The desired rise time depends on the mean free time between collisions of the electrons between atoms and molecules in the weakly-ionized plasma that is generated from the feed gas. Also, the magnetic field from the magnetron can strongly affect on the electron mean free time between the collisions. Therefore, the chosen rise time depends on several factors, such as the type of feed gas, the magnetic field, and the gas pressure.

In one embodiment, the rise time $\tau 2$ of the third time period 281 of the second voltage pulse 272 is sufficient to cause a multi-step ionization process (instead of direct ionization process by electron impact). In a first step, the second voltage pulse 272 initially raises the energy of the ground state atoms in the weakly-ionized plasma to a level where the atoms are excited. For example, argon atoms require an energy of about 11.55 eV to become excited. In a second step, the magnitude and rise time in the third time period 281 of the second voltage pulse 272 are chosen to create a strong electric field that ionizes the exited atoms. Excited atoms ionize at a much high rate than neutral atoms. For example, argon excited atoms only require about 4 eV of energy to ionize while neutral atoms require about 15.76 eV of energy to ionize. Additionally, the collisions between excited argon atoms and ground state sputtered atoms, such as copper atoms, can create additional ions and electron that will increase plasma density. The multi-step ionization process is described in co-pending U.S. patent application Ser. No. 10/249,844, entitled High-Density Plasma Source using Excited Atoms, which is assigned to the present assignee. The entire disclosure of U.S. patent application Ser. No. 10/249,844 is incorporated herein by reference.

The multi-step ionization process can be described as follows:

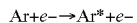

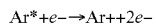

where Ar represents a neutral argon atom in the initial plasma, e– represents an ionizing electron generated in response to an electric field, and Ar* represents an excited argon atom in the initial plasma. The collision between the excited argon atom and the ionizing electron results in the formation of an argon ion (Ar+) and two electrons.

In one embodiment, ions in the developing plasma strike the second magnetron cathode segment 102b causing secondary electron emission. These secondary electrons interact with neutral or excited atoms in the developing plasma. The interaction of the secondary electrons with the neutral or excited atoms further increases the density of ions in the developing plasma as feed gas is replenished. Thus, the excited atoms tend to more rapidly ionize near the surface of the second magnetron cathode segment 102b than the neutral argon atoms. As the density of the excited atoms in the plasma increases, the efficiency of the ionization process rapidly increases. The increased efficiency can result in an avalanche-like increase in the density of the plasma that creates a strongly-ionized plasma proximate to the second magnetron cathode segment 102b.

The magnetic field 136b (FIG. 2A) generated by the magnet assembly 134b can also increase the density of the plasma. The magnetic field 136b that is located proximate to the second magnetron cathode segment 102b is sufficient to generate a significant electron ExB Hall current which causes the electron density in the plasma to form a soliton or other non-linear waveform that increases the density of the plasma. In some embodiments, the strength of the magnetic field 136b required to cause the electron density in the plasma to form such a soliton or non-linear waveform is in the range of fifty to ten thousand gauss.

An electron ExB Hall current is generated when the voltage pulse train 270 applied between the segmented magnetron cathode 102a,b,c, d and the anode sections 104a, b, c, d generates primary electrons and secondary electrons that move in a substantially circular motion proximate to the cathode segments 102a, b, c, d according to crossed electric and magnetic fields. The magnitude of the electron ExB Hall current is proportional to the magnitude of the discharge current in the plasma. In some embodiments, the electron ExB Hall current is approximately in the range of three to ten times the magnitude of the discharge current.

In one embodiment, the electron density increases in an avalanche-like manner because of electron overheating instability. Electron overheating instabilities can occur when heat is exchanged between the electrons in the plasma, the feed gas, and the walls of the chamber. For example, electron overheating instabilities can be caused when electrons in a weakly-ionized plasma are heated by an external field and then lose energy in elastic collisions with atoms in the feed gas. The elastic collisions with the atoms in the feed gas raise the temperature and lower the density of the feed gas. The decrease in the density of the gas results in an increase in the electron temperature because the frequency of elastic collisions in the feed gas decreases. The increase in the electron temperature again enhances the heating of the gas. The electron heating effect develops in an avalanche-like manner and can drive the weakly-ionized plasma into a strongly-ionized state.

The third 273, fourth 274, and fifth voltage pulses 275 can include time periods having various shapes and durations depending on the desired properties of the plasma. The preceding example illustrates the flexibility of the plasma source 100 having the power supply 128 and the switch 110. The power supply 128 can generate voltage pulses having various shapes and rise-times depending on the desired properties of the plasma. The switch can route each of the individual voltage pulses 271, 272, 273, 274, 275 to the particular magnetron cathode segments 102a-d depending on the desired uniformity of the sputtered coating and the desired density of the plasma.

In some embodiments of the present invention, the plasma source 100 is configured with the power supply 128 (FIG. 1) connected directly to all segments of the magnetron cathode 102 without the use of the switch 110. Such a plasma source can be driven using the voltage pulse train 270 shown in FIG. 3E that generates a plasma having particular properties. When the first voltage pulse 271 is applied to the magnetron cathode 102, a weakly ionized plasma is established in the first time period 276. The weakly ionized plasma is maintained for during the second time period 277. During the second period 277 where the weakly ionized plasma is maintained, a relatively low deposition rate and a relatively low level of ionization of sputtered gas atoms or/and molecules is produced. Consequently, the number of sputtered ions generated is very low. In one embodiment, the ratio of total ions (NI) to neutral atoms (NN) in the plasma volume proximate to the substrate is in the range 0.1 and 0.01. The resulting sputtered film will have a column-like structure with a relatively high level of porosity, surface roughness, and stress.

In the third time period 278, the weakly ionized plasma transitions to a strongly ionized plasma. In the fourth time period 279, the high density plasma is maintained. While the high density plasma is maintained, there is a high deposition rate and a high level of ionization of feed gas and sputtered material atoms. For example, while the high density plasma is maintained, the ratio of total ions (NI) to neutral atoms (NN) in the plasma volume proximate to the substrate can be in the range of 0.1 to 1.0. Also, while the high density plasma is maintained, the resulting sputtered film will have a dense microstructure, with low porosity, low surface roughness, and a low level of stress.

Thus, the present invention is in part the recognition that the shape of the voltage pulse applied to the magnetron cathode 102 shown in FIG. 1 and also to some conventional magnetron cathodes 102, determines the ratio of ions to neutral atoms. By adjusting the amplitude, duration and rise time of the voltage pulse applied to the magnetron cathode 102, a ratio between neutral atoms and ions can be adjusted to the desired ratio. Changing the ratio between neutral atoms and ions changes the film micro structure and the properties of the film. For example, by changing the ratio between neutral atoms and ions, the film properties, such as the porosity, surface roughness, and the film stress (degree of tensile or compressive strength) can be changed.

FIG. 3F is a graphical representation of another exemplary voltage pulse train 285 for energizing the plasma source 100 of FIG. 1 that is chosen to generate a plasma having particular properties. The power supply 128 generates the voltage pulses 286, 287, 288, 289 at the first output 126. In this example, the voltage pulses 286, 287, 288, 289 are identical and each voltage pulse has three voltage levels. In other embodiments, at least two of the voltage pulses 286, 287, 288, 289 have different voltage levels and/or include different rise times. The first voltage level $V_{pre}$ has a magnitude that is between about 300V and 2000V. The difference in magnitude between the second voltage level $V_{main1}$ and the first voltage level $V_{pre}$ is between about 1V and 500V. The difference in magnitude between the third voltage level $V_{main2}$ and the second voltage level $V_{main1}$ is between about 1V and 500V.

In one embodiment, the switch 110 routes each of the individual voltage pulses 286, 287, 288, 289 to the first 102a, the second 102b, the third 102c, and the fourth magnetron cathode segments 102d, respectively. Each of the voltage pulses 286, 287, 288, 289 includes six time periods. An ignition time period 290 of the first voltage pulse 286 has a rise time $\tau_{ign}$. A second time period 291 of the first voltage pulse 286 has a magnitude $V_{pre}$ that is between about 300 V and 2000 V and a duration that is between about 1 microsecond and 10 seconds that is sufficient to ignite a weakly-ionized plasma proximate to the first magnetron cathode segment 102a. The voltage level during the second time period 291 can be constant or can decrease for a time period 291' according to a fall time τ1'.

A third time period 292 of the first voltage pulse 286 has a rise time τ1 that is sufficient to increase the density of the plasma proximate to the first magnetron cathode segment 102a. The rise time τ1 is less than about 300 V/µsec. The increase in the density of the plasma due to the sharpness of the rise time $\tau_1$ generates a high-density plasma or a strongly-ionized plasma from the weakly-ionized plasma proximate to the first magnetron cathode segment 102a.

A fourth time period 293 of the first voltage pulse 286 has a duration that is between about one microsecond and 10 seconds and a magnitude $V_{main1}$ that is between about 300V and 2000 V, which is sufficient to maintain the high-density plasma. The voltage level during the fourth time period 293 can be constant or can decrease for a time period 293' according to a fall time τ2'. A fifth time period 294 of the first voltage pulse 286 has a rise time τ2 that is sufficient to increase the density of the high-density plasma proximate to the first magnetron cathode segment 102a. The rise time τ2 is less than about 300 V/µsec. The increase in the density of the high-density plasma due to the sharpness of the rise time τ2 generates a higher-density plasma or an almost fully-ionized plasma from the high-density plasma proximate to the first magnetron cathode segment 102a. A sixth time period 295 of the first voltage pulse 286 has a duration that is between about 1 microsecond and 10 seconds and a magnitude $V_{main2}$ that is between about 400V and 3000V, which is sufficient to maintain the almost fully-ionized plasma.

The second 287, third 288, and fourth voltage pulses 289 include the same time periods as the first voltage pulse 286 and are each routed to particular magnetron cathode segments 102b-d depending on the desired properties of the plasma, such as the desired plasma density, deposition rate, and the uniformity of the sputtered coating.

FIG. 3G is a graphical representation of another exemplary voltage pulse train 296 for energizing the plasma source 100 of FIG. 1 that is chosen to generate a plasma having particular properties. In this example, the voltage pulses 297 are identical. In other embodiments, at least two of the voltage pulses 297 have different voltage levels and/or include different rise times. The power supply 128 generates the voltage pulses 297 at the first output 126. The voltage pulses 297 in this example each have only one voltage level. The voltage level $V_{main}$ has a magnitude that is between about 300V and 2000V.

In one embodiment, the switch 110 routes each of the voltage pulses 297 to the first 102a, the second 102b, the third 102c, and the fourth magnetron cathode segments 102d. Each of the voltage pulses 297 includes two time periods. A first time period 298 of each of the voltage pulses 297 has a rise time τ1 that is sufficient to both ignite a weakly-ionized plasma and to increase the density of the weakly-ionized plasma. The rise time τ1 is less than about 400 V/µsec. A second time period 299 of each of the voltage pulses 297 has a duration that is between about 5 microseconds and 10 seconds and a magnitude $V_{main}$ that is between about 300V and 2000V, which is sufficient to maintain the plasma at the increased density level.

In this example, the voltage pulses 297 are applied to the magnetron cathode segment 102a without the express pre-ionization time period that was described in connection with previous examples. In this example, a plasma condition exists when the rise time τ1 of the first phase 298 is such that a plasma develops having a plasma density that can absorb the power generated by the power supply 128. This plasma condition corresponds to a rapidly developing initial plasma that can absorb the power generated by the application of the voltage pulse 297 without the plasma contracting. Thus, the weakly-ionized plasma and the strongly-ionized plasma both develop in a single phase 298 of the voltage pulse 297. The strongly-ionized plasma is sustained in the phase 299 of the voltage pulse 297.

Referring to both FIGS. 3F and 3G, in some embodiments of the present invention, the plasma source 100 is configured with the power supply 128 (FIG. 1) connected directly to all segments of the magnetron cathode 102 without the use of the switch 110 as described in connection with FIG. 3E. Such a plasma source can be driven using the voltage pulse trains 285 and 296 shown in FIGS. 3F, 3G that generates a plasma having particular properties. For example, experiments have been performed where the power supply 128 first generates the train of voltage pulses 285 a period of one second. During the first train of voltage pulses 285, the ratio of total ions (NI) to neutral atoms (NN) in the plasma volume proximate to the substrate was about 0.4 and a first sputtered layer about 10 Å thick was deposited.

The power supply 128 then generates the train of voltage pulses 296 for a period of seven seconds. During the second train of voltage pulses 296, the ratio of total ions (NI) to neutral atoms (NN) in the plasma volume proximate to the substrate was about 0.6 and a second sputtered layer about 5 Å thick was deposited. The layers sputtered using the first train of voltage pulses 285 and using the second train of voltage pulses 296 had different film structures. The film structures were different because the ratio of total ions (NI) to neutral atoms (NN) in the first sputtered layer plasma volume was different from the ratio of total ions (NI) to neutral atoms (NN) in the second sputtered layer.

An alternating or modulated thin film structure was achieved by alternating between applying the first train of voltage pulses 285 to the magnetron cathode 102 and applying the second train of voltage pulses 296 to the magnetron cathode a plurality of times. The number of alternating thin films and the ratio of total ions (NI) to neutral atoms (NN) in the plasma volume which generates each of the thin films can be chosen to achieve certain mechanical, electrical, magnetic film properties.

Figure 3H:
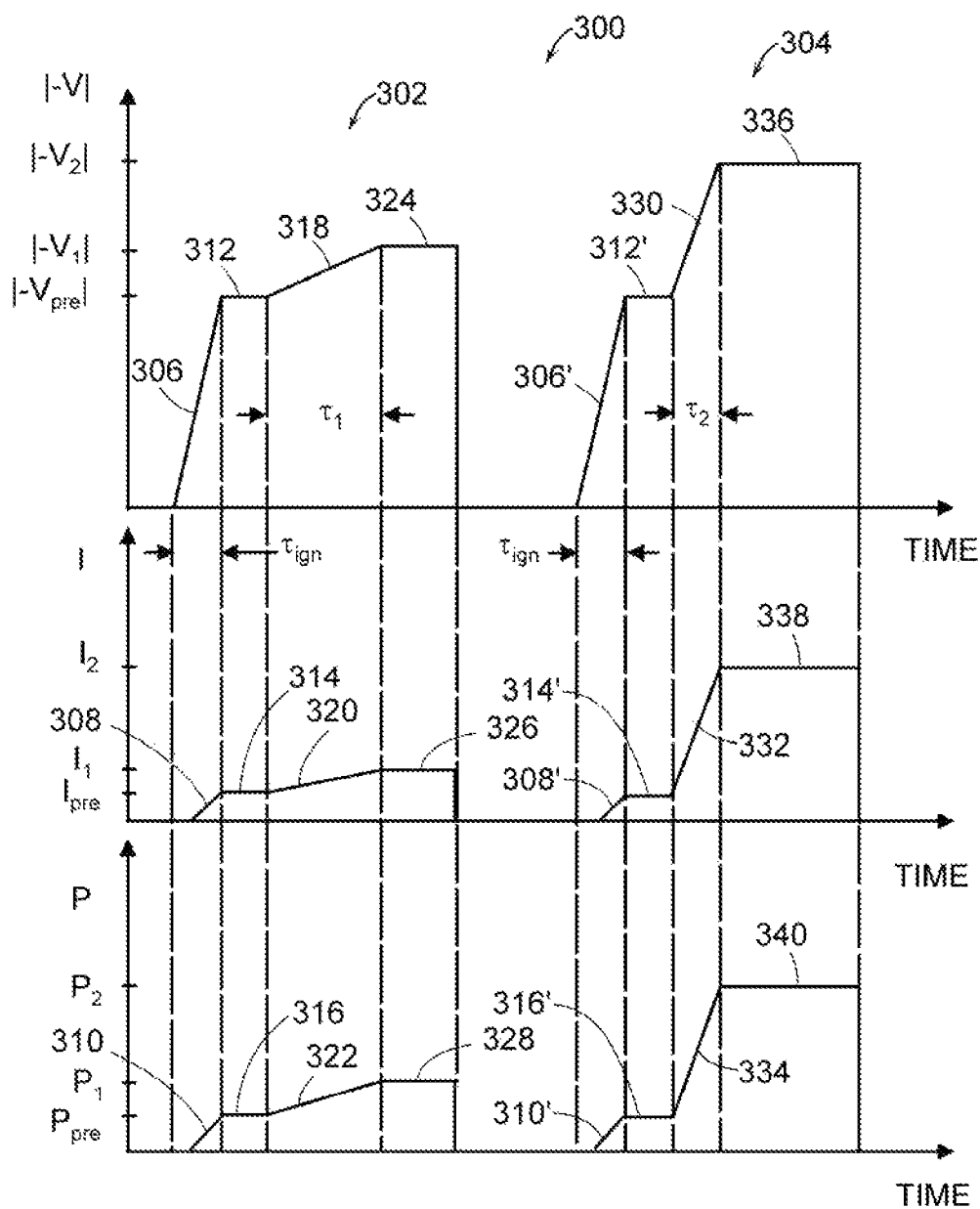

FIG. 3H is a graphical representation of yet another exemplary voltage pulse train 300 for energizing the plasma source 100 of FIG. 1 that is chosen to generate a plasma having particular properties. In this example, the voltage pulses 302, 304 each include four time periods. However, the magnitudes and rise times of the four time periods are different for each voltage pulse 302, 304.

The power supply 128 generates the voltage pulses 302, 304 at the output 126. The voltage pulses 302, 304 in this example each have two voltage levels. In one embodiment, the switch 110 routes both of the voltage pulses 302, 304 to the first magnetron cathode segment 102a. Each of the voltage pulses 302, 304 having the four time periods generates a plasma having different plasma properties, such as different plasma densities. In other embodiments, subsequent voltage pulses (not shown) are routed by the switch 110 to the other magnetron cathode segments 102b-d.

A first time period 306 of the first voltage pulse 302 has a rise time $\tau_{ign}$ that is sufficient to ignite a plasma proximate to the first magnetron cathode segment 102a. In one embodiment, the rise time $\tau_{ign}$ is less than about 400 V/µsec. The developing plasma has a discharge current 308 which increases as the magnitude of the voltage increases. Relatively few electrons exist before the plasma is ignited, therefore, the developing discharge current 308 lags behind the first time period 306 of the first voltage pulse 302 in time. The power 310 can be determined by taking the product of the voltage and the discharge current. The power 310 initially tracks the discharge current 308 in this example.

A second time period 312 of the first voltage pulse 302 has a duration and a magnitude $V_{pre}$ that is sufficient to sustain a weakly-ionized plasma. In one embodiment, the magnitude of $V_{pre}$ is between about 300V and 2000V. In one embodiment, the duration of the time period 312 is between about 1 microsecond and 10 seconds. During the second time period 312, the discharge current 314 corresponding to the voltage $V_{pre}$ plateaus at a value that corresponds to a relatively low density of the plasma. The power 316 during the second time period 312 is also at a relatively low level that corresponds to the relatively low density of the weakly-ionized plasma.

A third time period 318 of the first voltage pulse 302 has a rise time $\tau 1$ that is sufficient to slightly increase the density of the weakly-ionized plasma. The rise time $\tau 1$ is relatively long and therefore the voltage in the third time period 318 increases relatively slowly to a peak voltage V1. The discharge current 320 also increases relatively slowly and reaches a relatively low peak current level I1. The peak current I1 corresponds to a plasma density where there is insufficient electron energy gained in the third time period 318 to substantially increase the plasma density.

The power 322 reaches an intermediate peak power level P1 that corresponds to the peak discharge current I1. If the duration of the third time period 318 of the first voltage 302 was extended to the duty cycle limit of the power supply 128, the peak discharge current I1 would slowly increase, and the intermediate peak power level P1 would remain at a level that corresponds to a plasma having an intermediate plasma density.

A fourth time period 324 of the first voltage pulse 302 has a duration and a magnitude V1 that is sufficient to maintain the plasma having the intermediate plasma density. During the fourth time period 324, the discharge current 326 plateaus at a value that corresponds to the intermediate plasma density. The power 328 during the fourth time period 324 is also at a moderate level corresponding to a moderate density of the plasma.

A first time period 306' of the second voltage pulse 304 has a rise time $\tau_{ign}$ that is the same as the rise time $\tau_{ign}$ of the first time period 306 of the first voltage pulse 302. This rise time is sufficient to ignite a plasma proximate to the first magnetron cathode segment 102a. The developing plasma has a discharge current 308' which increases as the magnitude of the voltage increases and behaves similarly to the plasma ignited by the first time period 306 of the first voltage pulse 302. The developing discharge current 308' lags behind the first time period 306' of the second voltage pulse 304 in time. The power 310' initially tracks the discharge current 308'.

A second time period 312' of the second voltage pulse 304 has a duration and a magnitude $V_{pre}$ that is the same as the duration and the magnitude $V_{pre}$ of the second time period 312 of the first voltage pulse 302. The second time period 312' of the second voltage pulse 304 is sufficient to pre-ionize or precondition the plasma to maintain the plasma in a weakly-ionized condition. During the second time period 312', the discharge current 314' plateaus at a value that corresponds to the relatively low density of the plasma. The power 316' during the second time period 312' is also at a relatively low level that corresponds to the relatively low density of the weakly-ionized plasma.

A third time period 330 of the second voltage pulse 304 has a rise time $\tau 2$ that is sufficient to rapidly increase the density of the plasma. The rise time $\tau 2$ is relatively fast and, therefore, the voltage in the third phase 330 increases very quickly to a peak voltage having a magnitude V2. In one embodiment, the rise time $\tau 2$ is less than about 300 V/µsec. The density of the plasma and the uniformity of the sputtered coating can be modified by modifying at least one of the rise time $\tau 2$, the peak voltage V2 (amplitude), the fall time, the shape, and the duration of the second voltage pulse 304.

The sharp rise time $\tau 2$ dramatically increases the number of electrons in the plasma that can absorb the power generated by the power supply 128 (FIG. 1). This increase in the number of electrons results in a discharge current 332 that increases relatively quickly and reaches a peak current level 12 that corresponds to a high-density plasma condition. The peak current level 12 corresponds to a point in which the plasma is strongly-ionized. The peak current level 12, and therefore the plasma density, can be controlled by adjusting the rise time $\tau 2$ of the third time period 330 of the second voltage pulse 304. Slower rise times generate lower density plasmas, whereas faster rise times generate higher density plasmas. A higher density plasma will generate coatings at a higher deposition rate.

The amplitude and rise time $\tau 2$ during the third time period 330 of the second voltage pulse 304 can also support additional ionization processes. For example, the rise time $\tau 2$ in the second voltage pulse 304 can be chosen to be sharp enough to shift the electron energy distribution of the weakly-ionized plasma to higher energy levels to generate ionizational instabilities that create many excited and ionized atoms. The higher electron energies create excitation, ionization, and recombination processes that transition the state of the weakly-ionized plasma to the strongly-ionized state.

The strong electric field generated by the second voltage pulse 304 can support several different ionization processes. The strong electric field causes some direct ionization of ground state atoms in the weakly-ionized plasma. There are many ground state atoms in the weakly-ionized plasma because of its relatively low-level of ionization. In addition, the strong electric field heats electrons initiating several other different types of ionization processes, such as electron impact, Penning ionization, and associative ionization. Plasma radiation can also assist in the formation and maintenance of the high current discharge. The direct and other ionization processes of the ground state atoms in the weakly-ionized plasma significantly increase the rate at which a strongly-ionized plasma is formed.

A fourth time period 336 of the second voltage pulse 304 has a duration that is between about 1 microsecond and 10 seconds and a magnitude V2 that is between about 300V and 2000V, which is sufficient to maintain a strongly-ionized plasma. During the fourth time period 336, the discharge current 338 plateaus at a level that corresponds to a relatively high plasma density. The power 340 during the fourth time period 336 is also at a relatively high-level that corresponds to the relatively high plasma density.

In some embodiments, voltage pulses having additional time periods with particular rise times can be used to control the density of the plasma. For example, in one embodiment the second voltage pulse 304 includes a fifth time period having an even sharper rise time. In this embodiment, the density of the strongly-ionized plasma is even further increased.

Thus, the density of the plasma as well as the uniformity of the resulting sputtered film generated by the plasma source 100 can be adjusted by adjusting at least one of a rise time, a fall time, an amplitude, a shape, and a duration of the voltage pulses. FIG. 3H illustrates that the third time period 318 of the first voltage pulse 302 having the relatively slow rise time $\tau 1$ generates a relatively low peak current level $\tau 1$ that corresponds to a relatively low plasma density. In contrast, the third time period 330 of the second voltage pulse 304 has a rise time $\tau 2$ that generates a relatively high peak current level 12 that corresponds to a relatively high plasma density.

A sputtering system including the plasma source 100 (FIG. 2A) can deposit a highly uniform film with a high deposition rate. In addition, a sputtering system including a plasma source 100 having a segmented target corresponding to the segmented magnetron cathode 102 can be designed and operated so that the target material on the segmented target erodes in a uniform manner, resulting in full face erosion of the segmented target. The power supply 128 can also be effectively used to generate uniform high-density plasmas in magnetrons having one-piece planar magnetron cathodes.

The plasma source 100 of FIG. 2A is well suited for I-PVD systems. An I-PVD system including the plasma source 100 (FIG. 2A) can independently generate a more uniform coating, have a higher deposition rate, and have an increased ion flux compared with known I-PVD systems having one-piece planar cathodes.

Figure 3I:
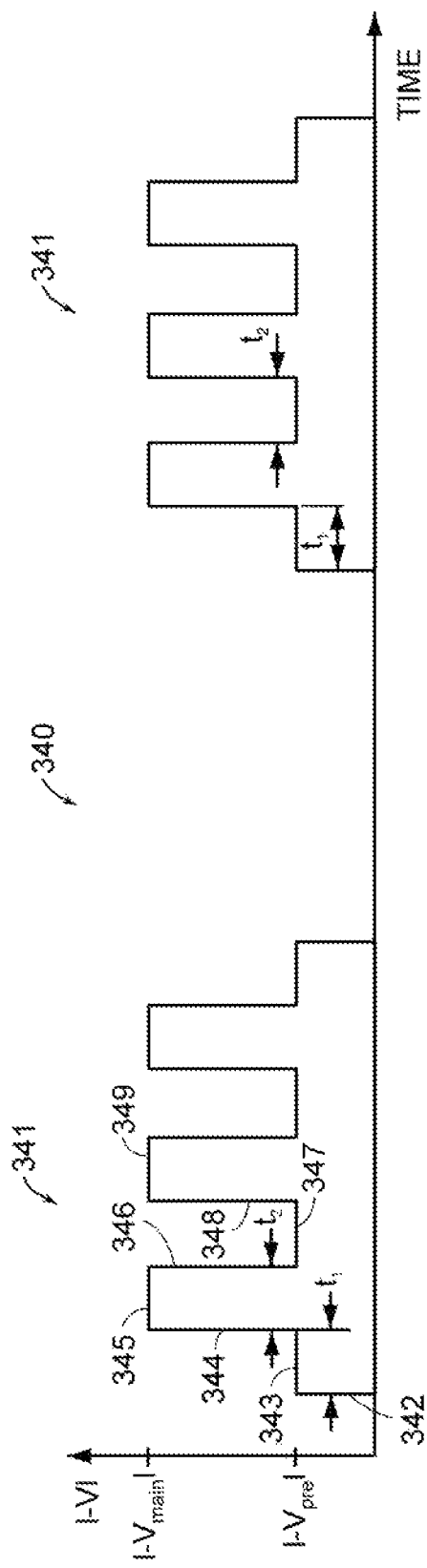

FIG. 3I is a graphical representation of exemplary voltage pulse train 340 for energizing the plasma source 100 of FIG. 1 that is chosen to generate a plasma having particular properties. The voltage pulse train 340 includes individual voltage pulses 341 that are identical. Each of the individual voltage pulses 341 can include multiple peaks as shown in FIG. 3I. The power supply 128 generates the voltage pulses 341 at the first output 126. The voltage pulses 341 in this example each have two voltage levels. The voltage level $V_{pre}$ has a magnitude that is between about 300V and 1,000V. The voltage level $V_{main}$ has a magnitude that is between about 300V and 2,000V.

Each of the voltage pulses 341 include multiple rise times and fall times. A first rise time 342 is sufficient to ignite a plasma from a feed gas. The first rise time can be less than 400V/usec. The magnitude 343 of the first voltage peak is sufficient to maintain a plasma in a weakly-ionized state. The time period t1 of the first voltage peak is between about 10 microseconds and 1 second. A second rise time 344 and magnitude 345 of the second voltage peak is sufficient to increase the density of the weakly-ionized plasma to generate a strongly-ionized plasma from the weakly-ionized plasma. The second rise time 344 can be less than 400V/µsec. A fall time 346 of the second voltage peak is chosen to control the density of the strongly-ionized plasma in preparation for a third voltage peak. The fall time can be less than 400V/µsec. The second voltage peak is terminated after a time period t2. The time period t2 of the second voltage peak is between about 10 microseconds and 1 second.

After the termination of the second voltage peak, the voltage 345 drops to a voltage level 347 that corresponds to the voltage 343 of the first voltage peak. The voltage level 347 is chosen to maintain a sufficient density of the plasma in preparation for the third voltage peak. The rise time 348 and the magnitude 349 of the third voltage peak is sufficient to increase the density of the plasma to create a strongly-ionized plasma. Additional voltage peaks can also be used to condition the plasma depending on the specific plasma process. The voltage peaks can have various rise times, fall times, magnitudes, and durations depending on the desired properties of the plasma. The voltage pulses 341 of FIG. 3I can decrease the occurrence of arcing in the chamber by supplying very high power to the plasma in small increments that correspond to the voltage peaks. The incremental power is small enough to prevent an electrical breakdown condition from occurring in the chamber, but large enough to develop a strongly-ionized or high-density plasma that is suitable for high deposition rate sputtering. Additionally, the incremental power can prevent a sputtering target from overheating by holding the average temperature of the sputtering target relatively low.

Figure 4:
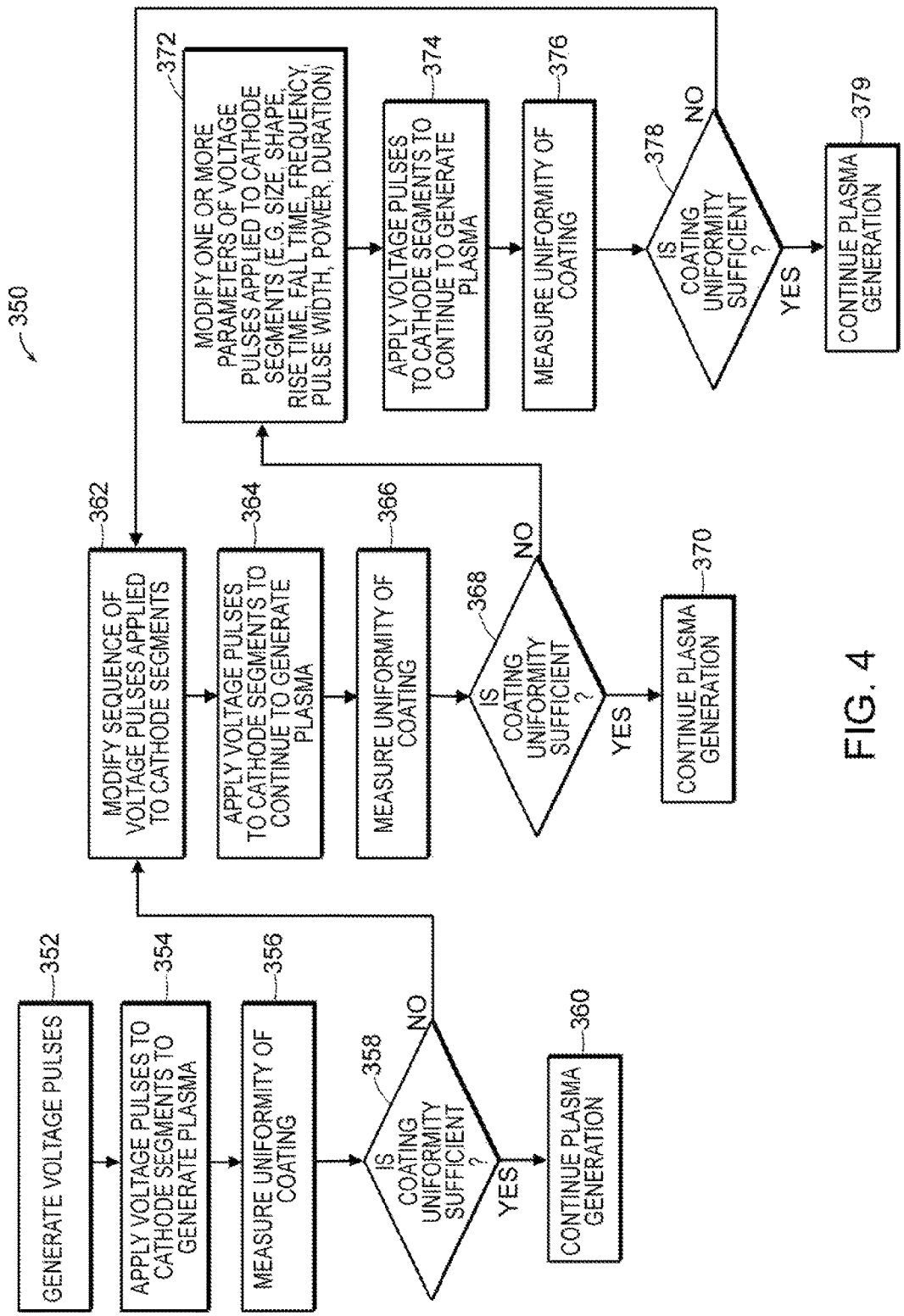
FIG. 4 is a flowchart of a method for generating a plasma according to one embodiment of the invention.

An operation of the plasma source 100 of FIG. 2A is described with reference to FIG. 4. This operation relates to generating a plasma and controlling the uniformity of the sputtered coating. FIG. 4 is a flowchart 350 of a method for generating a plasma according to one embodiment of the invention. The uniformity of the sputtered coating can be controlled by varying one or more parameters in the plasma source 100. Many parameters can be varied. For example, parameters related to the power supply 128, parameters related to the switch 110, parameters related to the gas source 139, and/or parameters related to the magnet assemblies 134a-d can be varied.

In step 352, the power supply 128 generates a pulse train at the output 126 comprising voltage pulses. In step 354, the switch 110 routes the voltage pulses to individual magnetron cathode segments 102a-d of the segmented magnetron cathode 102. The plasma sputters material from the individual magnetron cathode segments 102a-d. The material is deposited on a substrate to create a sputtered film or coating. The uniformity of the coating is measured in step 356. In step 358, the uniformity of the coating is evaluated. If the coating uniformity is found to be sufficient, the generation of the plasma continues in step 360.

If the coating uniformity is found to be insufficient, the sequence of the voltage pulses applied to the magnetron cathode segments 102a-d is modified in step 362. The sequence of the voltage pulses can be modified such that one or more voltage pulses are applied to each of the magnetron cathode segments 102a-d in any order that optimizes the uniformity of the sputtered coating.

Once the sequence of the voltage pulses is modified in step 362, the voltage pulses are routed to the various magnetron cathode segments 102a-d in step 364. The uniformity of the coating is again measured in step 366. In step 368, the uniformity of the coating is again evaluated. If the coating uniformity is found to be sufficient, the generation of the plasma continues in step 370.

If the coating uniformity is found to be insufficient in step 368, one or more parameters of the voltage pulses are modified in step 372. For example, the pulse width, the pulse shape, the rise time, the fall time, the magnitude, the frequency, and/or any other parameters that define the voltage pulses can be modified by the power supply 128. In step 374, the switch 110 routes the voltage pulses to the magnetron cathode segments 102a-d. The uniformity of the coating is again measured in step 376. In step 378, the uniformity of the coating is again evaluated. If the coating uniformity is found to be sufficient, the generation of the plasma continues in step 379.

If the coating uniformity is found to be insufficient in step 378, the sequence of the voltage pulses applied to the magnetron cathode segments 102a-d is again modified in step 362 and the process continues until the coating uniformity is sufficient for the specific plasma process.

Figure 5:
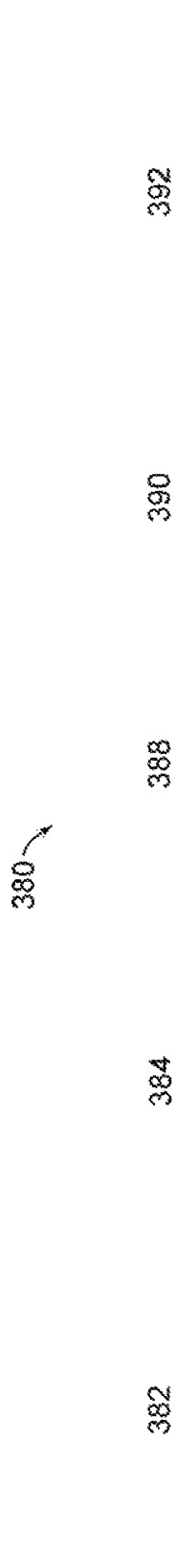
FIG. 5 is a table of exemplary voltage pulse parameters that can be associated with particular magnetron cathode segments.

FIG. 5 is a table 380 of exemplary voltage pulse parameters that can be associated with particular magnetron cathode segments 102a-d (FIG. 1). The table 380 illustrates the many different voltage pulses parameters that can be applied to particular magnetron cathode segments 102a-d in order to achieve certain plasma densities and plasma uniformity.

The first column 382 of table 380 illustrates the specific magnetron cathode segment 102a-n to which a voltage pulse is applied. The second column 384 illustrates an exemplary pulse sequence that can be applied to the magnetron cathode segments 102a-d. In this exemplary pulse sequence: (1) the first pulse is applied to the fourth magnetron cathode segment 102d; (2) the second pulse is applied to the third magnetron cathode segment 102c; (3) the third pulse is applied to the second magnetron cathode segment 102b; (4) the fourth pulse is applied to the first magnetron cathode segment 102a; (5) the fifth pulse is applied to the fourth magnetron cathode segment 102d; (6) the sixth pulse is applied to the second magnetron cathode segment 102b; (7) the seventh pulse is applied to the first magnetron cathode segment 102a; (8) the eighth pulse is applied to the fourth magnetron cathode segment 102d; and (9) the ninth and tenth pulses are applied to third magnetron cathode segment 102c. In some embodiments, the pulses (first pulse through tenth pulse) are pulse trains each including at least two pulses. The specific pulse sequence can affect the density of the plasma and the uniformity of a resulting sputtered film across a workpiece.

The third column 388 illustrates exemplary voltage pulse widths in microseconds that are applied to each magnetron cathode segment 102a-d. In this example, a voltage pulse having a pulse width of 1,000 μsec is applied to the first magnetron cathode segment 102a. A voltage pulse having a pulse width of 1,200 μsec is applied to the second magnetron cathode segment 102b. Voltage pulses having pulse widths of 2,000 μsec are applied to each of the third 102c and the fourth magnetron cathode segments 102d. The pulse width or pulse duration of each voltage pulse can affect the plasma density and properties of a resulting sputtered film.

The fourth column 390 illustrates exemplary rise times of the voltage pulses applied to the various magnetron cathode segments 102a-d. The rise times in the fifth column 390 correspond to the rise times τ1, τ2 of the third time periods 278, 281 of the voltage pulses 271, 272 illustrated in FIG. 3E. The fifth column 390 illustrates that voltage pulses having different rise times can be applied to different magnetron cathode segments 102a-d. The different rise times can generate plasmas having different plasma densities that are proximate to the various magnetron cathode segments 102a-d. As described herein, the rise times of the voltage pulses can strongly influence the rate of ionization and the density of the plasma.

In this example, a voltage pulse having a rise time of 1V/μsec is applied to the first magnetron cathode segment 102a. A voltage pulse having a rise time of 0.5V/μsec is applied to the second magnetron cathode segment 102b. A voltage pulse having a rise time of 2V/μsec is applied to the third magnetron cathode segment 102c. A voltage pulse having a rise time of 2V/μsec is applied to the fourth magnetron cathode segment 102d. The voltage pulses applied to the magnetron cathode segments 102a-d can have faster rise times depending upon the design of the plasma source and the desired plasma conditions. A voltage pulse 271 (FIG. 3E) can include different time periods 277, 279 having different voltage levels and different durations that sustain plasmas having different plasma densities.

The fifth column 392 indicates the amount of power generated by the voltage pulses that are applied to each magnetron cathode segment 102a-d. In this example, the power generated by applying the voltage pulse to the first magnetron cathode segment 102a is 80 kW. The power generated by applying the voltage pulse to the second magnetron cathode segment 102b is 60 kW. The power generated by applying the voltage pulse to the third 102c and the fourth magnetron cathode segments 102d is 120 kW. The power applied to each of the magnetron cathode segments 102a-d can affect the density of the plasma as well as the uniformity of a sputtered film across the substrate.

Figure 6:
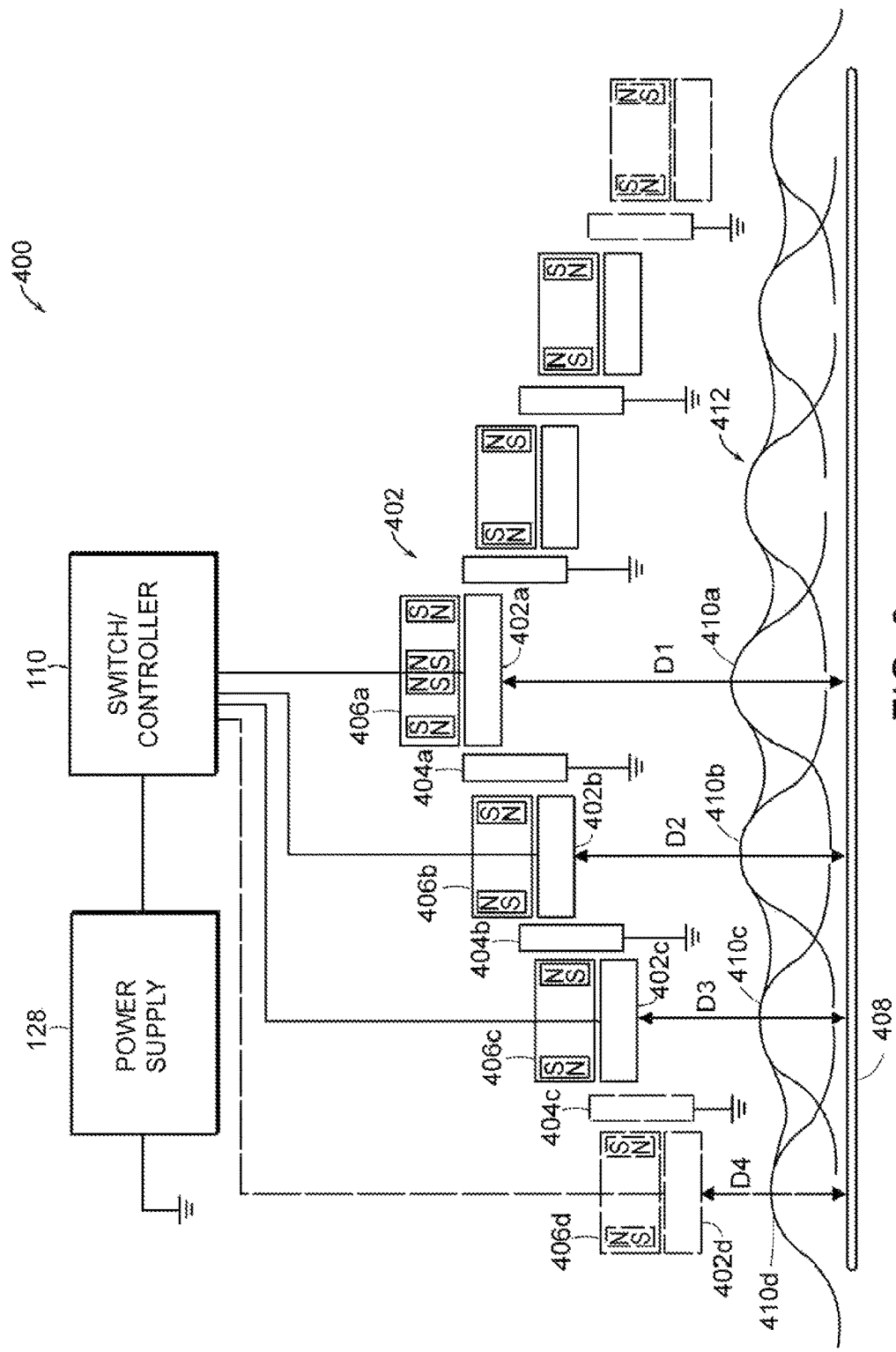
FIG. 6 illustrates a cross-sectional view of a plasma source including a segmented magnetron cathode according to one embodiment of the invention.

FIG. 6 illustrates a cross-sectional view of a plasma source 400 including a segmented magnetron cathode 402 according to one embodiment of the invention. The plasma source 400 includes the power supply 128 and the switch 110. The segmented magnetron cathode 402 includes a plurality of magnetron cathode segments 402a-d. The plurality of magnetron cathode segments 402a-d is typically electrically isolated from each other. Anodes 404a-c are positioned adjacent to the respective magnetron cathode segments 402a-d.

The plasma source 400 also includes magnet assemblies 406a-d that are positioned adjacent to the respective magnetron cathode segments 402a-d. The first magnet assembly 406a creates a magnetic field (not shown) proximate to the first magnetron cathode segment 402a. The magnetic field traps electrons in the plasma proximate to the first magnetron cathode segment 402a. Additional magnetic fields trap electrons in the plasma proximate to the other respective magnetron cathode segments 402b-d.

The magnet assemblies 406a-d can create magnetic fields having different geometrical shapes and different magnetic field strengths. Creating magnetic fields having different magnetic fields strengths can improve the uniformity of a sputtered film on a substrate 408. For example, the first magnet assembly 406a can include strong magnets that create a stronger magnetic field than magnets that are included in the fourth magnet assembly 406d. A stronger magnetic field may be required proximate to the first magnetron cathode segment 402a, since the first magnet assembly 406a is further away from the substrate 408 than the fourth magnet assembly 406d.

The substrate 408 or workpiece is positioned proximate to the segmented magnetron cathode 402. The plasma source 400 can be used to sputter coat the substrate 408. In this embodiment, each of the magnetron cathode segments 402a-d includes target material. The power supply 128 and the switch 110 control the voltage pulses applied to each of the magnetron cathode segments 402a-d including the target material. The target material from each of the magnetron cathode segments 402a-d sputter coats the substrate 408 to generate coatings 410a-d that correspond to each of the magnetron cathode segments 402a-d.

The plasma source 400 illustrates that the magnetron cathode segments 402a-d in the segmented magnetron cathode 402 do not have to be in the same horizontal planes with respect to the substrate 408. In the example shown in FIG. 6, each of the magnetron cathode segments 402a-d is in a unique horizontal plane with respect to a plane that is parallel to the substrate 408. Each of the magnetron cathode segments 402a-d is also in a unique vertical plane with respect to a plane that is perpendicular to the substrate 408. For example, the distance D1 from the first magnetron cathode segment 402a to the substrate 408 is greater than the distance D2 from the second magnetron cathode segment 402b to the substrate 408.

In one embodiment, the distances D1-D4 between the respective magnetron cathode segments 402a-d and the substrate 408 can be varied to increase the uniformity of the sputtered coating or to optimize the plasma process. In addition to varying the distances D1-D4 in order to optimize the plasma process, the parameters of the power supply 128 and the switch 110 can be adjusted to affect the uniformity of the coatings 410a-d across the substrate 408. The coating uniformity 412 can be varied to create a predefined thickness profile across the substrate 408.

In one embodiment, the plasma source 400 is used to etch the substrate 408. In this embodiment, the plasma generated by segmented magnetron cathode 402 can have different densities at different locations across the surface of the substrate 408. Therefore, the plasma source 400 can be used to etch a substrate with a particular etch profile.

The operation of the plasma source 400 is similar to the operation of the plasma source 100 of FIG. 1. The switch 110 routes the voltage pulses from the power supply 128 to the various magnetron cathode segments 402a-d of the segmented magnetron cathode 402. The magnitude, shape, rise time, fall time, pulse width, and frequency of the voltage pulses, as well as the sequencing of the various voltage pulses are adjustable by the user to meet the requirements of a particular plasma process.

Figure 7:
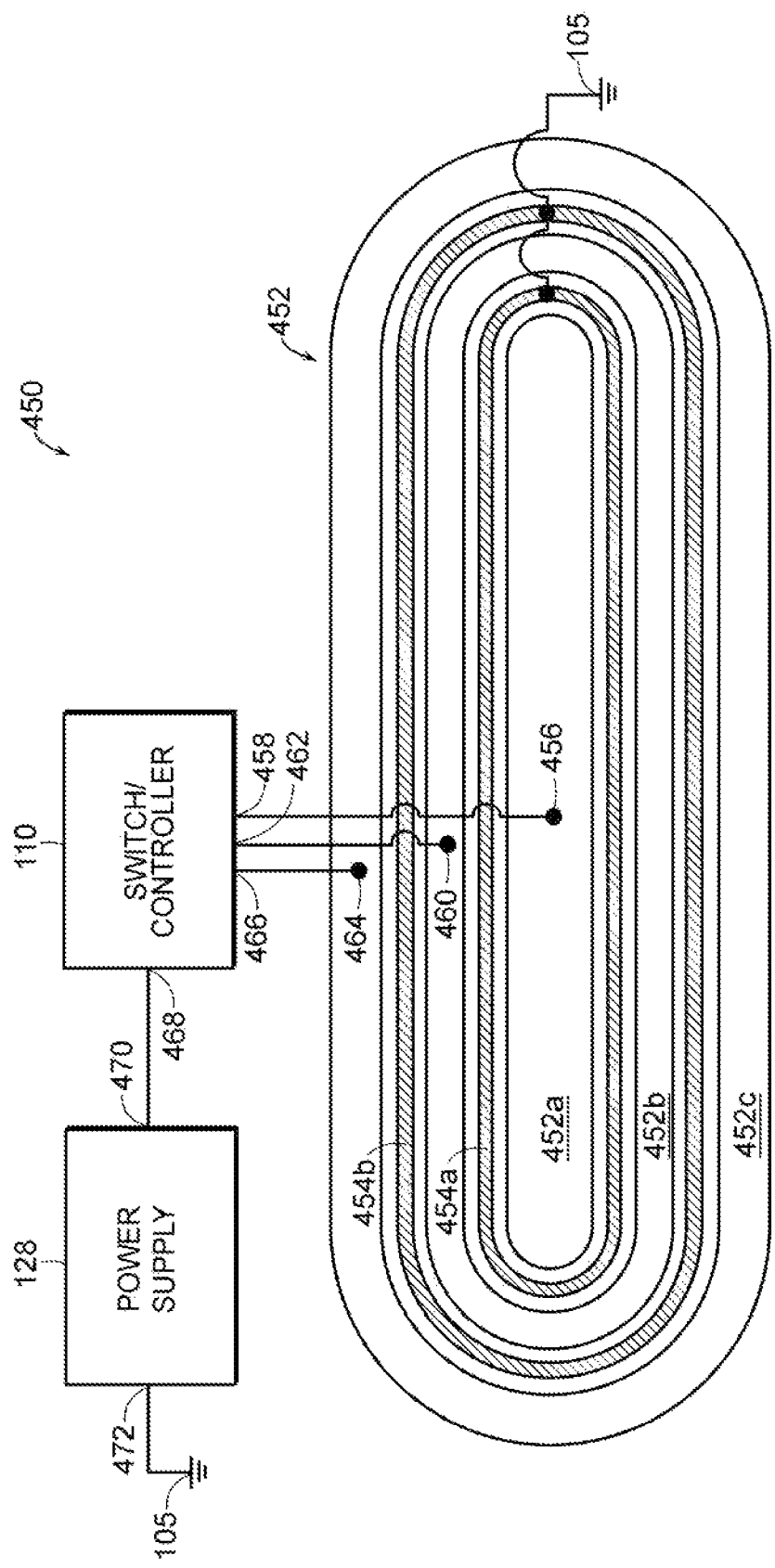
FIG. 7 illustrates a diagram of a plasma source including a segmented cathode having an oval shape according to one embodiment of the invention.

FIG. 7 illustrates a diagram of a plasma source 450 including a segmented cathode 452 having an oval shape according to one embodiment of the invention. The segmented cathode 452 is formed in the shape of an oval to facilitate processing large workpieces, such as architectural pieces or flat screen displays. In other embodiments, the segmented cathode 452 is formed into other shapes that generate desired plasma profiles across a particular workpiece. In the embodiment shown in FIG. 7, the plasma source 450 is not a segmented magnetron, and therefore, the segmented cathode 452 does not include magnets. However, in other embodiments, the plasma source 450 is a segmented magnetron and the segmented cathode 452 does include magnets.

The segmented cathode 452 includes a plurality of cathode segments 452a, 452b, and 452c. The plurality of cathode segments 452a-c is typically electrically isolated from each other. Some embodiments include additional cathode segments that meet the requirements of a specific plasma process. In one embodiment, the segmented cathode 452 includes target material that is used for sputtering. The target material can be integrated into or fixed onto each cathode segment 452a-c.

The plasma source 450 also includes a plurality of anodes 454a, 454b. The anodes 454a, 454b are positioned between the cathode segments 452a, 452b, 452c. Additional anodes can be positioned adjacent to additional cathode segments. In one embodiment, the anodes 454a, 454b are coupled to ground 105. In other embodiments (not shown), the anodes 454a, 454b are coupled to a positive terminal of a power supply.

An input 456 of the first cathode segment 452a is coupled to a first output 458 of the switch 110. An input 460 of the second cathode segment 452b is coupled to a second output 462 of the switch 110. An input 464 of the third cathode segment 452c is coupled to a third output 466 of the switch 110.

An input 468 of the switch 110 is coupled to a first output 470 of the power supply 128. A second output 472 of the power supply 128 is coupled to ground 105. In other embodiments (not shown), the second output 472 of the power supply 128 is coupled to the anodes 454a, 454b. The power supply 128 can be a pulsed power supply, a switched DC power supply, an alternating current (AC) power supply, or a radio-frequency (RF) power supply. The power supply 128 generates a pulse train of voltage pulses that are routed by the switch 110 to the cathode segments 452a-c.

The power supply 128 can vary the magnitude, the pulse width, the rise time, the fall time, the frequency, and the pulse shape of the voltage pulses depending on the desired parameters of the plasma and/or the desired uniformity of a sputtered coating. The switch 110 can include a controller or a processor and can route one or more of the voltage pulses to each of the cathode segments 452a-c in a predetermined sequence depending on the shape and size of the segmented cathode 452 and the desired uniformity of the coating, and the density and volume of the plasma. An optional external controller or processor (not shown) can be coupled to the switch 110 to control the routing of the voltage pulses in the pulse train.

The operation of the plasma source 450 is similar to the operation of the plasma source 100 of FIG. 1. The switch 110 routes the voltage pulses from the power supply 128 to the particular cathode segments 452a-c of the segmented cathode 452. The size and shape of the segmented cathode 452 can be adjusted depending on the size and shape of the workpiece to be processed. The shape, pulse width, rise time, fall time, and frequency of the voltage pulses, as well as the sequencing of the various voltage pulses can be varied depending on the specific plasma process.

Figure 8:
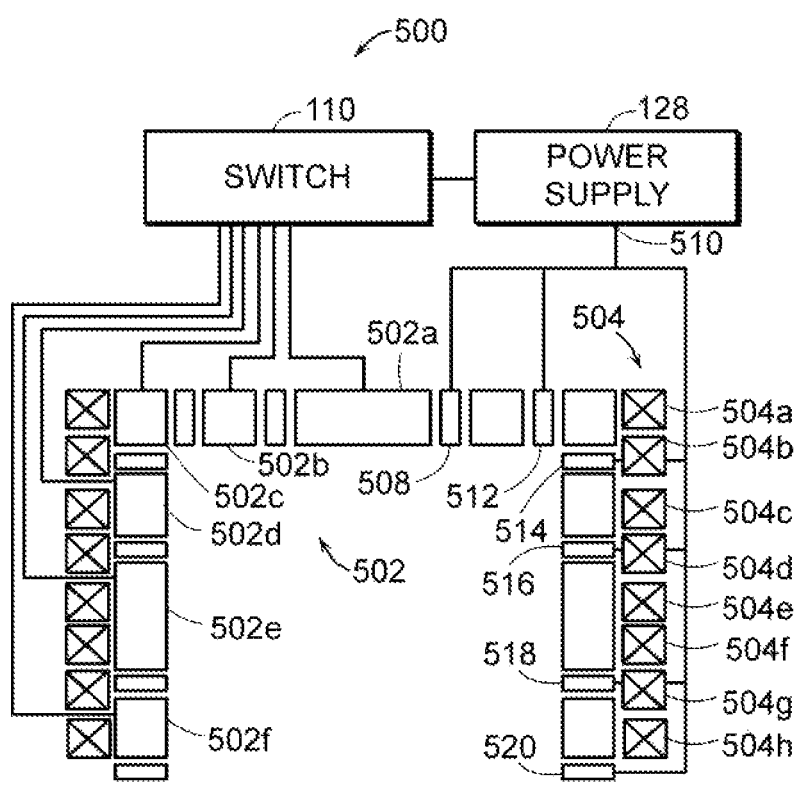
FIG. 8 illustrates a diagram of a plasma source including a segmented magnetron cathode in the shape of a hollow cathode magnetron (HCM) according to one embodiment of the invention.

FIG. 8 illustrates a diagram of a plasma source 500 including a segmented magnetron cathode 502 in the shape of a hollow cathode magnetron (HCM) according to one embodiment of the invention. The plasma source 500 includes at least one magnet assembly 504a that is positioned adjacent to a third magnetron cathode segment 502c. Additional magnet assemblies 504b-h are positioned adjacent to fourth 502d, fifth 502e, and sixth magnetron cathode segments 502f. The magnet assemblies 504a-h create magnetic fields proximate to the magnetron cathode segment 502a-f. The magnetic fields trap electrons in the plasma proximate to the magnetron cathode segments 502a-f.

In some embodiments, the magnet assemblies 504a-h are electro-magnetic coils. The shape and strength of the magnetic fields generated by the coils vary depending on the current applied to the coil. The magnetic fields can be used to direct and focus the plasma in the HCM. In some embodiments, one or more of the magnet assemblies 504a-h generate unbalanced magnetic fields. The unbalanced magnetic fields can improve the plasma process as previously described.

A first anode 508 is positioned proximate to the first 502a and the second magnetron cathode segments 502b. The first anode 508 is coupled to a first output 510 of the power supply 128. A second anode 512 is positioned proximate to the third magnetron cathode segment 502c and is coupled to the first output 510 of the power supply 128. A third anode 514 is positioned proximate to the fourth magnetron cathode segment 502d and is coupled to the first output 510 of the power supply 128. A fourth anode 516 is positioned proximate to the fifth magnetron cathode segment 502e and is coupled to the first output 510 of the power supply 128. A fifth anode 518 is positioned proximate to the sixth magnetron cathode segment 502f and is coupled to the first output 510 of the power supply 128. A sixth anode 520 is also positioned proximate to the sixth magnetron cathode segment 502f and is coupled to the first output 510 of the power supply 128. In other embodiments, the number of anode and magnetron cathode segments is different.

Each of the plurality of magnetron cathode segments 502a-f is coupled to an output of the switch 110. The plurality of magnetron cathode segments 502a-f is typically electrically isolated from each other. However, there are embodiments in which two or more magnetron cathode segments 502a-f can be electrically coupled together.

A substrate or workpiece (not shown) is positioned adjacent to the segmented magnetron cathode 502. The plasma source 500 can be used to coat the substrate. In this embodiment, each of the magnetron cathode segments 502a-f includes target material. The power supply 128 and the switch 110 control the voltage pulses applied to each of the magnetron cathode segments 502a-f including the target material. The target material from each of the magnetron cathode segments 502a-f sputter coats the substrate. Parameters of the power supply 128, the switch 110, and the magnet assembly 504, can be adjusted to increase the uniformity of the sputtered coating and to adjust the density of the plasma to improve the plasma process.

Figure 9:
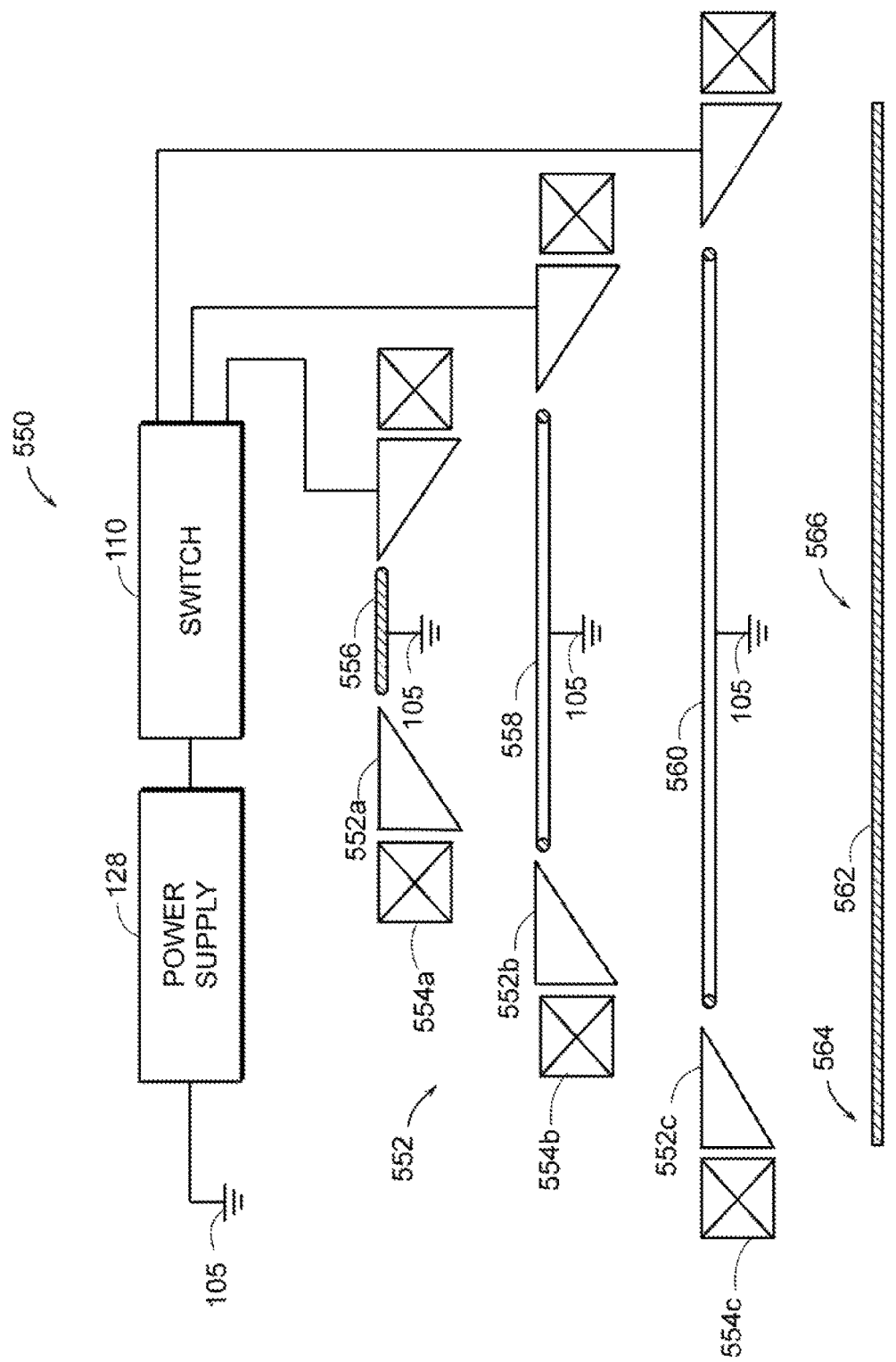
FIG. 9 illustrates a diagram of a plasma source including a segmented magnetron cathode in the shape of a conical cathode magnetron according to one embodiment of the invention.

FIG. 9 illustrates a diagram of a plasma source 550 including a segmented magnetron cathode 552 in the shape of a conical cathode magnetron according to one embodiment of the invention. The plasma source 550 includes a first magnet assembly 554a that is positioned adjacent to a first magnetron cathode segment 552a. A second magnet assembly 554b is positioned adjacent to a second magnetron cathode segment 552b. A third magnet assembly 554c is positioned adjacent to a third magnetron cathode segment 552c. Each of the magnet assemblies 554a-c can generate magnetic fields having different strengths and different geometries that are chosen to optimize the specific plasma process.

The magnet assemblies 554a-c can include coils or can include permanent magnets. The first magnet assembly 554a creates a magnetic field (not shown) proximate to the first magnetron cathode segment 552a. The first magnetic field traps electrons in the plasma proximate to the first magnetron cathode segment 552a. The second magnetic field (not shown) traps electrons in the plasma proximate to the second magnetron cathode segment 552b. The third magnetic field (not shown) traps electrons in the plasma proximate to the third magnetron cathode segment 552c. In some embodiments, one or more of the magnet assemblies 554a-c generate unbalanced magnetic fields. The unbalanced magnetic fields can be used to optimize the particular plasma process.

A first anode 556 is positioned proximate to the first magnetron cathode segment 552a. A second anode 558 is positioned proximate to the second magnetron cathode segment 552b. A third anode 560 is positioned proximate to the third magnetron cathode segment 552c. In one embodiment, the first 556, the second 558, and the third anodes 560 are formed in the shape of a ring. The first 556, the second 558, and the third anodes 560 are coupled to ground 105.

A substrate 562 is positioned adjacent to the segmented magnetron cathode 552. The plasma source 550 can be used to coat the substrate 562. In this embodiment, each of the magnetron cathode segments 552a-c includes target material. The power supply 128 and the switch 110 control the voltage pulses applied to each of the magnetron cathode segments 552a-c including the target material. The target material from each of the magnetron cathode segments 552a-c sputter coats the substrate. Parameters of the power supply 128, the switch 110, and the magnet assemblies 554a-c, can be adjusted to increase the uniformity of the plasma to improve the plasma process.

For example, if the sputtered film on the substrate 562 is non-uniform such that the film is thicker on the edge 564 of the substrate 562 than in the center 566 of the substrate 562, the switch 110 can route a greater number of voltage pulses to the first magnetron cathode segment 552a than to the third magnetron cathode segment 552c in order to increase the thickness of the sputtered film proximate to the center 566 of the substrate 562. Alternatively, the switch 110 can route voltage pulses having longer pulse widths to the first magnetron cathode segment 552a and voltage pulses having shorter pulse widths to the third magnetron cathode segment 552c. Numerous other combination of applying different numbers of voltage pulses and/or voltage pulses having different pulse widths can be used.

Conversely, if the sputtered coating on the substrate 562 is non-uniform such that the film is thicker in the center 566 of the substrate 562 than on the edge 564 of the substrate 562, the switch 110 can route a greater number of voltage pulses to the third magnetron cathode segment 552c in order to increase the thickness of the sputtered film on the edge 564 of the substrate 562. Alternatively, the switch 110 can route voltage pulses having longer pulse widths to the third magnetron cathode segment 552c and voltage pulses having shorter pulse widths to the first magnetron cathode segment 552a.

In addition, the power supply 128 can change the plasma density proximate to the various magnetron cathode segments 552a-c by varying the rise times of the voltage pulses applied to the various magnetron cathode segments 552a-c. For example, voltage pulses having very fast rise times can generate higher density plasmas that increase the sputtering rate of the target material.

Figure 10:
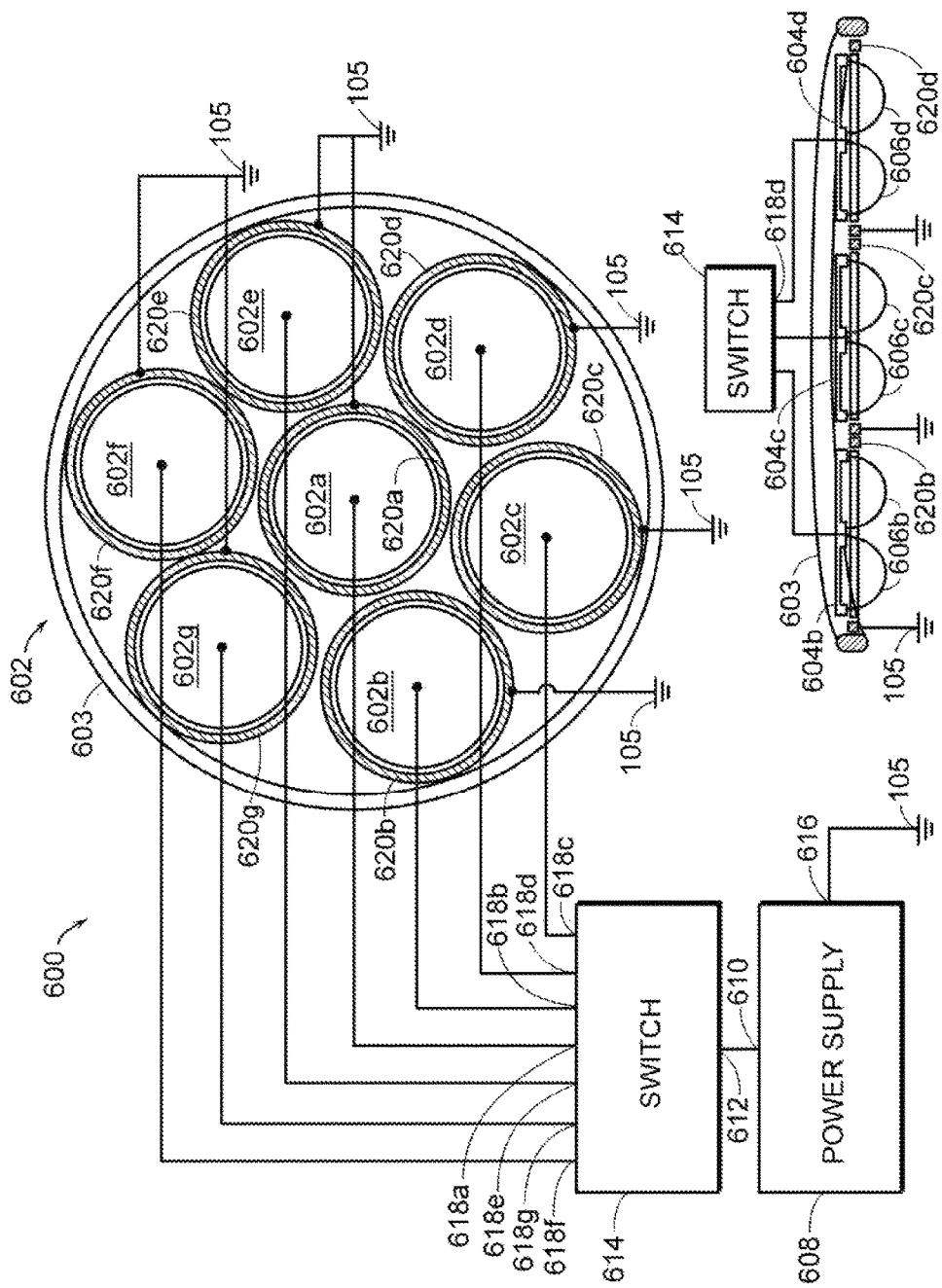
FIG. 10 illustrates a diagram of a plasma source including a segmented magnetron cathode including a plurality of small circular cathode segments according to one embodiment of the invention.

FIG. 10 illustrates a diagram of a plasma source 600 including a segmented magnetron cathode 602 in the shape of a plurality of small circular magnetron cathode segments 602a-g according to one embodiment of the invention. The plurality of small circular magnetron cathode segments 602a-g is surrounded by a housing 603.

Each of the small circular magnetron cathode segments 602a-g includes a magnet assembly 604a-g (only 604b-d are shown for clarity) that generates a magnetic field 606a-g (only 606b-d are shown for clarity) proximate to each respective small circular magnetron cathode segment 602a-g. The magnet assemblies 604a-g can include coils or can include permanent magnets. Each magnetic field 606a-g traps electrons in the plasma proximate to each respective small circular magnetron cathode segment 602a-g. Alternative magnet assemblies can be used to generate magnetic fields across one or more of the small circular magnetron cathode segments 602a-g. Each of the magnet assemblies 604a-g can generate magnetic fields having different strengths and geometries. One or more of the magnet assemblies 604a-g can also generate an unbalanced magnetic field.

The plasma source 600 also includes a power supply 608. A first output 610 of the power supply 608 is coupled to an input 612 of a switch 614. A second output 616 of the power supply 608 is coupled to ground 105. The switch 614 includes multiple outputs 618a-g that are each coupled to a respective one of the small circular magnetron cathode segments 602a-g. In one embodiment, the switch 614 includes an integrated controller or processor. The plurality of magnetron cathode segments 602a-g are typically electrically isolated from each other, but two or more can be electrically coupled together in some embodiments.

Each of the small circular magnetron cathode segments 602a-g is surrounded by a respective anode 620a-g. In one embodiment, the anodes 620a-g are formed in the shape of a ring. The anodes 620a-g are coupled to ground 105. In one embodiment, the anodes 620a-g are coupled to the second output 616 of the power supply 608.

A substrate (not shown) is positioned adjacent to the segmented magnetron cathode 602. The plasma source 600 can be used to coat the substrate. In this embodiment, each of the small circular magnetron cathode segments 602a-g includes target material. The power supply 608 and the switch 614 control the voltage pulses applied to each of the small circular magnetron cathode segments 602a-g including the target material. The target material from each of the small circular magnetron cathode segments 602a-g sputter coats the substrate. Parameters of the power supply 608, the switch 614, and the magnet assemblies 604a-g, can be changed to adjust the uniformity of the plasma to create customized thickness profiles.

For example, to sputter a thicker coating in the center of the substrate, the switch 614 can route a greater number of voltage pulses to the small circular magnetron cathode segment 602a in the center of the segmented magnetron cathode 602 than to the other small circular magnetron cathode segments 602b-g that surround the center small circular magnetron cathode segment 602a. The switch routing sequence in this example will increase the sputtering rate from the small circular magnetron cathode segment 602a and will increase the thickness of the sputtered film proximate to the center of the substrate. Alternatively, the switch 614 can route voltage pulses having longer pulse widths to the center small circular magnetron cathode segment 602a and voltage pulses having shorter pulse widths to the other small circular magnetron cathode segments 602b-g. Any combination of applying different numbers of voltage pulses and/or voltage pulses having different pulse widths can be used. The switch 614 can route any number of voltage pulses to the various small circular magnetron cathode segments 602a-g.

In addition, the power supply 608 can change the plasma density proximate to the various small circular magnetron cathode segments 602a-g by varying the rise times of the voltage pulses that are applied to the various small circular magnetron cathode segments 602a-g. For example, voltage pulses having very fast rise times that generate higher density plasmas that increase the sputtering rate of the target material can be applied to particular circular magnetron cathode segments 602a-g to change the plasma density distribution.

Figure 11:
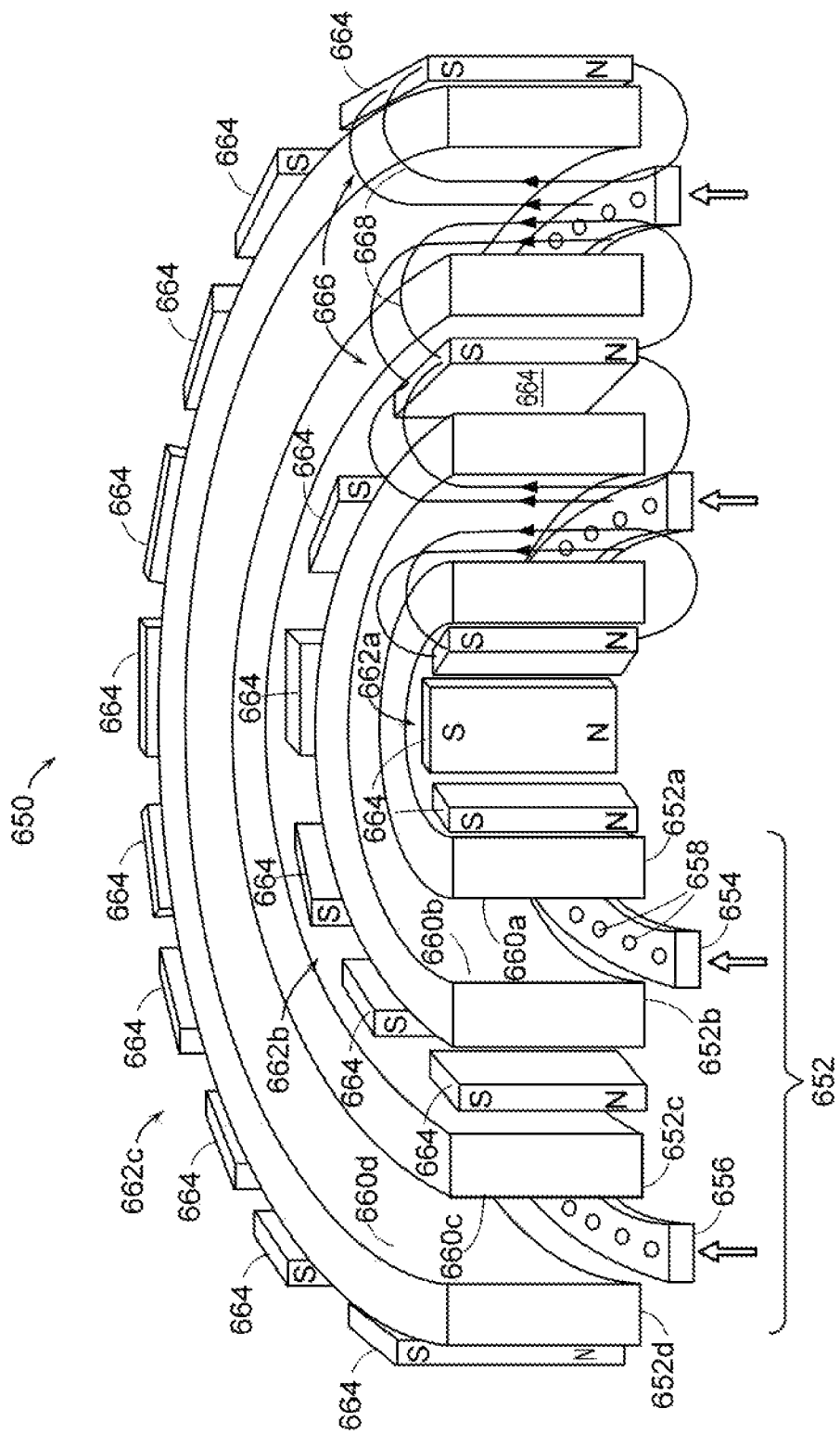
FIG. 11 illustrates a diagram of a plasma source including a segmented magnetron cathode including a plurality of concentric cathode segments according to one embodiment of the invention.

FIG. 11 illustrates a diagram of a plasma source 650 that includes a segmented magnetron cathode 652 having a plurality of concentric magnetron cathode segments 652a-d according to one embodiment of the invention. The concentric magnetron cathode segments 652a-d are configured into multiple isolated hollow cathodes. The plasma source 650 also includes a first 654 and a second anode 656 that are ring-shaped. The anodes 654, 656 can include multiple gas injector ports 658. The gas injector ports 658 supply feed gas between the magnetron cathode segments 652a-d. The pressure of the feed gas can be adjusted to optimize the plasma process. For example, in a reactive sputtering process, feed gas flowing across surfaces 660a-d of the magnetron cathode segments 652a-d can prevent reactive gas from interacting with and damaging the surfaces 660a-d of the magnetron cathode segments 652a-d. In some embodiments, the gas injector ports 658 supply excited atoms such as metastable atoms between the magnetron cathode segments 652a-d. The excited atoms can improve the plasma process by increasing the rate of ionization of the plasma and the density of the plasma.

The segmented magnetron cathode 652 also includes groups 662a-c of magnets 664 that are positioned in rings around each of the magnetron cathode segments 652a-d. Each of the magnets 664 are positioned with their magnetic poles aligned in the same direction. The magnets 664 generate magnetic fields 666 having magnetic field lines 668. The magnetic fields 666 repel each other causing the magnetic field lines 668 to become more parallel to the surfaces of the magnetron cathode segments 652a-d. The parallel magnetic field lines can improve target utilization in sputtering processes in which the magnetron cathode segments 652a-d include target material. The parallel magnetic field lines can also improve ion bombardment of the target material because a substantial portion of the plasma is trapped close to the surfaces of the magnetron cathode segments 652a-d where the target material is located.

In one embodiment, at least two of the magnetron cathode segments 652a-d have different shapes and/or areas that are chosen to improve the uniformity of the coating. Additionally, in one embodiment, at least two of the magnetron cathode segments 652a-d have different target materials that are used in a compound sputtering process. The plasma source 650 can also be used for ionized physical vapor deposition (I-PVD).

FIGS. 12A-12D illustrate four segmented cathodes 700, 700', 700", 700'" having various shapes according to the invention. The first segmented cathode 700 illustrated in FIG. 12A includes two cathode segments 702, 704 that are substantially parallel to each other. The surfaces 706, 708, 710, and 712 of the segmented cathode 700 can include target material for sputtering. Alternatively, the segmented cathode 700 can each be formed from a target material. An anode 714 is positioned proximate to the segmented cathode 700. A plasma can be ignited by generating a discharge between the anode 714 and the segmented cathode 700. The anode 714 can include one or more gas injector ports 716. The injector ports 716 can supply feed gas between the two cathode segments 702, 704. The injector ports 716 can also supply excited atoms such as metastable atoms between the two cathode segments 702, 704.

Figure 12B:
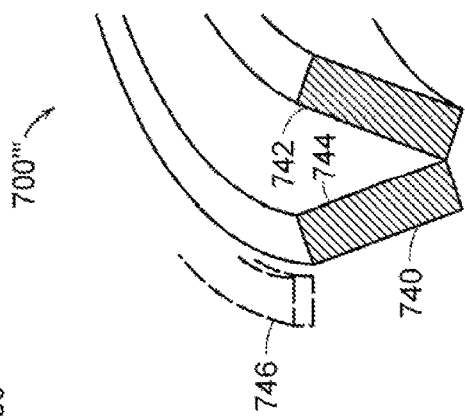
FIGS. 12A-12D illustrate four segmented cathodes having various shapes according to the invention.
Figure 12A:
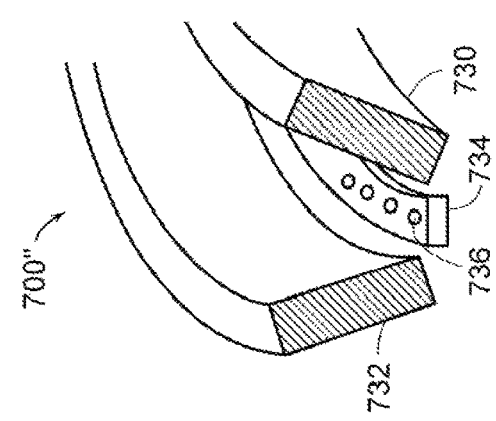

FIG. 12B illustrates the second segmented cathode 700'. The second segmented cathode 700' includes a substantially U-shaped cathode segment 720. The U-shaped cathode segment 720 can include target material positioned on each of the inside surfaces 722, 724, 726. In one embodiment, the U-shaped cathode segment 720 is formed from the target material. The U-shaped cathode segment has a larger surface area and provides more target material as compared with the first segmented cathode 700 of FIG. 12A. An anode 728 is positioned proximate to the second segmented cathode 700'. A plasma can be ignited by a discharge between the anode 728 and the second segmented cathode 700'.

Figure 12D:
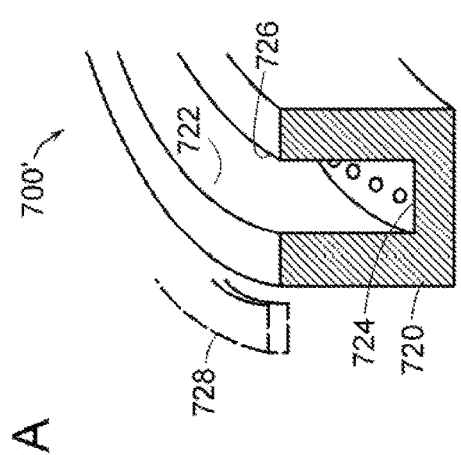
Figure 12C:
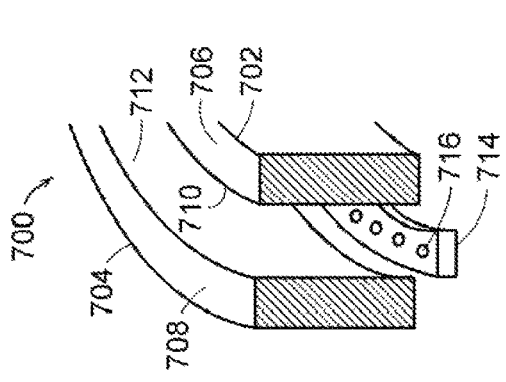

FIG. 12C illustrates the third segmented cathode 700". The third segmented cathode 700" is similar to the first segmented cathode 700, except that the two cathode segments 730, 732 are positioned non-parallel relative to each other. The non-parallel configuration can improve a sputtering process by exposing a larger surface area of target material towards the substrate (not shown). An anode 734 is positioned proximate to the segmented cathode 700". A plasma can be ignited by a discharge between the anode 734 and the segmented cathode 700". The anode 734 can include one or more gas injector ports 736 that supply feed gas between the two cathode segments 730, 732.

FIG. 12D illustrates the fourth segmented cathode 700'". The fourth segmented cathode 700'" is similar to the second segmented cathode 700', except that the cathode segment 740 is substantially V-shaped. The V-shaped cathode segment 740 can include target material on each of the inside surfaces 742, 744. An anode 746 is positioned proximate to the fourth segmented cathode 700'". A plasma can be ignited by a discharge between the anode 746 and the fourth segmented cathode 700'".

In one embodiment of the present invention, thin films are engineered to achieve certain mechanical, electrical, and/or magnetic properties of the deposited film by controlling the ratio of total ions (NI) to neutral atoms (NN) in the plasma volume. In some embodiments, at least two thin film layers are deposited using different ratios of total ions (NI) to neutral atoms (NN) in the plasma volume of each film.

Substrate bias can also be used to engineer the deposited films. The DC or radio-frequency (RF) bias applied to the substrate 141 (FIG. 2A) by the power supply 142 controls the energy of the ions impacting the substrate 141. In various embodiments, the bias voltage applied to the substrate 141 by the power supply 142 is a DC voltage, a voltage pulse or an RF signal that is chosen to change the energy of ions impacting the surface of the substrate to achieve a certain mechanical, electrical, and/or magnetic properties of the deposited film. For example, in one embodiment, the substrate is negatively biased with a DC voltage in the range between 0 V and −5000 V.

In addition, the temperature of the substrate can be selected to achieve a certain mechanical, electrical, and/or magnetic property of the deposited film. The substrate temperature determines the mobility of atoms in the growing film. By controlling the mobility of the atoms in the growing film, the properties of the deposited thin film can be changed.

There are numerous applications of such engineered thin films. For example, thin films can be engineered according to the present invention which provides a specialized hard coating for various applications, such as for cutting tools and razor blades.

Referring to FIGS. 1, 2A, 3f and 3G, in one experiment, a modulated TiN film structure was formed by alternating between applying the first train of voltage pulses 285 to the magnetron cathode 102 and applying the second train of voltage pulses 296 to the magnetron cathode 102 one hundred times. The ratio of total ions (NI) to neutral atoms (NN) in the plasma volume was in the range of 0.9 and 0.5. The substrate bias was −50 V. The substrate temperature was 200 degrees C. A total sputtered film thickness of 1500 Å was achieved. The resulting film had a hardness of more than 35 GPa.

EQUIVALENTS

While the invention has been particularly shown and described with reference to specific preferred embodiments, it should be understood by those skilled in the art that various changes in form and detail may be made therein without departing from the spirit and scope of the invention as defined herein.

We claim:

1. A method of ionized physical vapor deposition sputter coating high aspect-ratio structures, the method comprising:
   a) providing a chamber that contains a feed gas, an anode that is positioned in the chamber, a cathode assembly comprising target material positioned adjacent to the anode, a cathode magnet assembly positioned adjacent to the cathode assembly, and a holder that supports a substrate positioned adjacent to the cathode assembly;
   b) applying an electrical current to an electromagnet coil positioned between the cathode assembly and the holder that supports the substrate, the electromagnet coil and cathode magnet assembly generating an unbalanced magnetic field proximate to the cathode assembly that focuses a plasma; and
   c) generating a plurality of voltage pulses with controllable voltage rise times and applying the plurality of voltage pulses between the cathode assembly and the anode, the plurality of voltage pulses comprising a first DC voltage level, a first voltage rise time a second DC voltage level, and a second voltage rise time, the first voltage level being different than the second voltage level, the first voltage rise time being different than the second voltage rise time, the first voltage rise time generating weakly ionized plasma, the second voltage rise time increasing a density of ionized sputtered atoms in the weakly ionized plasma to generate a high-density strongly-ionized plasma that is suitable for producing coating inside the high-aspect ratio structures on the substrate.

2. The method of claim 1 wherein the target material comprises at least one of Ti, Al, Cr, C, B, Fe, Ta, W, Si, Ge, Ag, Cu, V, Pt, Zr, In, Sn, or Co.

3. The method of claim 1 further comprising generating a magnetic field parallel to the target material having a magnetic field strength that is in the range of 50 to 10,000 Gauss.

4. The method of claim 3 further comprising biasing the holder with RF power, thereby enhancing sputter coating of high-aspect-ratio structures.

5. The method of claim 4 wherein the substrate comprises a semiconductor device.

6. The method of claim 5 further comprising applying RF bias to the substrate holder, thereby enhancing sputter coating of high-aspect-ratio structures.

7. The method of claim 1 wherein the cathode assembly is formed in a rectangular shape.

8. The method of claim 1 where the cathode assembly is formed in a round shape.

9. The method of claim 1 further comprising controlling a temperature of a substrate positioned on the holder.

10. The method of claim 1 further comprising adding a reactive gas to the feed gas that reacts with the target material.

11. The method of claim 1 further comprising applying an electrical current to a second electromagnet coil positioned between the cathode assembly and the holder that supports the substrate, the second electromagnet coil generating a second magnetic field proximate to the cathode assembly that focuses the plasma.

12. The method of claim 11 wherein the second electromagnet coil generates an unbalanced magnetic field.

13. The method of claim 1 wherein the first voltage pulse and the second voltage in the plurality of voltage pulses have different voltage pulse shapes.

* * * * *